(12) United States Patent
Sekar et al.

(10) Patent No.: US 11,956,976 B2
(45) Date of Patent: *Apr. 9, 2024

(54) 3D SEMICONDUCTOR DEVICES AND STRUCTURES WITH TRANSISTORS

(71) Applicant: Monolithic 3D Inc., Klamath Falls, OR (US)

(72) Inventors: Deepak C. Sekar, Sunnyvale, CA (US); Zvi Or-Bach, Haifa (IL)

(73) Assignee: Monolithic 3D Inc., Klamath Falls, OR (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/234,368

(22) Filed: Aug. 15, 2023

(65) Prior Publication Data
US 2023/0397441 A1 Dec. 7, 2023

Related U.S. Application Data

(63) Continuation-in-part of application No. 18/105,041, filed on Feb. 2, 2023, now Pat. No. 11,793,005, which
(Continued)

(51) Int. Cl.
H10B 63/00 (2023.01)
H01L 21/268 (2006.01)
(Continued)

(52) U.S. Cl.
CPC ........... H10B 63/84 (2023.02); H01L 21/268 (2013.01); H01L 21/6835 (2013.01);
(Continued)

(58) Field of Classification Search
CPC .............. H01L 21/268; H01L 21/6835; H01L 21/76254; H01L 21/8221; H01L 21/84; H01L 21/845; H01L 27/0688; H01L 27/1203; H01L 27/1211; H01L 29/42392; H01L 29/784; H01L 29/785; H10B 10/00; H10B 12/20; H10B 12/056; H10B 12/36;
(Continued)

(56) References Cited

U.S. PATENT DOCUMENTS 11,315,980 B1 * 4/2022 Sekar .................... H10B 63/30
11,335,731 B1 * 5/2022 Sekar .................. H01L 27/1211
(Continued)

Primary Examiner — Brook Kebede
(74) Attorney, Agent, or Firm — Patent PC; Bao Tran

(57) ABSTRACT

A semiconductor device including: a plurality of transistors, where at least one of the transistors includes a first single crystal source, channel, and drain, where at least one of the transistors includes a second single crystal source, channel, and drain, where the second single crystal source, channel, and drain is disposed above the first single crystal source, channel, and drain, where at least one of the transistors includes a third single crystal source, channel, and drain, where the third single crystal source, channel, and drain is disposed above the second single crystal source, channel, and drain, where at least one of the transistors includes a fourth single crystal source, channel, and drain, where the fourth single crystal source, channel, and drain is disposed above the third single crystal source, channel, and drain, and where the fourth drain is aligned to the first drain with less than 40 nm misalignment.

20 Claims, 81 Drawing Sheets

Related U.S. Application Data is a continuation-in-part of application No. 17/898,475, filed on Aug. 29, 2022, now Pat. No. 11,600,667, which is a continuation-in-part of application No. 17/850,840, filed on Jun. 27, 2022, now Pat. No. 11,462,586, which is a continuation-in-part of application No. 17/718,932, filed on Apr. 12, 2022, now Pat. No. 11,469,271, which is a continuation-in-part of application No. 17/683,322, filed on Feb. 28, 2022, now Pat. No. 11,335,731, which is a continuation-in-part of application No. 17/572,550, filed on Jan. 10, 2022, now Pat. No. 11,315,980, which is a continuation-in-part of application No. 17/542,490, filed on Dec. 5, 2021, now Pat. No. 11,257,867, which is a continuation-in-part of application No. 17/402,526, filed on Aug. 14, 2021, now Pat. No. 11,227,897, which is a continuation-in-part of application No. 17/223,822, filed on Apr. 6, 2021, now Pat. No. 11,133,351, which is a continuation-in-part of application No. 17/114,155, filed on Dec. 7, 2020, now Pat. No. 11,018,191, which is a continuation-in-part of application No. 17/013,823, filed on Sep. 7, 2020, now Pat. No. 10,896,931, which is a continuation-in-part of application No. 16/409,813, filed on May 11, 2019, now Pat. No. 10,825,864, which is a continuation-in-part of application No. 15/803,732, filed on Nov. 3, 2017, now Pat. No. 10,290,682, which is a continuation-in-part of application No. 14/555,494, filed on Nov. 26, 2014, now Pat. No. 9,818,800, which is a continuation of application No. 13/246,157, filed on Sep. 27, 2011, now Pat. No. 8,956,959, which is a continuation of application No. 13/173,999, filed on Jun. 30, 2011, now Pat. No. 8,203,148, which is a continuation of application No. 12/901,890, filed on Oct. 11, 2010, now Pat. No. 8,026,521.

(51) Int. Cl.
| | |
|---|---|
| *H01L 21/683* | (2006.01) |
| *H01L 21/762* | (2006.01) |
| *H01L 21/822* | (2006.01) |
| *H01L 21/84* | (2006.01) |
| *H01L 27/06* | (2006.01) |
| *H01L 27/12* | (2006.01) |
| *H01L 29/423* | (2006.01) |
| *H01L 29/78* | (2006.01) |
| *H10B 10/00* | (2023.01) |
| *H10B 12/00* | (2023.01) |
| *H10B 41/20* | (2023.01) |
| *H10B 41/41* | (2023.01) |
| *H10B 43/20* | (2023.01) |
| *H10B 61/00* | (2023.01) |
| *H01L 27/105* | (2023.01) |
| *H10B 41/40* | (2023.01) |
| *H10B 43/40* | (2023.01) |
| *H10N 70/00* | (2023.01) |
| *H10N 70/20* | (2023.01) |

(52) U.S. Cl.
CPC .... *H01L 21/76254* (2013.01); *H01L 21/8221* (2013.01); *H01L 21/84* (2013.01); *H01L 21/845* (2013.01); *H01L 27/0688* (2013.01); *H01L 27/1203* (2013.01); *H01L 27/1211* (2013.01); *H01L 29/42392* (2013.01); *H01L 29/7841* (2013.01); *H01L 29/785* (2013.01); *H10B 10/00* (2023.02); *H10B 12/20* (2023.02); *H10B 12/50* (2023.02); *H10B 41/20* (2023.02); *H10B 41/41* (2023.02); *H10B 43/20* (2023.02); *H10B 61/22* (2023.02); *H10B 63/30* (2023.02); *H10B 63/845* (2023.02); H01L 27/105 (2013.01); H01L 2029/7857 (2013.01); H01L 2221/6835 (2013.01); H10B 12/056 (2023.02); H10B 12/36 (2023.02); H10B 41/40 (2023.02); H10B 43/40 (2023.02); H10N 70/20 (2023.02); H10N 70/823 (2023.02); H10N 70/8833 (2023.02)

(58) Field of Classification Search
CPC ........ H10B 12/50; H10B 41/20; H10B 41/40; H10B 41/41; H10B 43/20; H10B 43/40; H10B 61/22; H10B 63/30; H10B 63/84; H10B 63/845; H10N 70/8833; H10N 70/20; H10N 70/823
See application file for complete search history.

(56) References Cited

U.S. PATENT DOCUMENTS

2004/0014299 A1\* 1/2004 Moriceau .......... H01L 21/76254
  438/459
2023/0189537 A1\* 6/2023 Sekar ................ H01L 27/0694
  438/479

\* cited by examiner

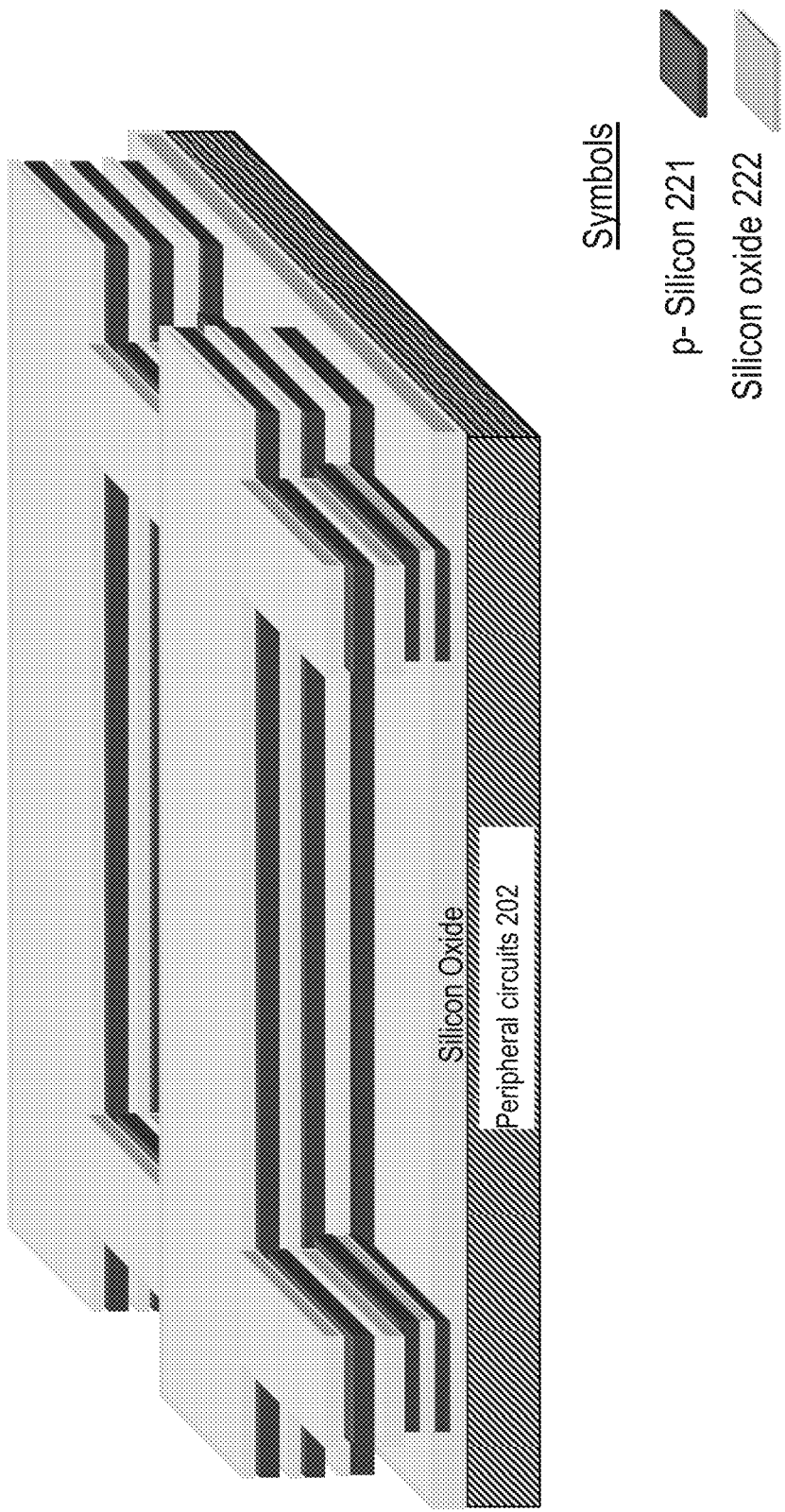

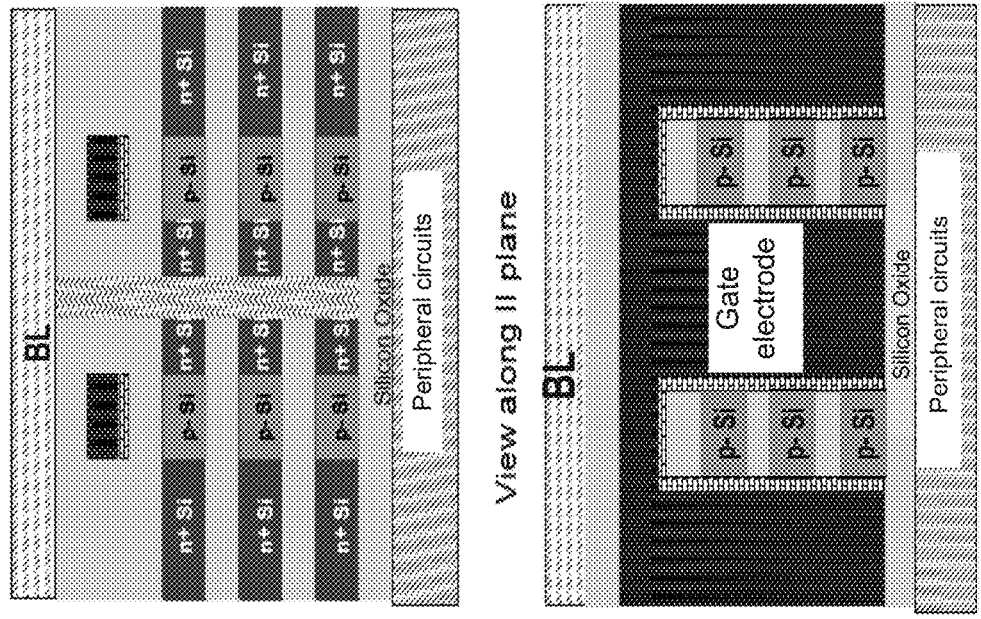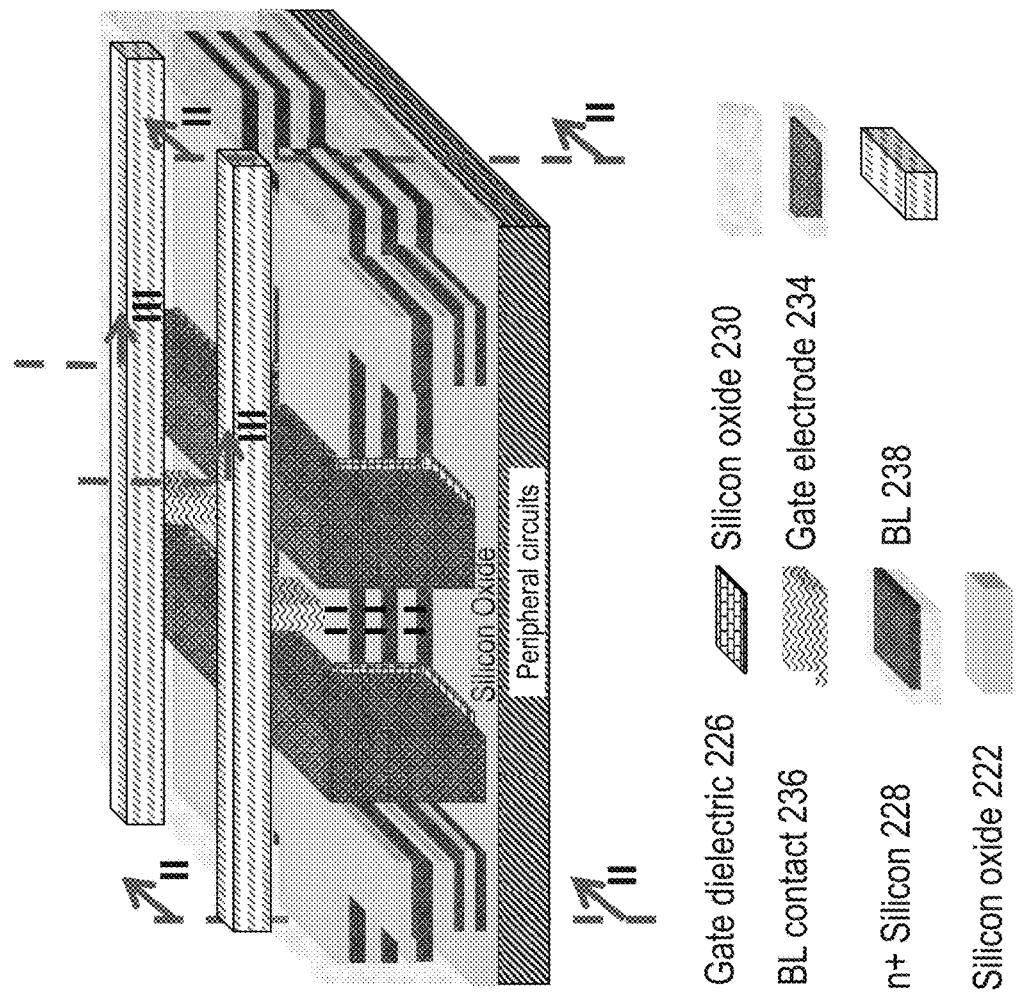
Fig. 2K

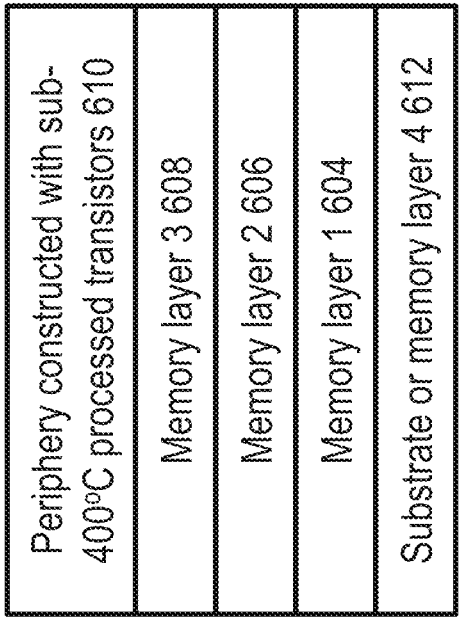
Fig. 6B: Periphery-on-top architecture
An alternative
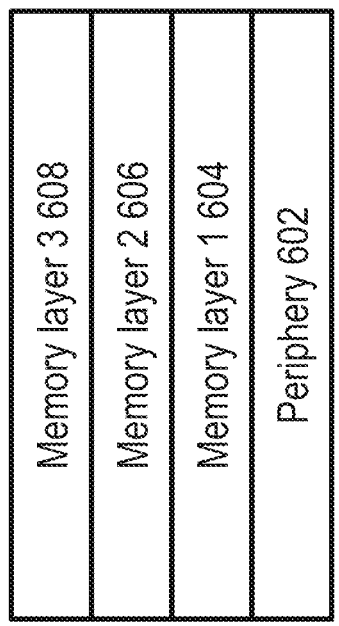
Fig. 6A: Periphery-on-bottom architecture

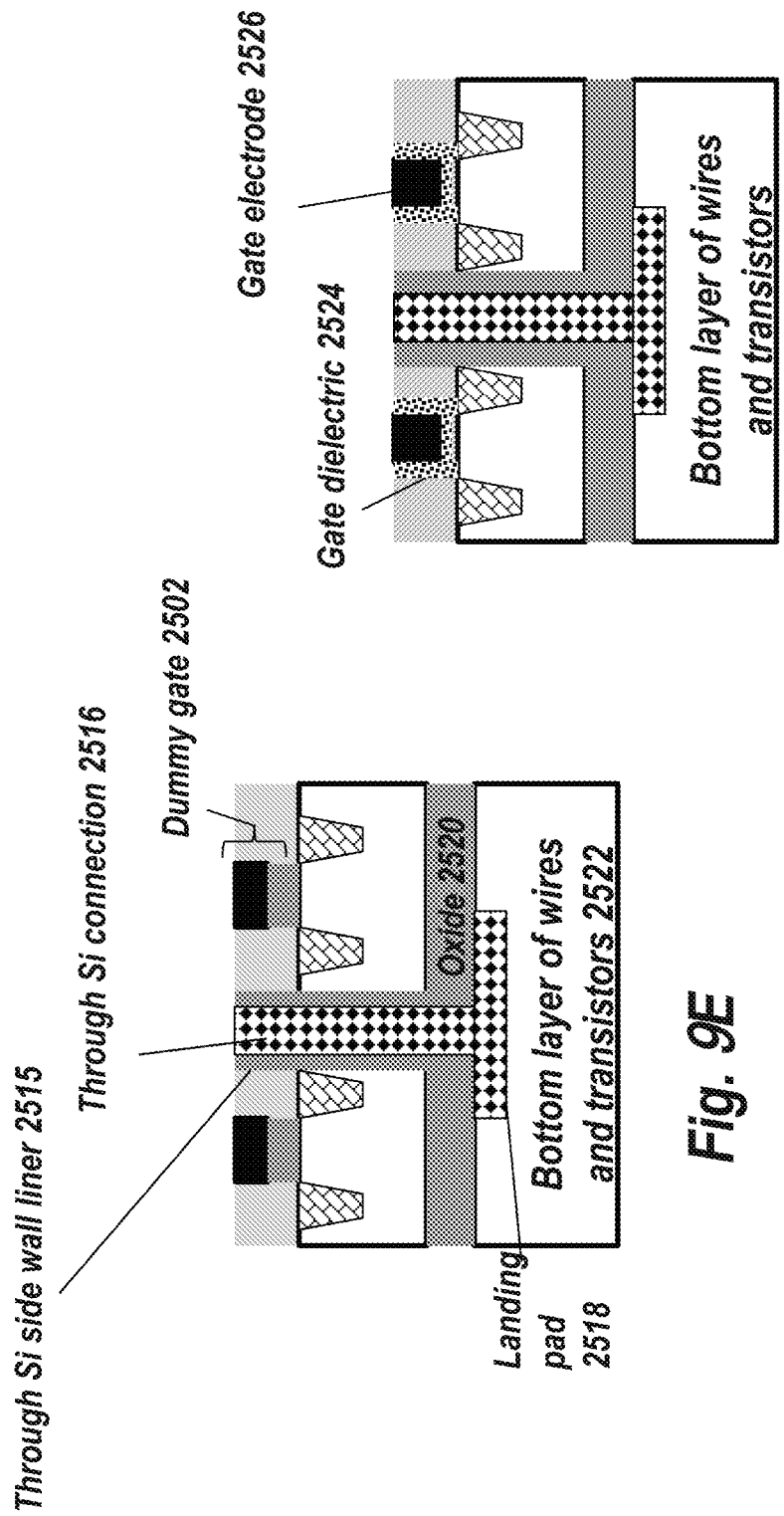

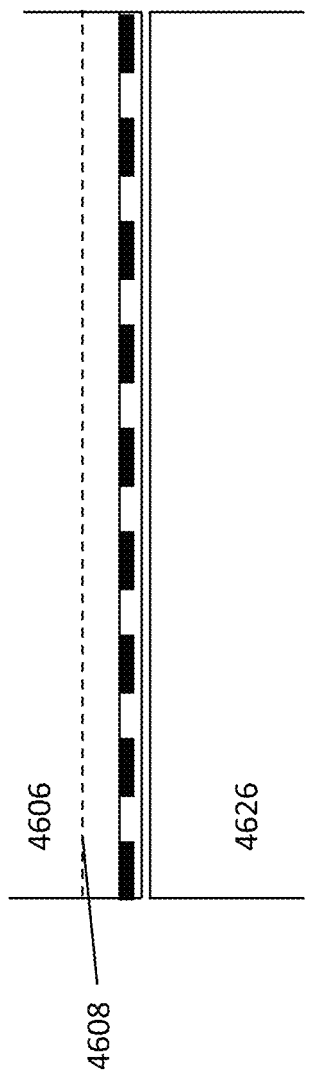
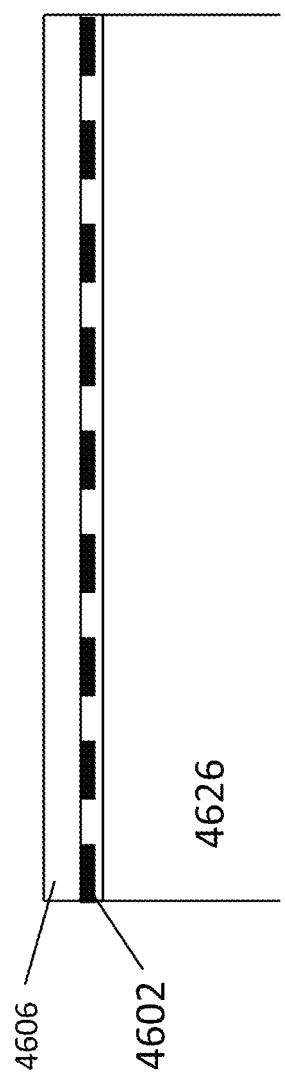
Fig. 11C
Fig. 11D

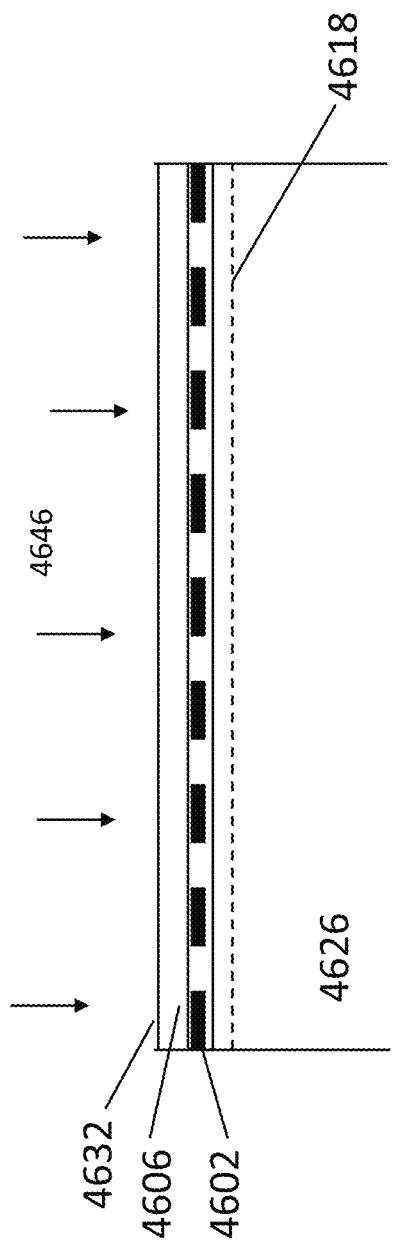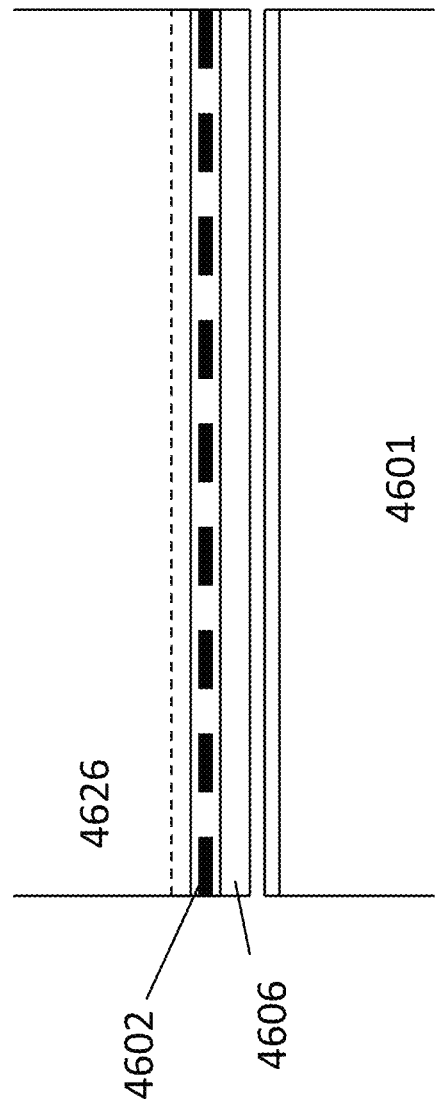

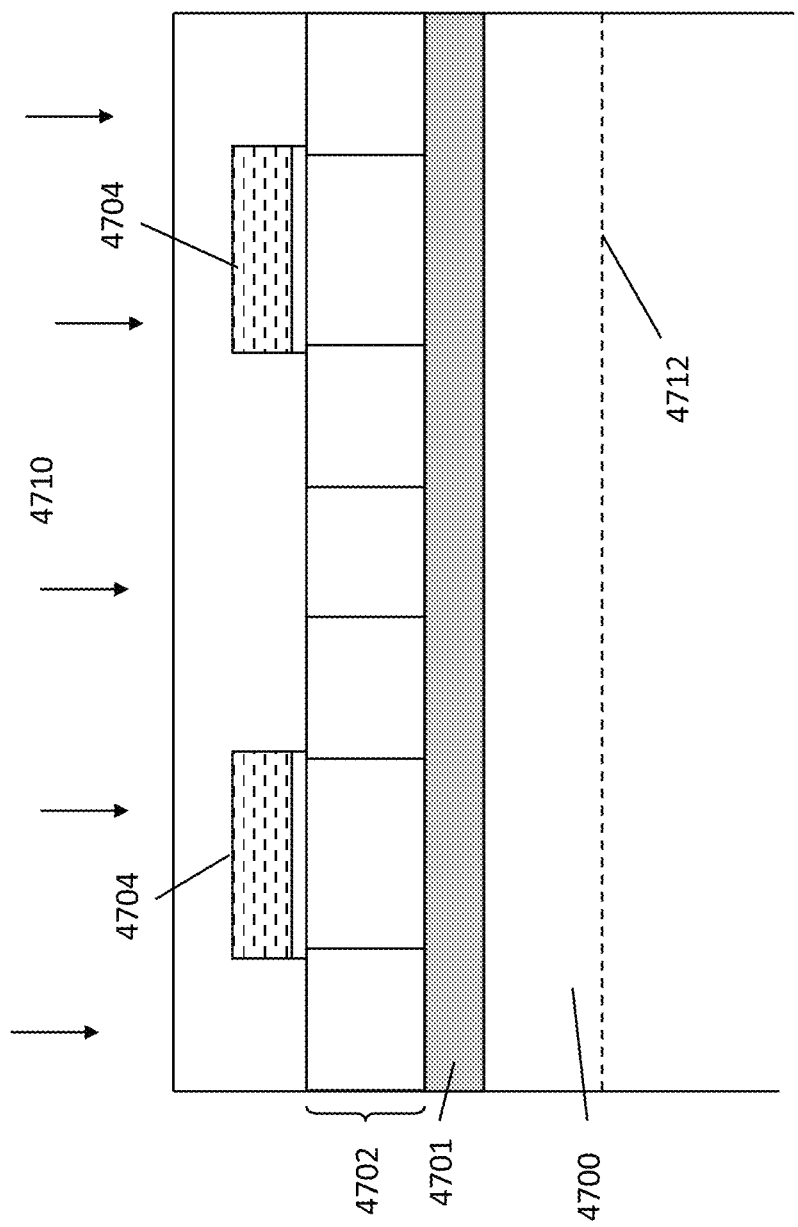

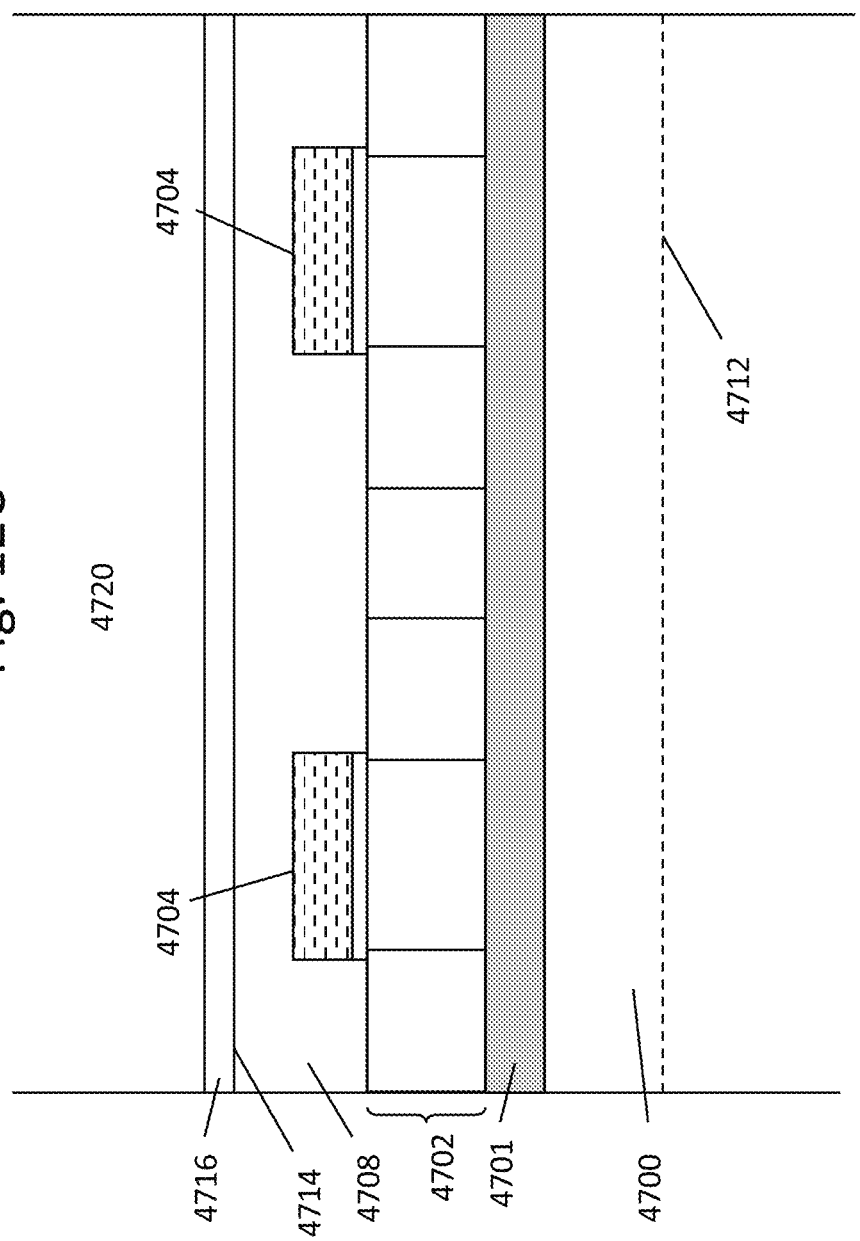

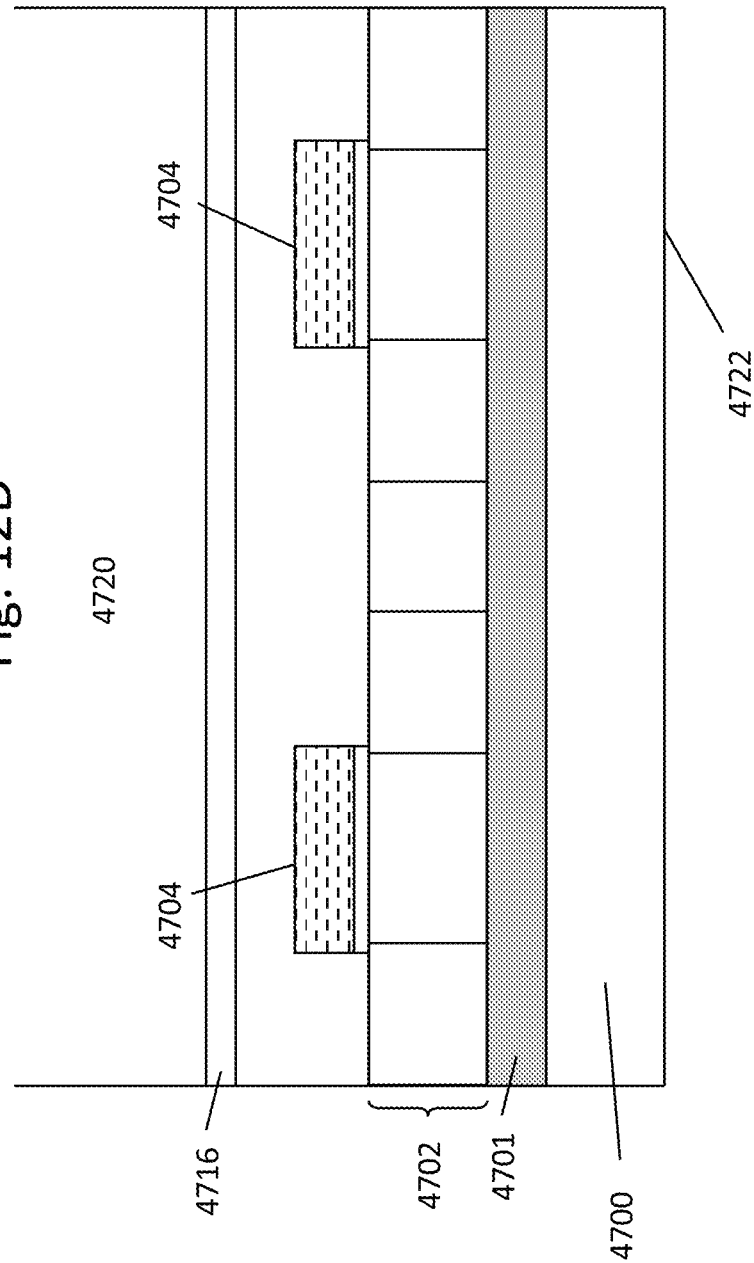

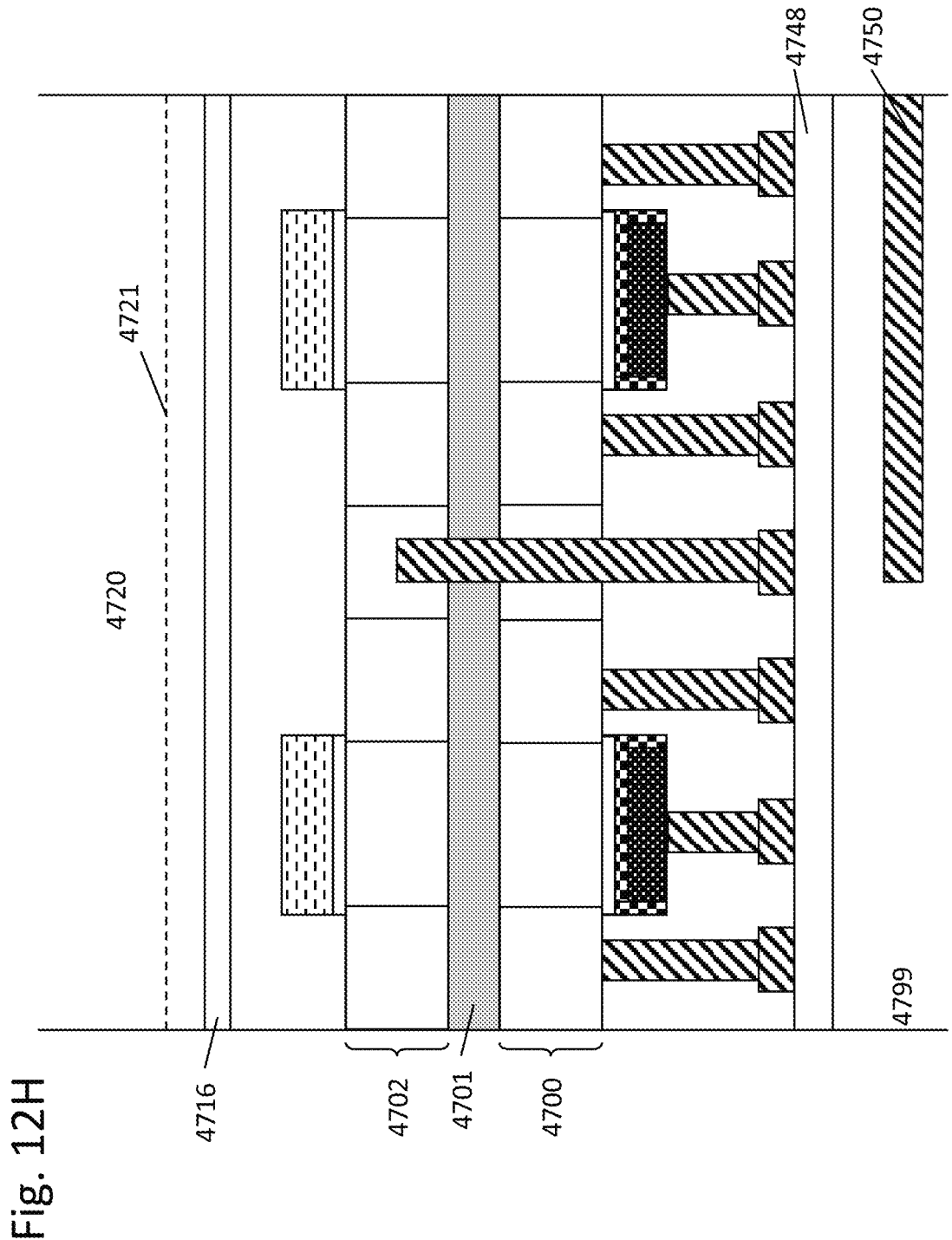

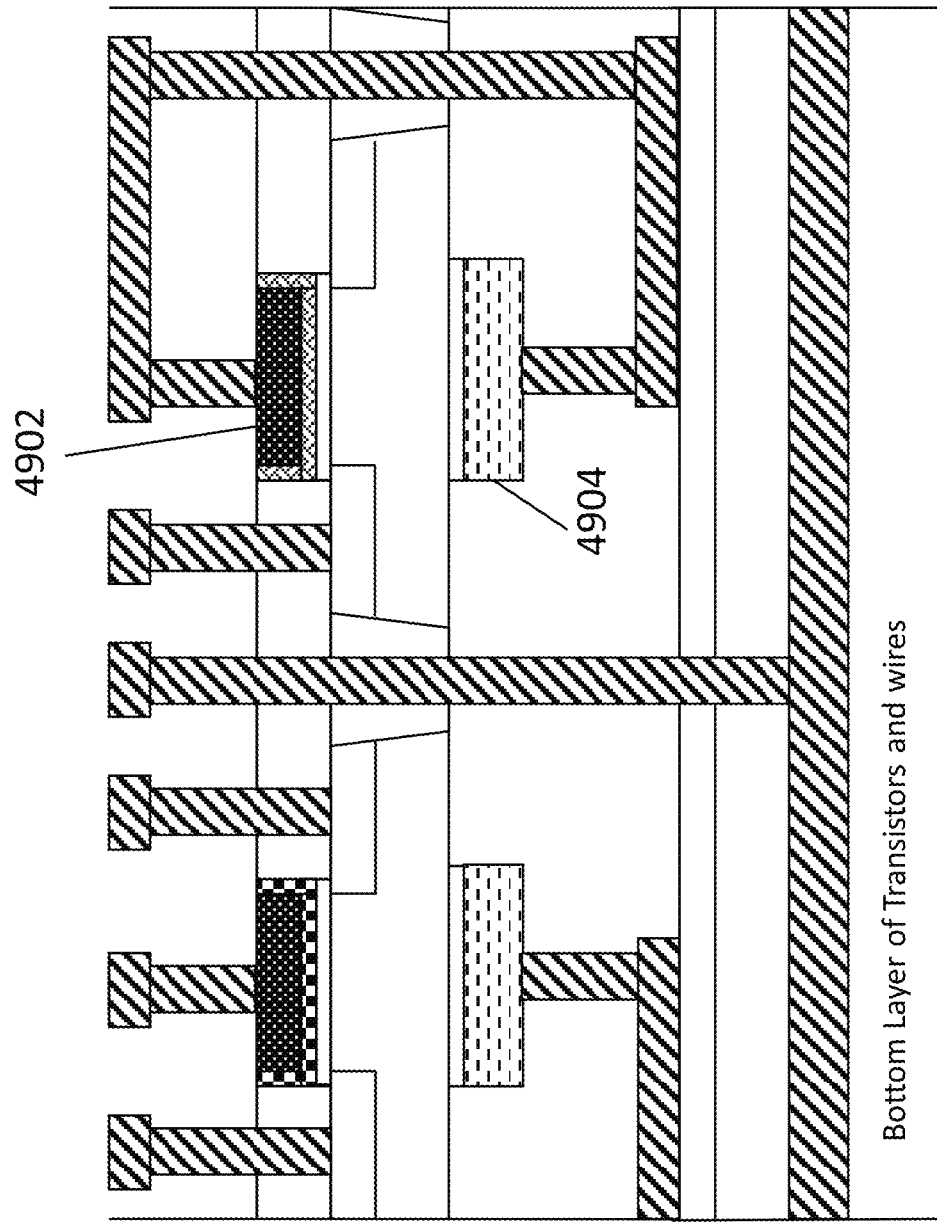

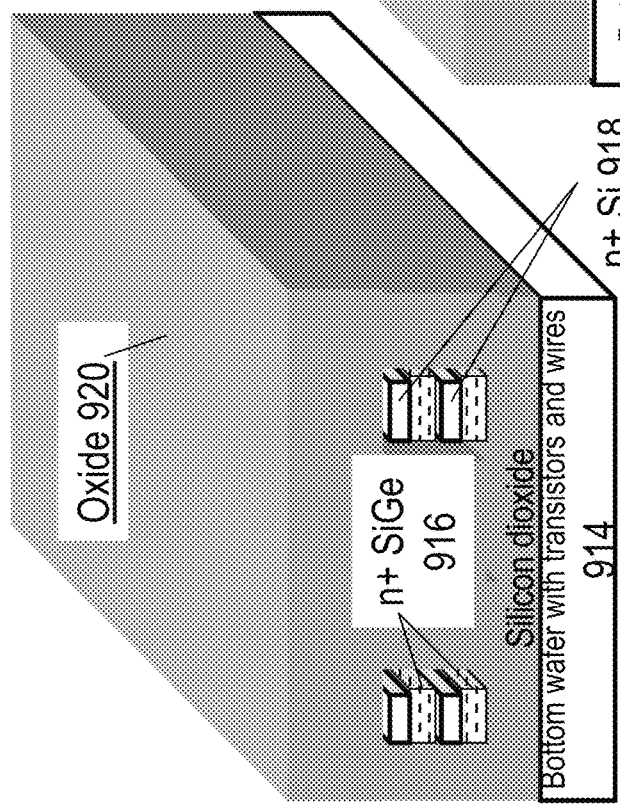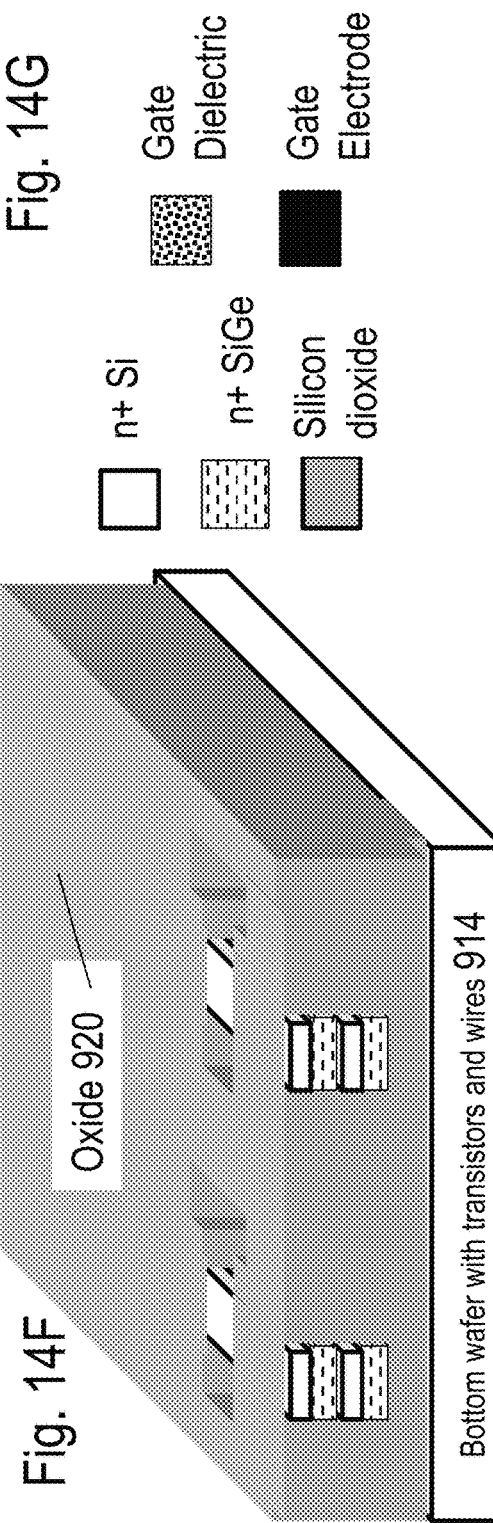

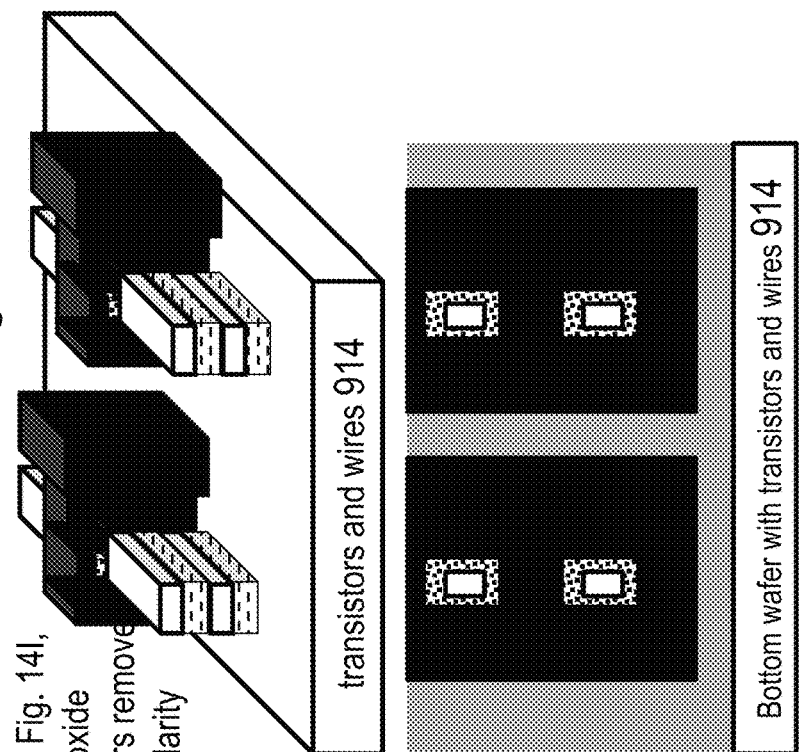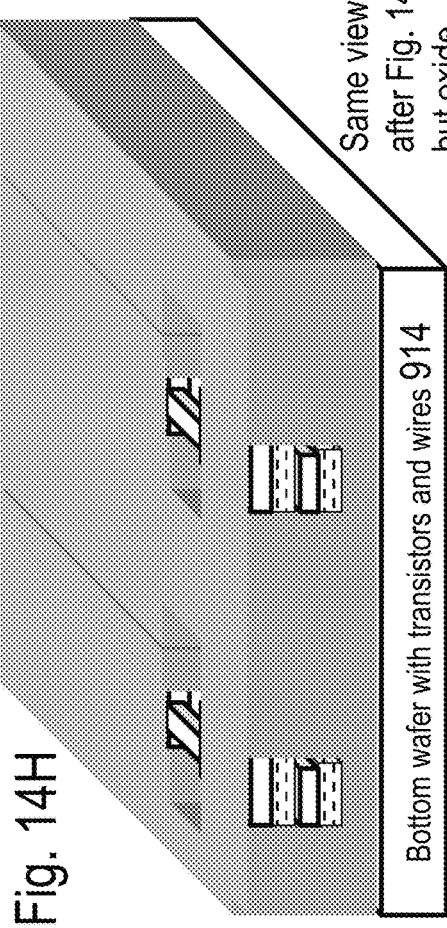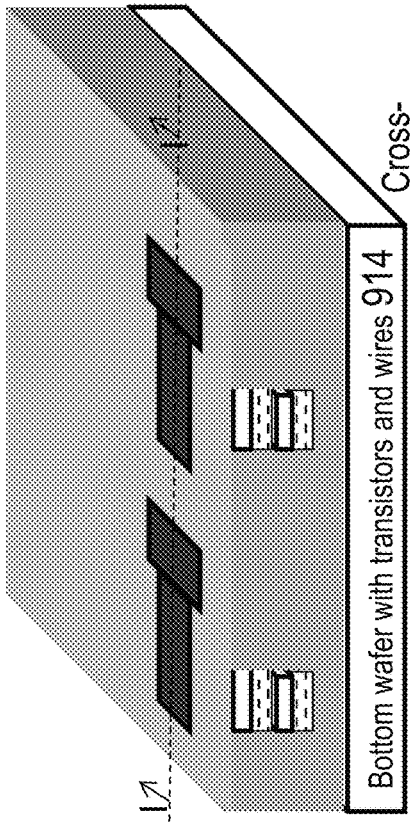

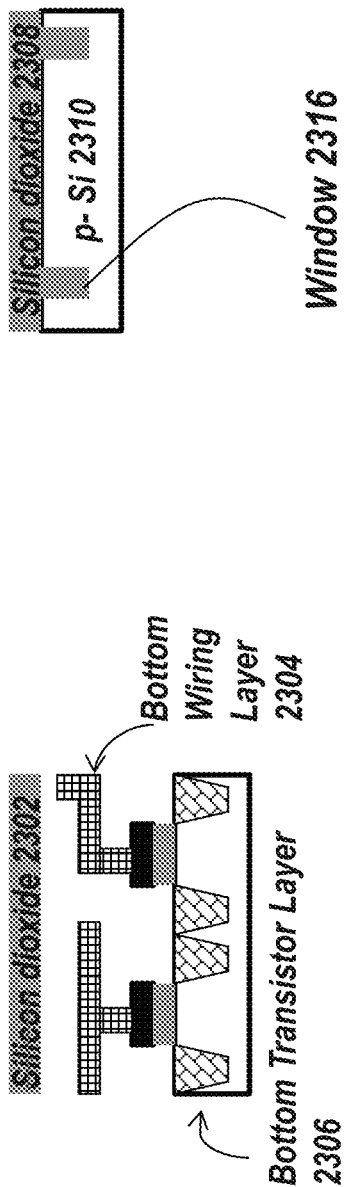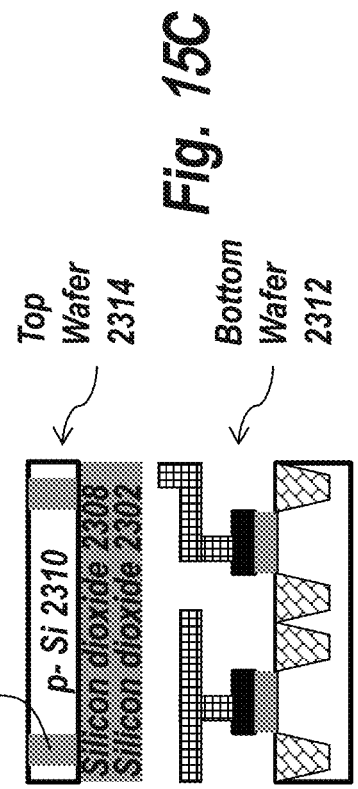

3D SEMICONDUCTOR DEVICES AND STRUCTURES WITH TRANSISTORS

CROSS-REFERENCE OF RELATED APPLICATION

This application is a continuation in part of U.S. patent application Ser. No. 18/105,041, which was filed on Feb. 2, 2023, which is a continuation in part of U.S. patent application Ser. No. 17/898,475, which was filed on Aug. 29, 2022, and now is U.S. Pat. No. 11,600,667 issued on Mar. 7, 2023, which is a continuation in part of U.S. patent application Ser. No. 17/850,840, which was filed on Jun. 27, 2022, and now is U.S. Pat. No. 11,462,586 issued on Oct. 4, 2022, which is a continuation in part of U.S. patent application Ser. No. 17/718,932, which was filed on Apr. 12, 2022, and now is U.S. Pat. No. 11,469,271 issued on Oct. 11, 2022, which is a continuation in part of U.S. patent application Ser. No. 17/683,322, which was filed on Feb. 28, 2022, and now is U.S. Pat. No. 11,335,731 issued on May 17, 2022, which is a continuation in part of U.S. patent application Ser. No. 17/572,550, which was filed on Jan. 10, 2022, and now is U.S. Pat. No. 11,315,980 issued on Apr. 26, 2022, which is a continuation in part of U.S. patent application Ser. No. 17/542,490, which was filed on Dec. 5, 2021, and now is U.S. Pat. No. 11,257,867 issued on Feb. 22, 2022, which is a continuation in part of U.S. patent application Ser. No. 17/402,526, which was filed on Aug. 14, 2021, and now is U.S. Pat. No. 11,227,897 issued on Jan. 18, 2022, which is a continuation in part of U.S. patent application Ser. No. 17/223,822, which was filed on Apr. 6, 2021, and now is U.S. Pat. No. 11,133,351 issued on Sep. 28, 2021, which is a continuation in part of U.S. patent application Ser. No. 17/114,155, which was filed on Dec. 7, 2020, and now is U.S. Pat. No. 11,018,191 issued on May 25, 2021, which is a continuation in part of U.S. patent application Ser. No. 17/013,823, which was filed on Sep. 7, 2020, and now is U.S. Pat. No. 10,896,931 issued on Jan. 19, 2021, which is a continuation in part of U.S. patent application Ser. No. 16/409,813, which was filed on May 11, 2019, and now is U.S. Pat. No. 10,825,864 issued on Nov. 3, 2020, which is a continuation in part of U.S. patent application Ser. No. 15/803,732, which was filed on Nov. 3, 2017, and now is U.S. Pat. No. 10,290,682 issued on May 14, 2019, which is a continuation in part of U.S. patent application Ser. No. 14/555,494, which was filed on Nov. 26, 2014, and now is U.S. Pat. No. 9,818,800 issued on Nov. 14, 2017, which is a continuation of U.S. patent application Ser. No. 13/246,157, which was filed on Sep. 27, 2011 and now is U.S. Pat. No. 8,956,959 issued on Feb. 17, 2015, which is a continuation of U.S. patent application Ser. No. 13/173,999, which was filed on Jun. 30, 2011 and now is U.S. Pat. No. 8,203,148 issued on Jun. 19, 2012, which is a continuation of U.S. patent application Ser. No. 12/901,890, which was filed on Oct. 11, 2010, and now is U.S. Pat. No. 8,026,521 issued on Sep. 27, 2011, the entire contents of the foregoing are incorporated by reference herein.

BACKGROUND OF THE INVENTION

1. Field of the Invention

This invention describes applications of monolithic 3D integration to at least semiconductor chips performing logic and memory functions.

2. Discussion of Background Art

Over the past 40 years, one has seen a dramatic increase in functionality and performance of Integrated Circuits (ICs). This has largely been due to the phenomenon of "scaling" i.e. component sizes within ICs have been reduced ("scaled") with every successive generation of technology. There are two main classes of components in Complimentary Metal Oxide Semiconductor (CMOS) ICs, namely transistors and wires. With "scaling", transistor performance and density typically improve and this has contributed to the previously-mentioned increases in IC performance and functionality. However, wires (interconnects) that connect together transistors degrade in performance with "scaling". The situation today is that wires dominate performance, functionality and power consumption of ICs.

3D stacking of semiconductor chips is one avenue to tackle issues with wires. By arranging transistors in 3 dimensions instead of 2 dimensions (as was the case in the 1990s), one can place transistors in ICs closer to each other. This reduces wire lengths and keeps wiring delay low. However, there are many barriers to practical implementation of 3D stacked chips. These include:

Constructing transistors in ICs typically require high temperatures (higher than ~700° C.) while wiring levels are constructed at low temperatures (lower than ~400° C.). Copper or Aluminum wiring levels, in fact, can get damaged when exposed to temperatures higher than ~400° C. If one would like to arrange transistors in 3 dimensions along with wires, it has the challenge described below. For example, let us consider a 2 layer stack of transistors and wires i.e. Bottom Transistor Layer, above it Bottom Wiring Layer, above it Top Transistor Layer and above it Top Wiring Layer. When the Top Transistor Layer is constructed using Temperatures higher than 700° C., it can damage the Bottom Wiring Layer.

Due to the above mentioned problem with forming transistor layers above wiring layers at temperatures lower than 400° C., the semiconductor industry has largely explored alternative architectures for 3D stacking. In these alternative architectures, Bottom Transistor Layers, Bottom Wiring Layers and Contacts to the Top Layer are constructed on one silicon wafer. Top Transistor Layers, Top Wiring Layers and Contacts to the Bottom Layer are constructed on another silicon wafer. These two wafers are bonded to each other and contacts are aligned, bonded and connected to each other as well. Unfortunately, the size of Contacts to the other Layer is large and the number of these Contacts is small. In fact, prototypes of 3D stacked chips today utilize as few as 10,000 connections between two layers, compared to billions of connections within a layer. This low connectivity between layers is because of two reasons: (i) Landing pad size needs to be relatively large due to alignment issues during wafer bonding. These could be due to many reasons, including bowing of wafers to be bonded to each other, thermal expansion differences between the two wafers, and lithographic or placement misalignment. This misalignment between two wafers limits the minimum contact landing pad area for electrical connection between two layers; (ii) The contact size needs to be relatively large. Forming contacts to another stacked wafer typically involves having a Through-Silicon Via (TSV) on a chip. Etching deep holes in silicon with small lateral dimensions and filling them with metal to form TSVs is not easy. This places a restriction on lateral dimensions of TSVs, which in turn impacts TSV density and contact density to another stacked layer. Therefore, connectivity between two wafers is limited.

It is highly desirable to circumvent these issues and build 3D stacked semiconductor chips with a high-density of connections between layers. To achieve this goal, it is sufficient that one of three requirements must be met: (1) A technology to construct high-performance transistors with processing temperatures below ~400° C.; (2) A technology where standard transistors are fabricated in a pattern, which allows for high density connectivity despite the misalignment between the two bonded wafers; and (3) A chip architecture where process temperature increase beyond 400° C. for the transistors in the top layer does not degrade the characteristics or reliability of the bottom transistors and wiring appreciably. This patent application describes approaches to address options (1), (2) and (3) in the detailed description section. In the rest of this section, background art that has previously tried to address options (1), (2) and (3) will be described.

There are many techniques to construct 3D stacked integrated circuits or chips including:

Through-silicon via (TSV) technology: Multiple layers of transistors (with or without wiring levels) can be constructed separately. Following this, they can be bonded to each other and connected to each other with through-silicon vias (TSVs).

Monolithic 3D technology: With this approach, multiple layers of transistors and wires can be monolithically constructed. Some monolithic 3D and 3DIC approaches are described in U.S. Pat. Nos. 8,273,610, 8,298,875, 8,362,482, 8,378,715, 8,379,458, 8,450, 804, 8,557,632, 8,574,929, 8,581,349, 8,642,416, 8,669,778, 8,674,470, 8,687,399, 8,742,476, 8,803, 206, 8,836,073, 8,902,663, 8,994,404, 9,023,688, 9,029,173, 9,030,858, 9,117,749, 9,142,553, 9,219, 005, 9,385,058, 9,406,670, 9,460,978, 9,509,313, 9,640,531, 9,691,760, 9,711,407, 9,721,927, 9,799, 761, 9,871,034, 9,953,870, 9,953,994, 10,014,318, 10,515,981, 10,892,016, 10,991,675, 11,121,121, 11,502,095, 10,892,016, 11,270,988; and U.S. patent application Publications and applications, U.S. Ser. Nos. 14/642,724, 15/173,686, 62/651,722; 62/681,249, 62/713,345, 62/770,751, 62/952,222, 62/824,288, 63/075,067, 63/091,307, 63/115,000, 63/220,443, 2021/0242189, 2020/0013791; and PCT applications (and Publications): PCT/US2010/052093, PCT/US2011/042071 (WO2012/015550), PCT/US2016/52726 (WO2017053329), PCT/US2017/052359 (WO2018/071143), PCT/US2018/016759 (WO2018144957), PCT/US2018/52332 (WO 2019/060798), PCT/US2021/44110, and PCT/US22/44165. The entire contents of all of the foregoing patents, publications, and applications are incorporated herein by reference.

Electro-Optics: There is also work done for integrated monolithic 3D including layers of different crystals, such as U.S. Pat. Nos. 8,283,215, 8,163,581, 8,753,913, 8,823,122, 9,197,804, 9,419,031, 9,941,319, 10,679, 977, 10,943,934, 10,998,374, 11,063,071, and 11,133, 344. The entire contents of all of the foregoing patents, publications, and applications are incorporated herein by reference.

In addition, the entire contents of U.S. Pat. Nos. 8,026, 521, 8,203,148, 8,956,959, 9,818,800, 10,290,682, and 10,896,931 are incorporated herein by reference.

U.S. Pat. No. 7,052,941 from Sang-Yun Lee ("S Y Lee") describes methods to construct vertical transistors above wiring layers at less than 400° C. In these single crystal Si transistors, current flow in the transistor's channel region is in the vertical direction. Unfortunately, however, almost all semiconductor devices in the market today (logic, DRAM, flash memory) utilize horizontal (or planar) transistors due to their many advantages, and it is difficult to convince the industry to move to vertical transistor technology.

A paper from IBM at the Intl. Electron Devices Meeting in 2005 describes a method to construct transistors for the top stacked layer of a 2 chip 3D stack on a separate wafer. This paper is "Enabling SOI-Based Assembly Technology for Three-Dimensional (3D) Integrated Circuits (ICs)," IEDM Tech. Digest, p. 363 (2005) by A. W. Topol, D. C. La Tulipe, L. Shi, et al. ("Topol"). A process flow is utilized to transfer this top transistor layer atop the bottom wiring and transistor layers at temperatures less than 400° C. Unfortunately, since transistors are fully formed prior to bonding, this scheme suffers from misalignment issues. While Topol describes techniques to reduce misalignment errors in the above paper, the techniques of Topol still suffer from misalignment errors that limit contact dimensions between two chips in the stack to >130 nm.

The textbook "Integrated Interconnect Technologies for 3D Nanoelectronic Systems" by Bakir and Meindl ("Bakir") describes a 3D stacked DRAM concept with horizontal (i.e. planar) transistors. Silicon for stacked transistors is produced using selective epitaxy technology or laser recrystallization. Unfortunately, however, these technologies have higher defect density compared to standard single crystal silicon. This higher defect density degrades transistor performance.

In the NAND flash memory industry, several organizations have attempted to construct 3D stacked memory. These attempts predominantly use transistors constructed with poly-Si or selective epi technology as well as charge-trap concepts. References that describe these attempts to 3D stacked memory include "Integrated Interconnect Technologies for 3D Nanoelectronic Systems", Artech House, 2009 by Bakir and Meindl ("Bakir"), "Bit Cost Scalable Technology with Punch and Plug Process for Ultra High Density Flash Memory", Symp. VLSI Technology Tech. Dig. pp. 14-15, 2007 by H. Tanaka, M. Kido, K. Yahashi, et al. ("Tanaka"), "A Highly Scalable 8-Layer 3D Vertical-Gate (VG) TFT NAND Flash Using Junction-Free Buried Channel BE-SONOS Device," Symposium on VLSI Technology, 2010 by W. Kim, S. Choi, et al. ("W. Kim"), "A Highly Scalable 8-Layer 3D Vertical-Gate (VG) TFT NAND Flash Using Junction-Free Buried Channel BE-SONOS Device," Symposium on VLSI Technology, 2010 by Hang-Ting Lue, et al. ("Lue") and "Sub-50 nm Dual-Gate Thin-Film Transistors for Monolithic 3-D Flash", IEEE Trans. Elect. Dev., vol. 56, pp. 2703-2710, November 2009 by A. J. Walker ("Walker"). An architecture and technology that utilizes single crystal Silicon using epi growth is described in "A Stacked SONOS Technology, Up to 4 Levels and 6 nm Crystalline Nanowires, with Gate-All-Around or Independent Gates (ΦFlash), Suitable for Full 3D Integration", International Electron Devices Meeting, 2009 by A. Hubert, et al ("Hubert"). However, the approach described by Hubert has some challenges including use of difficult-to-manufacture nanowire transistors, higher defect densities due to formation of Si and SiGe layers atop each other, high temperature processing for long times, difficult manufacturing, etc.

It is clear based on the background art mentioned above that invention of novel technologies for 3D stacked layer and chips will be useful.

SUMMARY

The invention may be directed to at least multilayer or Three Dimensional Integrated Circuit (3D IC) devices, structures, and fabrication methods.

In one aspect, a method for producing a 3D memory device, the method including: providing a first level including a single crystal layer and first alignment marks; forming memory control circuits including first single crystal transistors, where the first single crystal transistors include portions of the single crystal layer; forming at least one second level above the first level; performing a first lithographic step over the at least one second level aligned to the first alignment marks; forming at least one third level above the at least one second level; performing a second lithographic step over the third level; performing a first etch step including etching holes within the third level defined by the second lithographic step; performing a third lithographic step over the at least one third level; performing a second etch step including etching holes within the at least one third level and the at least one second level defined by the third lithographic step; and performing additional processing steps to form a plurality of first memory cells within the at least one second level and a plurality of second memory cells within the at least one third level, where each of the plurality of first memory cells include one second transistor, and where each of the plurality of second memory cells include one third transistor.

In another aspect, a method for producing a 3D memory device, the method including: providing a first level including a single crystal layer and first alignment marks; forming memory control circuits including first single crystal transistors, where the first single crystal transistors include portions of the single crystal layer; forming at least one second level above the first level; performing a first etch step including etching lithography windows within the at least one second level; performing a first lithographic step over the at least one second level aligned to the first alignment marks; forming at least one third level above the at least one second level; performing a second lithographic step over the at least one third level; performing a second etch step including etching holes within the at least one third level defined by the second lithographic step; performing a third lithographic step over the at least one third level; performing a third etch step including etching holes within the at least one third level and the at least one second level defined by the third lithographic step; and performing additional processing steps to form a plurality of first memory cells within the at least one second level and a plurality of second memory cells within the at least one third level, where each of the plurality of first memory cells include one second transistor, and where each of the plurality of second memory cells include one third transistor.

In another aspect, a method for producing a 3D memory device, the method including: providing a first level including a single crystal layer and first alignment marks; forming memory control circuits including first single crystal transistors, where the first single crystal transistors include portions of the single crystal layer; forming at least one second level above the first level; performing a first etch step including etching lithography windows within the at least one second level; performing a first lithographic step over the at least one second level aligned to the first alignment marks; and performing additional processing steps to form a plurality of first memory cells within the at last one second level, where each of the plurality of first memory cells include one of a plurality of second transistors, and where the plurality of second transistors are aligned to the first alignment marks with a less than 40 nm alignment error.

In another aspect, a 3D semiconductor device, the device including: a first level including a first single crystal layer and first transistors, where the first transistors each include a single crystal channel; first metal layers interconnecting at least the first transistors; and a second level including a second single crystal layer and second transistors, where the second level overlays the first level, where the second transistors are horizontally oriented and include replacement gate, where the second level is bonded to the first level, and where the bonded includes oxide to oxide bonds.

In another aspect, a 3D semiconductor device, the device including: a first level including a first single crystal layer and alignment marks; first transistors overlaying the first single crystal layer; and second transistors overlaying the first transistors, where the first transistors and the second transistors are self-aligned, being processed following the same lithography step, where the second transistors include replacement gate, being processed to replace a poly silicon gate to a metal based gate, where the first level includes third transistors disposed below the first transistor, where the third transistors are aligned to the alignment marks, and where the third transistors each include a single crystal channel.

In another aspect, a 3D semiconductor device, the device including: a first level including a first single crystal layer, first transistors, and second transistors, where the second transistors are overlaying the first transistors, and where the first transistors and the second transistors are self-aligned, being processed following the same lithography step; and a second level including a second single crystal layer and third transistors, where the second level overlays the first level, where the third transistors are horizontally oriented and include replacement gate, where the second level is bonded to the first level, and where the bonded includes oxide to oxide bonds.

In another aspect, a 3D semiconductor device, the device including: a plurality of transistors, where at least one of the plurality of transistors includes a first single crystal channel, where at least one of the plurality of transistors includes a second single crystal channel, where the second single crystal channel is disposed above the first single crystal channel, where at least one of the plurality of transistors includes a third single crystal channel, where the third single crystal channel is disposed above the second single crystal channel, where at least one of the plurality of transistors includes a fourth single crystal channel, and where the fourth single crystal channel is disposed above the third single crystal channel; and at least one region of oxide to oxide bonds.

In another aspect, a 3D semiconductor device, the device including: a plurality of transistors, where at least one of the plurality of transistors includes a first single crystal channel, where at least one of the plurality of transistors includes a second single crystal channel, where the second single crystal channel is disposed above the first single crystal channel, where at least one of the plurality of transistors includes a third single crystal channel, where the third single crystal channel is disposed above the second single crystal channel, where at least one of the plurality of transistors includes a fourth single crystal channel, where the fourth single crystal channel is disposed above the third single crystal channel; and at least one region of oxide to oxide bonds, where the at least one region of oxide to oxide bonds is disposed underneath the third single crystal channel and above the second single crystal channel.

In another aspect, a 3D semiconductor device, the device including: a plurality of transistors, where at least one of the plurality of transistors includes a first single crystal channel, where at least one of the plurality of transistors includes a second single crystal channel, where the second single crystal channel is disposed above the first single crystal channel, where at least one of the plurality of transistors includes a third single crystal channel, where the third single crystal channel is disposed above the second single crystal channel, where at least one of the plurality of transistors includes a fourth single crystal channel, where the fourth single crystal channel is disposed above the third single crystal channel; and a layer of oxide to oxide bonds; and a single crystal substrate.

In another aspect, a 3D semiconductor device, the device including: a plurality of transistors, where at least one of the plurality of transistors includes a first single crystal source, channel, and drain, where at least one of the plurality of transistors includes a second single crystal source, channel, and drain, where the second single crystal source, channel, and drain is disposed above the first single crystal source, channel, and drain, where at least one of the plurality of transistors includes a third single crystal source, channel, and drain, where the third single crystal source, channel, and drain is disposed above the second single crystal source, channel, and drain, where at least one of the plurality of transistors includes a fourth single crystal source, channel, and drain, and where the fourth single crystal source, channel, and drain is disposed above the third single crystal source, channel, and drain; and an ohmic connection between the first single crystal source or drain and the second single crystal source or drain.

In another aspect, a 3D semiconductor device, the device including: a plurality of transistors, where at least one of the plurality of transistors includes a first single crystal source, channel, and drain, where at least one of the plurality of transistors includes a second single crystal source, channel, and drain, where the second single crystal source, channel, and drain is disposed above the first single crystal source, channel, and drain, where at least one of the plurality of transistors includes a third single crystal source, channel, and drain, where the third single crystal source, channel, and drain is disposed above the second single crystal source, channel, and drain, where at least one of the plurality of transistors includes a fourth single crystal source, channel, and drain, and where the first single crystal source or drain, and the second single crystal source or drain each include n+ doped regions.

In another aspect, a 3D semiconductor device, the device including: a plurality of transistors, where at least one of the plurality of transistors includes a first single crystal channel, where at least one of the plurality of transistors includes a second single crystal channel, where the second single crystal channel is disposed above the first single crystal channel, where at least one of the plurality of transistors includes a third single crystal channel, where the third single crystal channel is disposed above the second single crystal channel, where at least one of the plurality of transistors includes a fourth single crystal channel, where the fourth single crystal channel is disposed above the third single crystal channel, and where formation of the fourth single crystal channel includes a layer transfer process.

In another aspect, a 3D semiconductor device, the device including: a plurality of transistors, where at least one of the plurality of transistors includes a first single crystal source, channel, and drain, where at least one of the plurality of transistors includes a second single crystal source, channel, and drain, where the second single crystal source, channel, and drain is disposed above the first single crystal source, channel, and drain, where at least one of the plurality of transistors includes a third single crystal source, channel, and drain, where the third single crystal source, channel, and drain is disposed above the second single crystal source, channel, and drain, where at least one of the plurality of transistors includes a fourth single crystal source, channel, and drain, and where the fourth single crystal source, channel, and drain is disposed above the third single crystal source, channel, and drain; and where at least one of the plurality of transistors includes two side gates.

In another aspect, a 3D semiconductor device, the device including: a plurality of transistors, where at least one of the plurality of transistors includes a first single crystal source, channel, and drain, where at least one of the plurality of transistors includes a second single crystal source, channel, and drain, where the second single crystal source, channel, and drain is disposed above the first single crystal source, channel, and drain, where at least one of the plurality of transistors includes a third single crystal source, channel, and drain, where the third single crystal source, channel, and drain is disposed above the second single crystal source, channel, and drain, where at least one of the plurality of transistors includes a fourth single crystal source, channel, and drain, and where the first single crystal channel is self-aligned to the second single crystal channel being processed following the same lithography step.

In another aspect, a 3D semiconductor device, the device including: a plurality of transistors, where at least one of the plurality of transistors includes a first single crystal channel, where at least one of the plurality of transistors includes a second single crystal channel, where the second single crystal channel is disposed above the first single crystal channel, where at least one of the plurality of transistors includes a third single crystal channel, where the third single crystal channel is disposed above the second single crystal channel, where at least one of the plurality of transistors includes a fourth single crystal channel, where the fourth single crystal channel is disposed above the third single crystal channel, where the least one of the plurality of transistors is a horizontally oriented transistor, and where formation of the fourth single crystal channel includes a layer transfer process.

In another aspect, a method for producing a 3D semiconductor device, the method including: providing a first level, the first level including a first single crystal layer; forming first alignment marks and control circuits in and/or on the first level, where the control circuits include first single crystal transistors, and where the control circuits include at least two interconnection metal layers; forming at least one second level disposed on top of the control circuits; performing a first etch step into the second level; and performing additional processing steps to form a plurality of first memory cells within the second level, where each of the memory cells include at least one second transistors, and where the additional processing steps include depositing a gate electrode for the second transistors.

In another aspect, a method for producing a 3D semiconductor device, the method including: providing a first level, the first level including a first single crystal layer; forming first alignment marks and control circuits in and/or on the first level, where the control circuits include first single crystal transistors, and where the control circuits include at least two interconnection metal layers; forming at least one second level disposed on top of the control circuits; performing a first etch step into the second level; and performing additional processing steps to form a plurality of first memory cells within the second level, where each of the memory cells include at least one second transistor, where the performing additional processing steps includes using Atomic Layer Deposition (ALD), and where the additional processing steps include depositing a gate electrodes for the second transistors.

In another aspect, a method for producing a 3D semiconductor device, the method including: providing a first level, the first level including a first single crystal layer; forming first alignment marks and control circuits in and/or on the first level, where the control circuits include first single crystal transistors, and where the control circuits include at least two interconnection metal layers; forming at least one second level disposed on top of the control circuits; performing a first etch step into the second level; and performing additional processing steps to form a plurality of first memory cells within the second level, where each of the memory cells include at least one second transistor, where the forming control circuits includes using a weaker anneal process in consideration of subsequent thermal processing, and where the additional processing steps include depositing a gate electrode for the second transistors.

In another aspect, a method for producing a 3D semiconductor device, the method including: providing a first level, the first level including a first single crystal layer; forming first alignment marks and control circuits in and/or on the first level, where the control circuits include first single crystal transistors, and where the control circuits include at least two interconnection metal layers; forming at least one second level disposed above the control circuits; performing a first etch step into the second level; forming at least one third level disposed on top of the second level; and performing additional processing steps to form a plurality of first memory cells within the second level and a plurality of second memory cells within the third level, where each of the plurality of first memory cells include at least one second transistor, where each of the plurality of second memory cells include at least one third transistor, and where the additional processing steps include depositing a gate electrode simultaneously for the second transistors and the third transistors.

In another aspect, a method for producing a 3D semiconductor device, the method including: providing a first level, the first level including a first single crystal layer; forming first alignment marks and control circuits in and/or on the first level, where the control circuits include first single crystal transistors, and where the control circuits include at least two interconnection metal layers; forming at least one second level disposed above the control circuits; performing a first etch step into the second level; forming at least one third level disposed on top of the second level; and performing additional processing steps to form a plurality of first memory cells within the second level and plurality of second memory cells within the third level, where each of the plurality of first memory cells include at least one second transistor, where each of the plurality of second memory cells include at least one third transistor, where the additional processing steps include depositing a gate electrode simultaneously for the second transistors and the third transistors, and where the performing additional processing steps includes using Atomic Layer Deposition (ALD).

In another aspect, a method for producing a 3D semiconductor device, the method including: providing a first level, the first level including a first single crystal layer; forming first alignment marks and control circuits in and/or on the first level, where the control circuits include first single crystal transistors, and where the control circuits include at least two interconnection metal layers; forming at least one second level disposed above the control circuits; performing a first etch step into the second level; forming at least one third level disposed on top of the second level; and performing additional processing steps to form a plurality of first memory cells within the second level and a plurality of second memory cells within the third level, where each of the plurality of first memory cells include at least one second transistor, where each of the plurality of second memory cells include at least one third transistor, where the additional processing steps include depositing a gate electrode simultaneously for the second transistors and the third transistors, and where the forming control circuits includes using a weaker anneal process in consideration of subsequent thermal processing.

In another aspect, a method for producing a 3D semiconductor device, the method including: providing a first level, said first level comprising a first single crystal layer; forming first alignment marks and control circuits in and/or on said first level, wherein said control circuits comprise first single crystal transistors, and wherein said control circuits comprise at least two interconnection metal layers; forming at least one second level disposed above said control circuits; performing a first etch step into said second level; forming at least one third level disposed on top of said second level; performing additional processing steps to form a plurality of first memory cells within said second level and a plurality of second memory cells within said third level, wherein each of said plurality of first memory cells comprise at least one second transistor, wherein each of said plurality of second memory cells comprise at least one third transistor; and performing bonding of said first level to said second level, wherein said bonding comprises oxide to oxide bonding.

In another aspect, a method for producing a 3D semiconductor device, the method including: providing a first level, said first level comprising a first single crystal layer; forming first alignment marks and control circuits in and/or on said first level, wherein said control circuits comprise first single crystal transistors, and wherein said control circuits comprise at least two interconnection metal layers; forming at least one second level disposed above said control circuits; performing a first etch step into said second level; forming at least one third level disposed on top of said second level; performing additional processing steps to form a plurality of first memory cells within said second level and a plurality of second memory cells within said third level, wherein each of said plurality of first memory cells comprise at least one second transistor, wherein each of said plurality of second memory cells comprise at least one third transistor, wherein said additional processing steps comprise depositing a gate electrode simultaneously for said second transistors and said third transistors; and performing bonding of said first level to said second level, wherein said bonding comprises oxide to oxide bonding.

In another aspect, a method for producing a 3D semiconductor device, the method including: providing a first level, said first level comprising a first single crystal layer; forming first alignment marks and control circuits in and/or on said first level, wherein said control circuits comprise first single crystal transistors, and wherein said control circuits comprise at least two interconnection metal layers; forming at least one second level disposed above said control circuits; performing a first etch step into said second level; forming at least one third level disposed on top of said second level; performing additional processing steps to form a plurality of first memory cells within said second level and a plurality of second memory cells within said third level, wherein each of said plurality of first memory cells comprise at least one second transistor, wherein each of said plurality of second memory cells comprise at least one third transistor, wherein said performing additional processing steps comprises using Atomic Layer Deposition (ALD); and performing bonding of said first level to said second level, wherein said bonding comprises oxide to oxide bonding.

In another aspect, a semiconductor device, the device including: a plurality of transistors, where at least one of the plurality of transistors includes a first single crystal source, channel, and drain, where at least one of the plurality of transistors includes a second single crystal source, channel, and drain, where the second single crystal source, channel, and drain is disposed above the first single crystal source, channel, and drain, where at least one of the plurality of transistors includes a third single crystal source, channel, and drain, where the third single crystal source, channel, and drain is disposed above the second single crystal source, channel, and drain, where at least one of the plurality of transistors includes a fourth single crystal source, channel, and drain, and where the fourth single crystal source, channel, and drain is disposed above the third single crystal source, channel, and drain; and a first gate structure, where the first gate structure controls at least one of the first single crystal channels and at least one of the second single crystal channels.

In another aspect, a semiconductor device, the device including: a plurality of transistors, where at least one of the plurality of transistors includes a first single crystal source, channel, and drain, where at least one of the plurality of transistors includes a second single crystal source, channel, and drain, where the second single crystal source, channel, and drain is disposed above the first single crystal source, channel, and drain, where at least one of the plurality of transistors includes a third single crystal source, channel, and drain, where the third single crystal source, channel, and drain is disposed above the second single crystal source, channel, and drain, where at least one of the plurality of transistors includes a fourth single crystal source, channel, and drain, and where the third single crystal channel is self-aligned to the fourth single crystal channel being processed following the same lithography step.

In another aspect, a semiconductor device, the device including: a plurality of transistors, where at least one of the plurality of transistors includes a first single crystal channel, where at least one of the plurality of transistors includes a second single crystal channel, where the second single crystal channel is disposed above the first single crystal channel, where at least one of the plurality of transistors includes a third single crystal channel, where the third single crystal channel is disposed above the second single crystal channel, where at least one of the plurality of transistors includes a fourth single crystal channel, where the fourth single crystal channel is disposed above the third single crystal channel, where the least one of the plurality of transistors is a horizontally oriented transistor; and an oxide layer disposed between the second single crystal channel and the third single crystal channel.

In another aspect, a semiconductor device, the device including: a plurality of transistors, where at least one of the plurality of transistors includes a first single crystal source, channel, and drain, where at least one of the plurality of transistors includes a second single crystal source, channel, and drain, where the second single crystal source, channel, and drain is disposed above the first single crystal source, channel, and drain, where at least one of the plurality of transistors includes a third single crystal source, channel, and drain, where the third single crystal source, channel, and drain is disposed above the second single crystal source, channel, and drain, where at least one of the plurality of transistors includes a fourth single crystal source, channel, and drain, and where the fourth single crystal source, channel, and drain is disposed above the third single crystal source, channel, and drain, and where the fourth drain is aligned to the first drain with less than 40 nm misalignment.

In another aspect, a semiconductor device, the device including: a plurality of transistors, where at least one of the plurality of transistors includes a first single crystal source, channel, and drain, where at least one of the plurality of transistors includes a second single crystal source, channel, and drain, where the second single crystal source, channel, and drain is disposed above the first single crystal source, channel, and drain, where at least one of the plurality of transistors includes a third single crystal source, channel, and drain, where the third single crystal source, channel, and drain is disposed above the second single crystal source, channel, and drain, where at least one of the plurality of transistors includes a fourth single crystal source, channel, and drain, and where at least one of the plurality of transistors includes a gate all around structure.

In another aspect, a semiconductor device, the device including: a plurality of transistors, where at least one of the plurality of transistors includes a first single crystal channel, where at least one of the plurality of transistors includes a second single crystal channel, where the second single crystal channel is disposed above the first single crystal channel, where at least one of the plurality of transistors includes a third single crystal channel, where the third single crystal channel is disposed above the second single crystal channel, where at least one of the plurality of transistors includes a fourth single crystal channel, where the fourth single crystal channel is disposed above the third single crystal channel, where the least one of the plurality of transistors is a horizontally oriented transistor; and where the device include at least one region of oxide to oxide bonds.

BRIEF DESCRIPTION OF THE DRAWINGS

Various embodiments of the invention will be understood and appreciated more fully from the following detailed description, taken in conjunction with the drawings in which:

FIGS. 2A-2K show a zero-mask per layer 3D floating body DRAM;

FIGS. 4A-4K show an alternative zero-mask per layer 3D resistive memory;

FIGS. 6A-6B show periphery on top of memory layers;

FIGS. 9A-9F illustrate a process flow for 3D integrated circuits with gate-last high-k metal gate transistors and face-up layer transfer;

FIGS. 11A-11G illustrate using a carrier wafer for layer transfer;

FIGS. 12A-12K illustrate constructing chips with nMOS and pMOS devices on either side of the wafer;

FIG. 13 illustrates constructing transistors with front gates and back gates on either side of the semiconductor layer;

FIG. 14A-14J show process flows for constructing 3D stacked logic chips using four-side gated junction-less transistors as switches;

FIG. 15A-15C show window for alignment of top wafer to bottom wafer; and

DETAILED DESCRIPTION

Embodiments of the present invention are now described with reference to FIGS. 1-16, it being appreciated that the figures illustrate the subject matter not to scale or to measure. Many figures describe process flows for building devices. These process flows, which are essentially a sequence of steps for building a device, have many structures, numerals and labels that are common between two or more adjacent steps. In such cases, some labels, numerals and structures used for a certain step's figure may have been described in previous steps' figures.

Figure 1A:
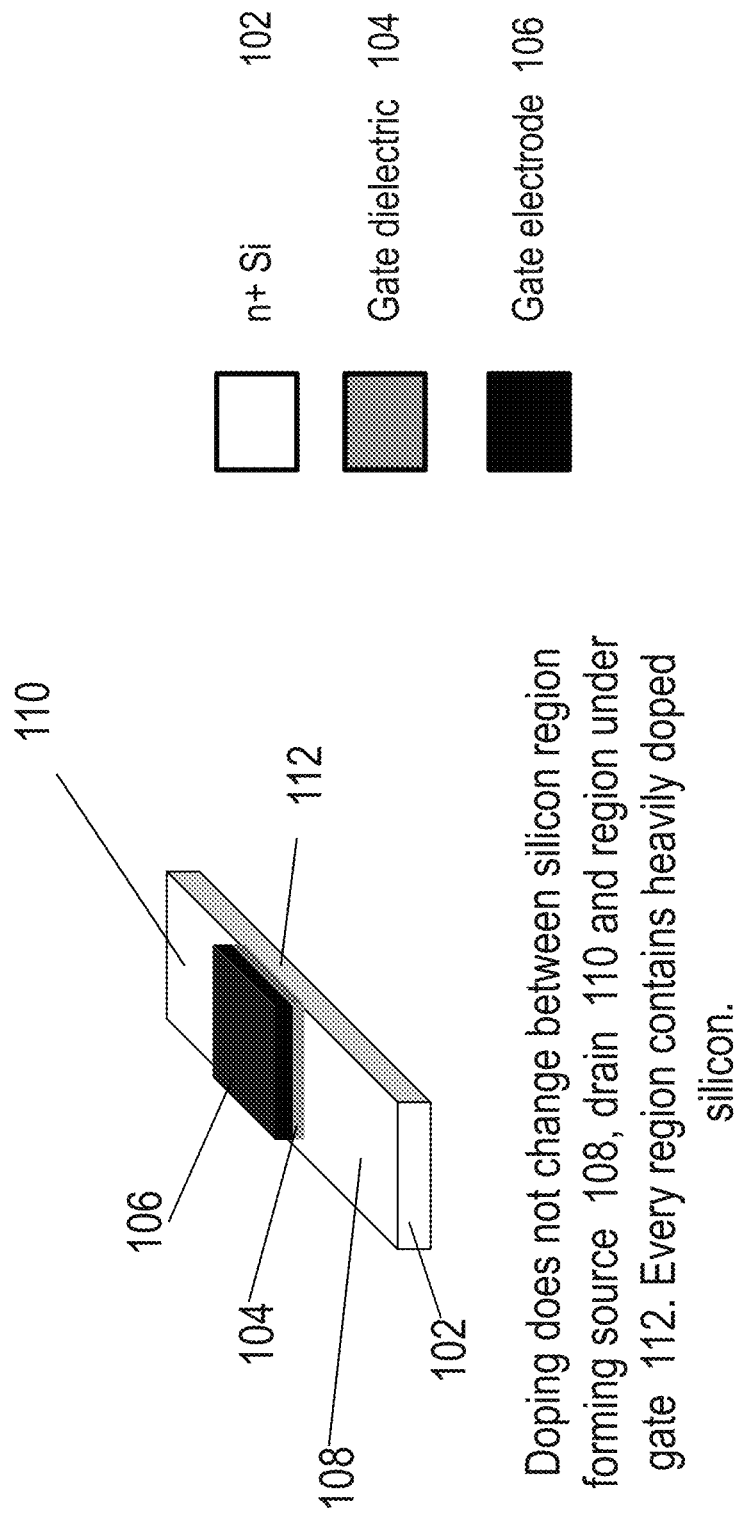
FIGS. 1A-1C show different types of junction-less transistors (JLT) that could be utilized for 3D stacking.
Figure 1B:
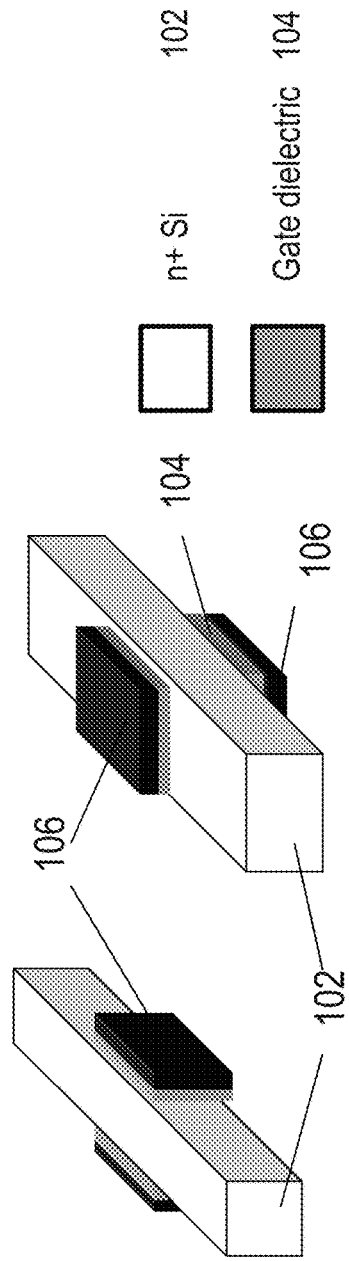
Figure 1C:
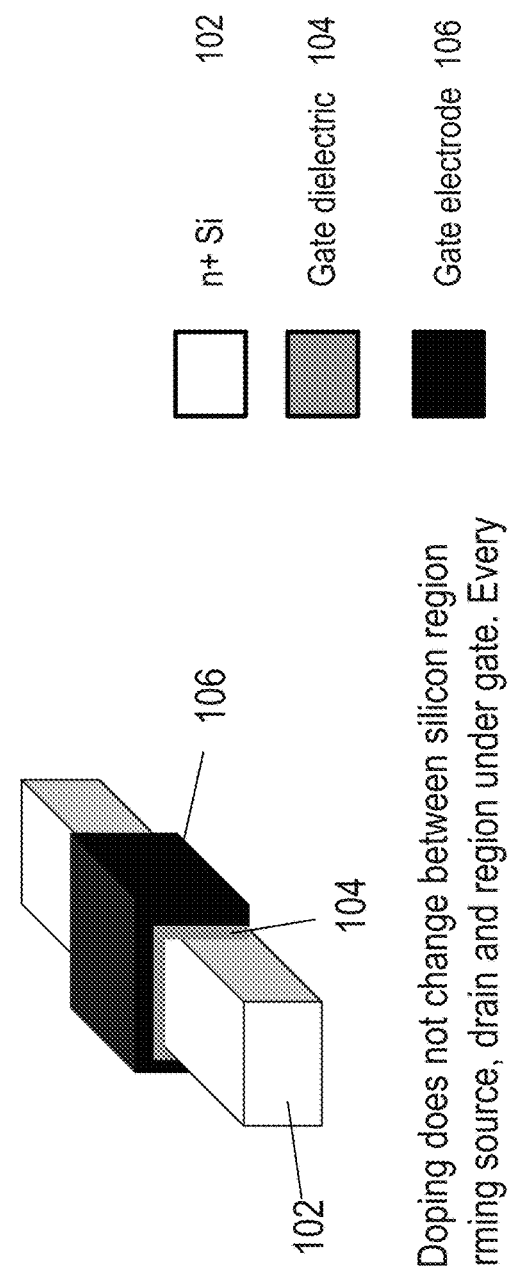

FIG. 1A-1D shows that JLTs that can be 3D stacked fall into four categories based on the number of gates they use: One-side gated JLTs as shown in FIG. 1A, two-side gated JLTs as shown in FIG. 1B, three-side gated JLTs as shown in FIG. 1C, and gate-all-around JLTs as shown in FIG. 1D. The JLTS shown may include n+Si 102, gate dielectric 104, gate electrode 106, n+ source region 108, n+ drain region 110, and n+ region under gate 112. As the number of JLT gates increases, the gate gets more control of the channel, thereby reducing leakage of the JLT at 0V. Furthermore, the enhanced gate control can be traded-off for higher doping (which improves contact resistance to source-drain regions) or bigger JLT cross-sectional areas (which is easier from a process integration standpoint). However, adding more gates typically increases process complexity.

Some embodiments of this invention may involve floating body DRAM. Background information on floating body DRAM and its operation is given in "Floating Body RAM Technology and its Scalability to 32 nm Node and Beyond," *Electron Devices Meeting*, 2006. IEDM '06. *International*, vol., no., pp. 1-4, 11-13 Dec. 2006 by T. Shino, N. Kusunoki T. Higashi, et al., Overview and future challenges of floating body RAM (FBRAM) technology for 32 nm technology node and beyond, Solid-State Electronics, Volume 53, Issue 7, Papers Selected from the 38th European Solid-State Device Research Conference—ESSDERC'08, July 2009, Pages 676-683, ISSN 0038-1101, DOI: 10.1016/j.sse.2009.03.010 by Takeshi Hamamoto, Takashi Ohsawa, et al., "New Generation of Z-RAM," *Electron Devices Meeting*, 2007. IEDM 2007. IEEE International, vol., no., pp. 925-928, 10-12 Dec. 2007 by Okhonin, S.; Nagoga, M.; Carman, E, et al. The above publications are incorporated herein by reference.

FIG. 2A-K describe a process flow to construct a horizontally-oriented monolithic 3D DRAM. This monolithic 3D DRAM utilizes the floating body effect and double-gate transistors. No mask is utilized on a "per-memory-layer" basis for the monolithic 3D DRAM concept shown in FIGS. 2A-K, and all other masks are shared between different layers. The process flow may include several steps in the following sequence.

Figure 2A:
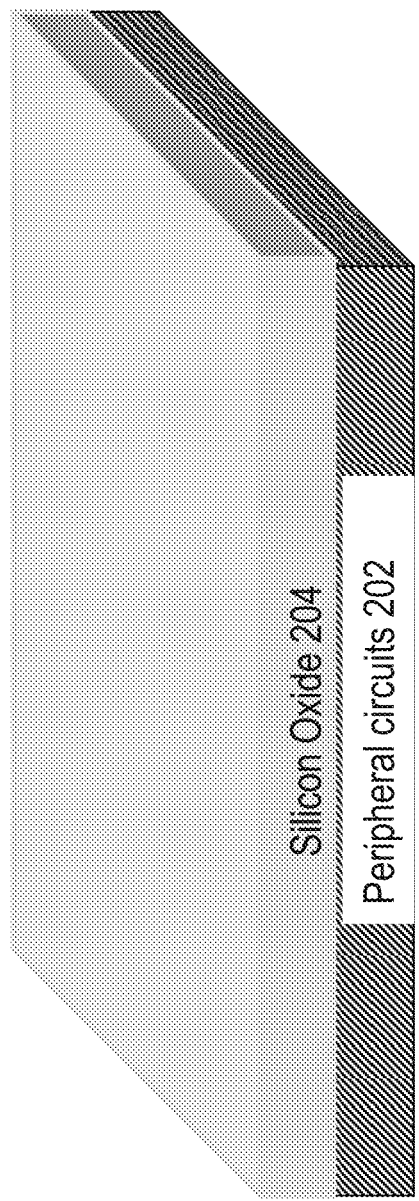

Step (A): Peripheral circuits with tungsten wiring 202 are first constructed and above this a layer of silicon dioxide 204 is deposited. FIG. 2A shows a drawing illustration after Step (A).

Figure 2B:
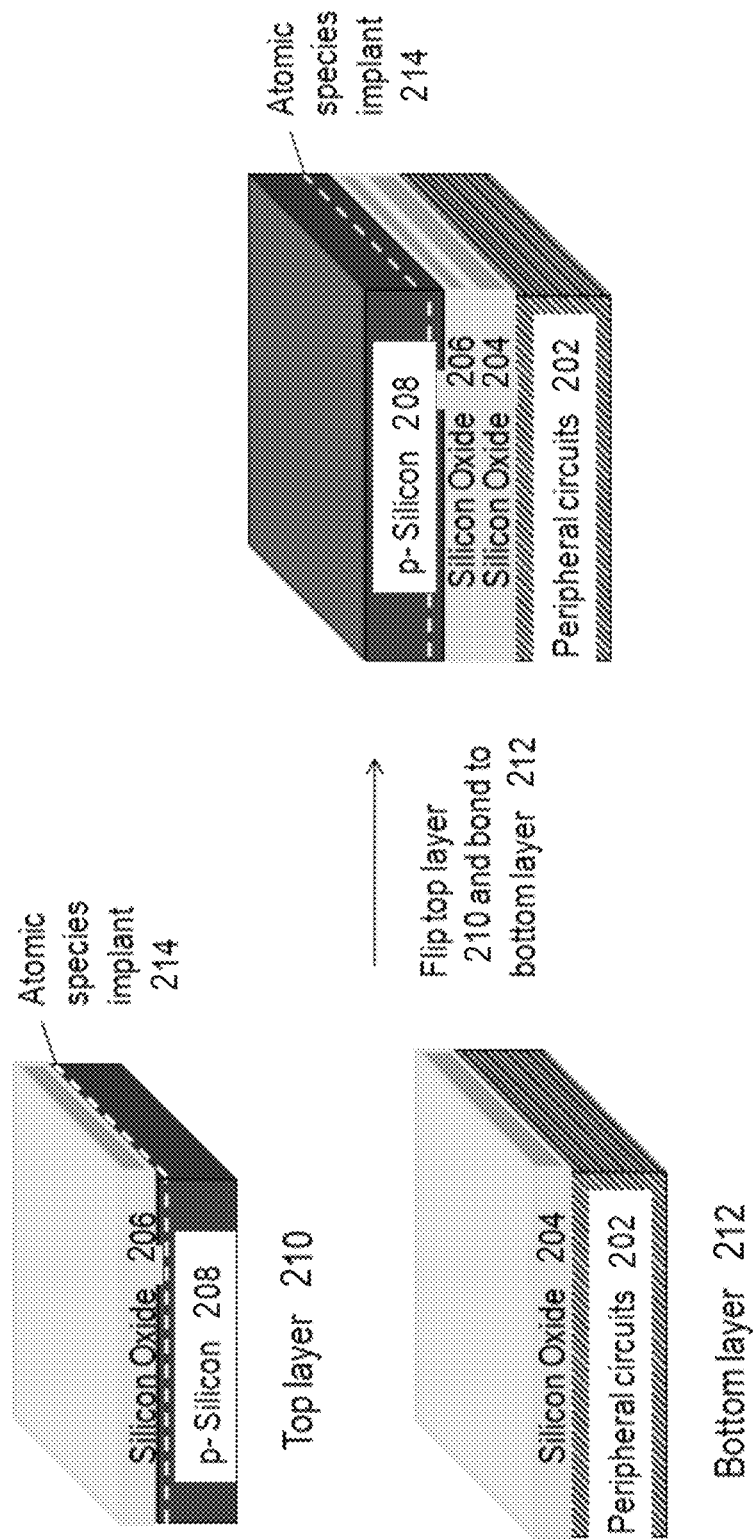

Step (B): FIG. 2B illustrates the structure after Step (B). A wafer of p-Silicon 208 has an oxide layer 206 grown or deposited above it. Following this, hydrogen is implanted into the p-Silicon wafer at a certain depth indicated by 214. Alternatively, some other atomic species such as Helium could be (co-)implanted. This hydrogen implanted p-Silicon wafer 208 forms the top layer 210. The bottom layer 212 may include the peripheral circuits 202 with oxide layer 204. The top layer 210 is flipped and bonded to the bottom layer 212 using oxide-to-oxide bonding.

Figure 2C:
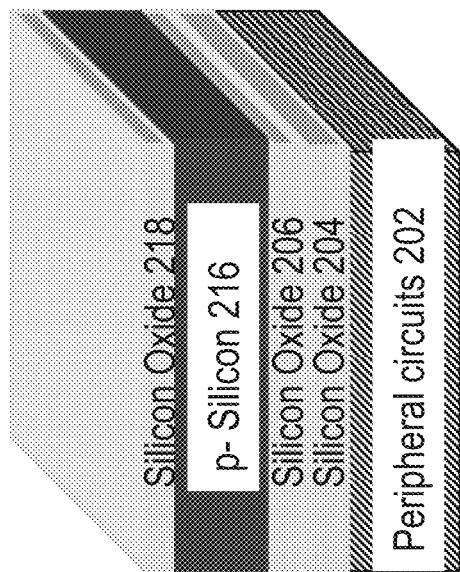

Step (C): FIG. 2C illustrates the structure after Step (C). The stack of top and bottom wafers after Step (B) is cleaved at the hydrogen plane 3014 using either a anneal or a sideways mechanical force or other means. A CMP process is then conducted. A layer of silicon oxide 218 is then deposited atop the p-Silicon layer 216. At the end of this step, a single-crystal p-Si layer 216 exists atop the peripheral circuits, and this has been achieved using layer-transfer techniques.

Figure 2D:
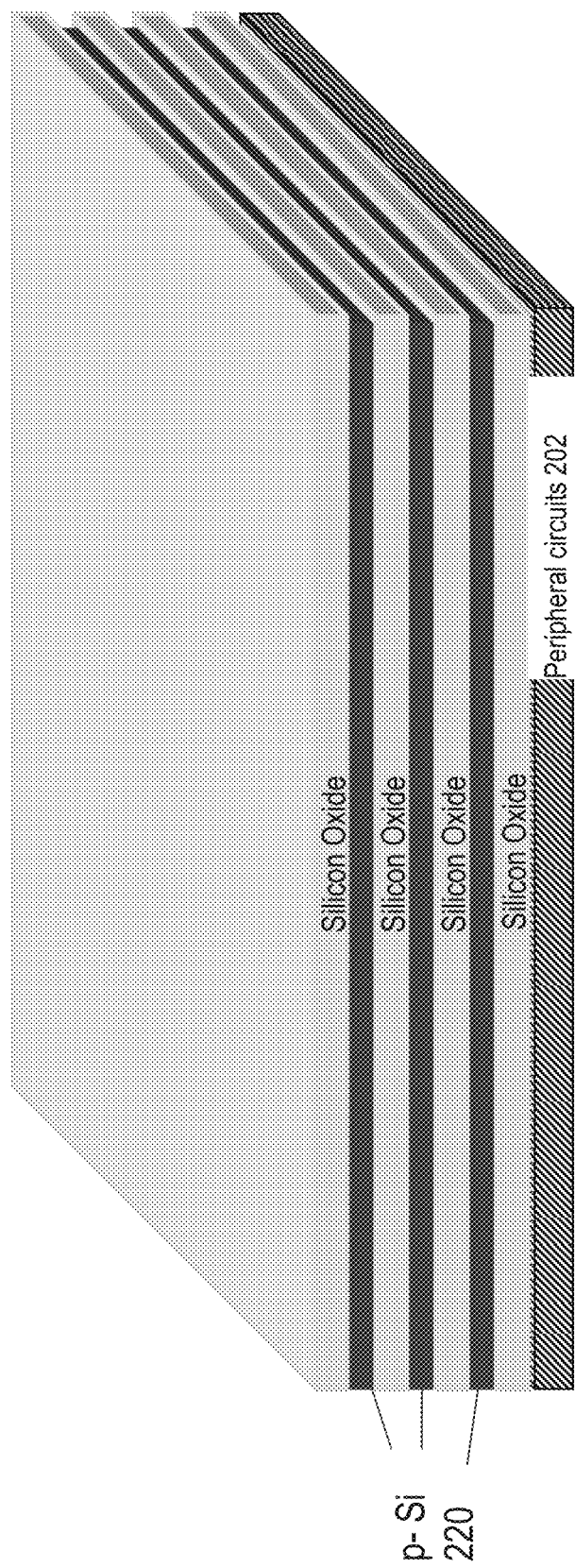

Step (D): FIG. 2D illustrates the structure after Step (D). Using methods similar to Step (B) and (C), multiple p-silicon layers 220 are formed with silicon oxide layers in between.

Step (E): FIG. 2E illustrates the structure after Step (E). Lithography and etch processes are then utilized to make a structure as shown in the figure, including layer regions of p-silicon 221 and associated isolation/bonding oxides 222.

Figure 2F:
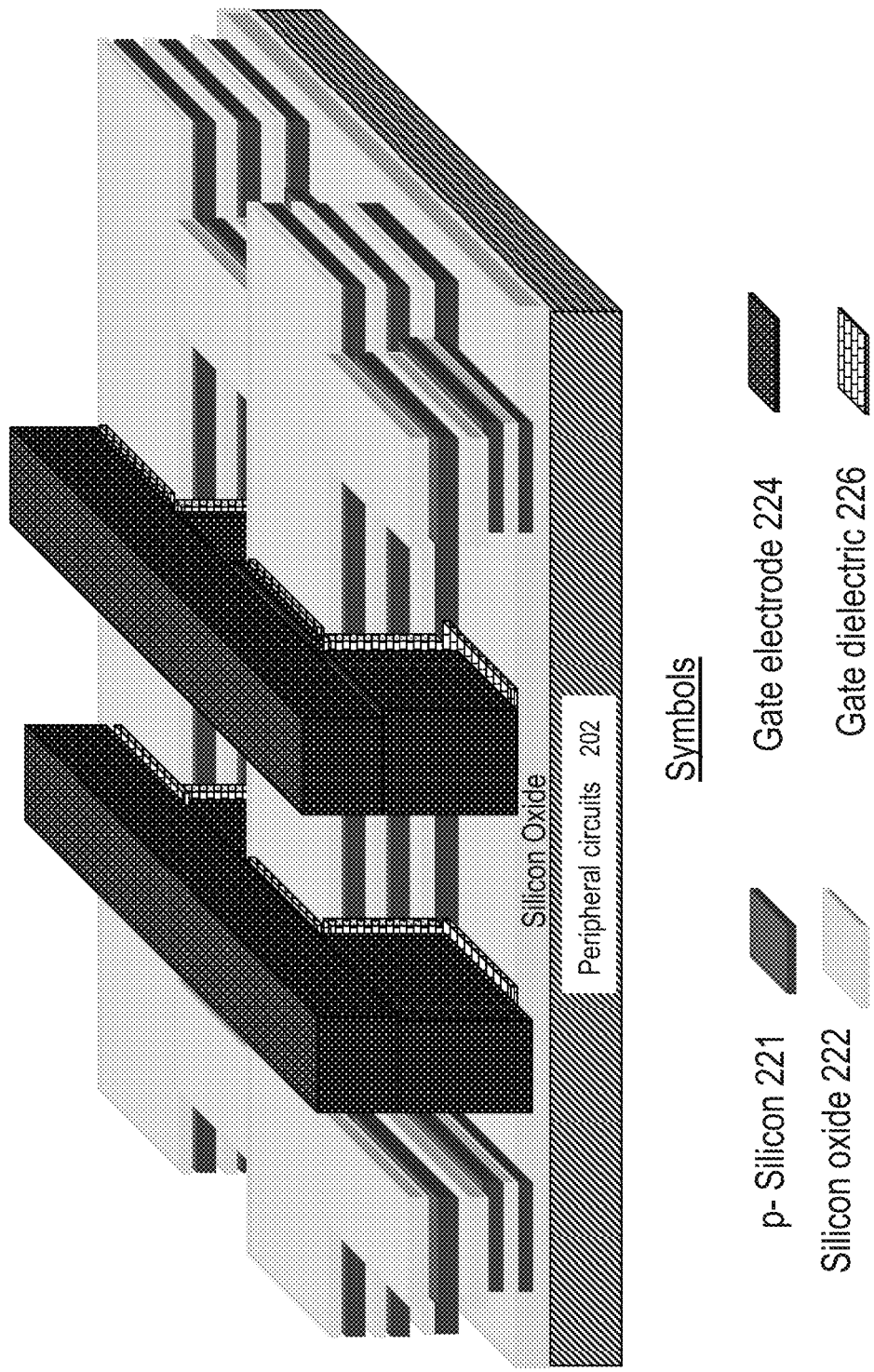

Step (F): FIG. 2F illustrates the structure after Step (F). Gate dielectric 226 and gate electrode 224 are then deposited following which a CMP is done to planarize the gate electrode 224 regions. Lithography and etch are utilized to define gate regions.

Figure 2G:
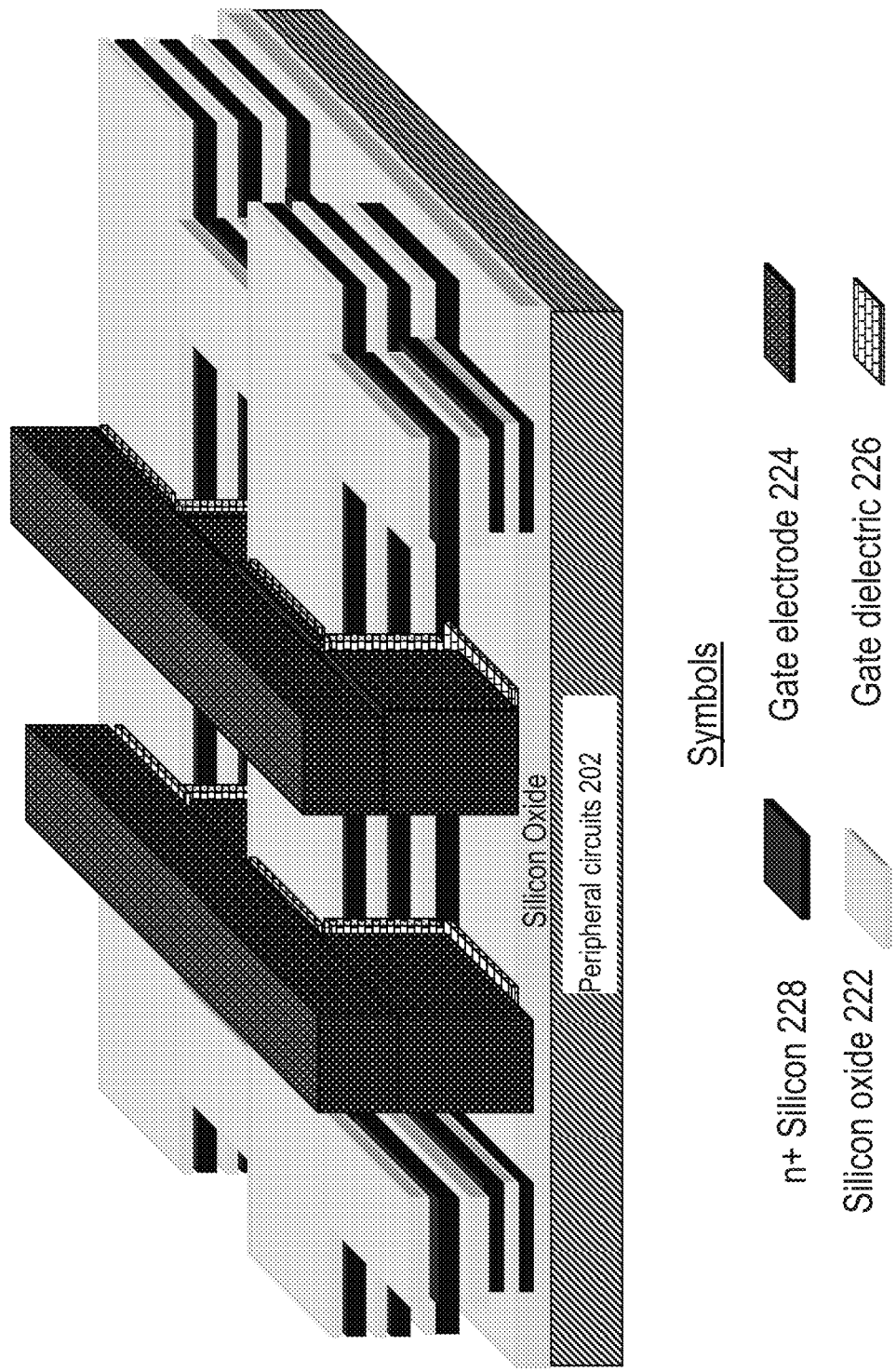

Step (G): FIG. 2G illustrates the structure after Step (G). Using the hard mask defined in Step (F), p-regions not covered by the gate are implanted to form n+ silicon regions 228. Spacers are utilized during this multi-step implantation process and layers of silicon present in different layers of the stack have different spacer widths to account for lateral straggle of buried layer implants. Bottom layers could have larger spacer widths than top layers. A thermal annealing step, such as a RTA or spike anneal or laser anneal or flash anneal, is then conducted to activate n+ doped regions.

Figure 2H:
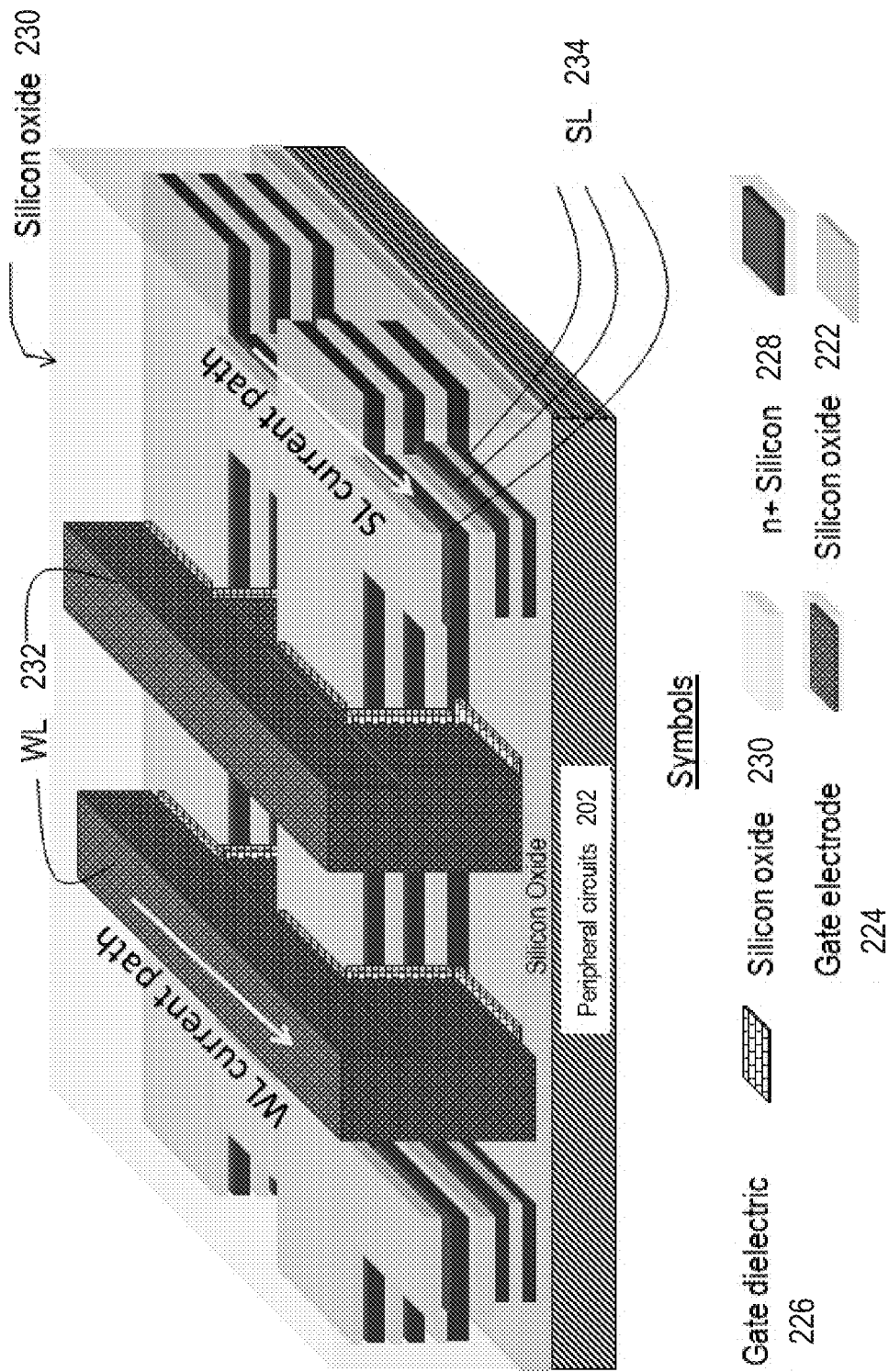
Figure 21:
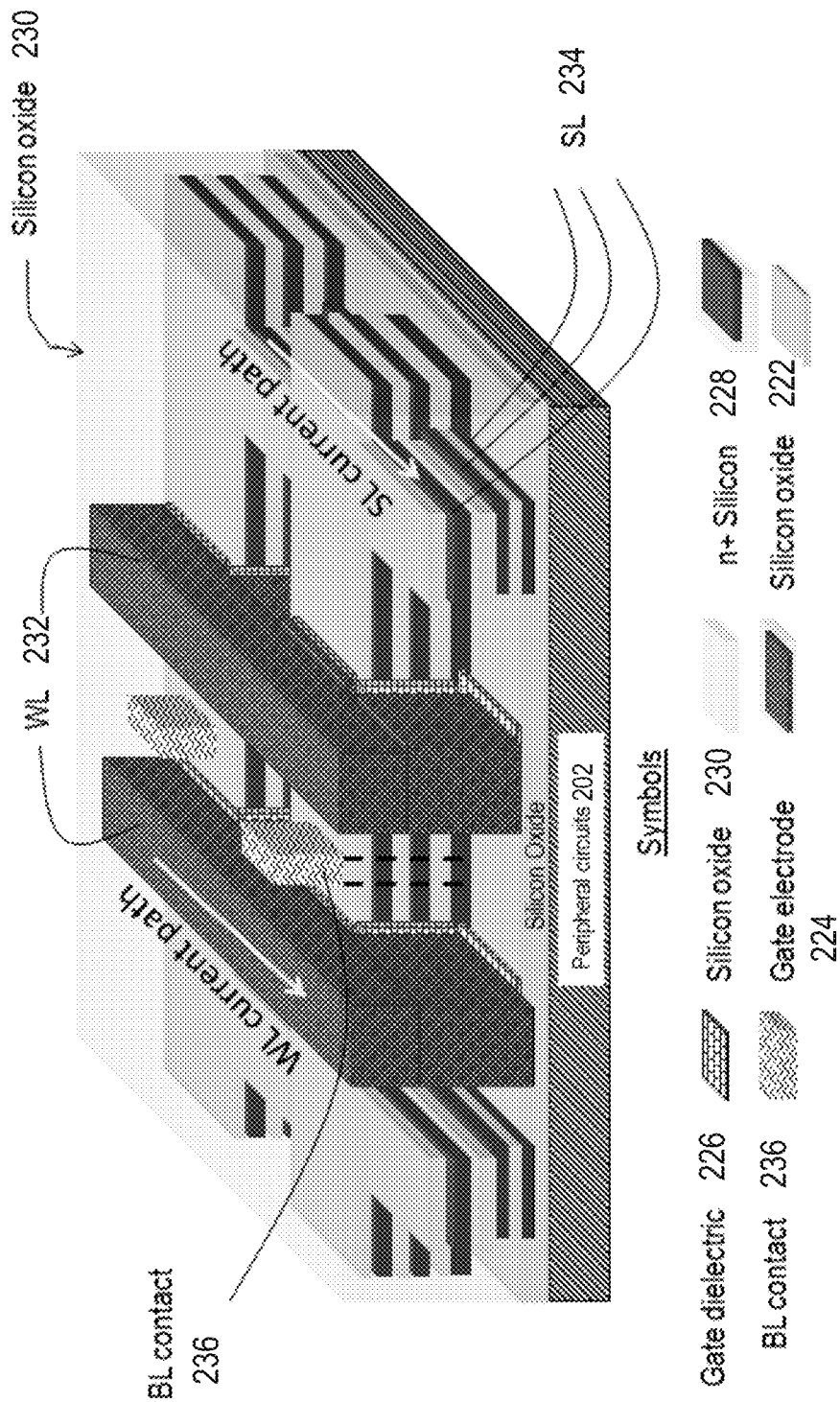

Step (H): FIG. 2H illustrates the structure after Step (H). A silicon oxide layer 230 is then deposited and planarized. For clarity, the silicon oxide layer is shown transparent, along with word-line (WL) 232 and source-line (SL) 234 regions.

Step (I): FIG. 2I illustrates the structure after Step (I). Bit-line (BL) contacts 236 are formed by etching and deposition. These BL contacts are shared among all layers of memory.

Figure 2J:
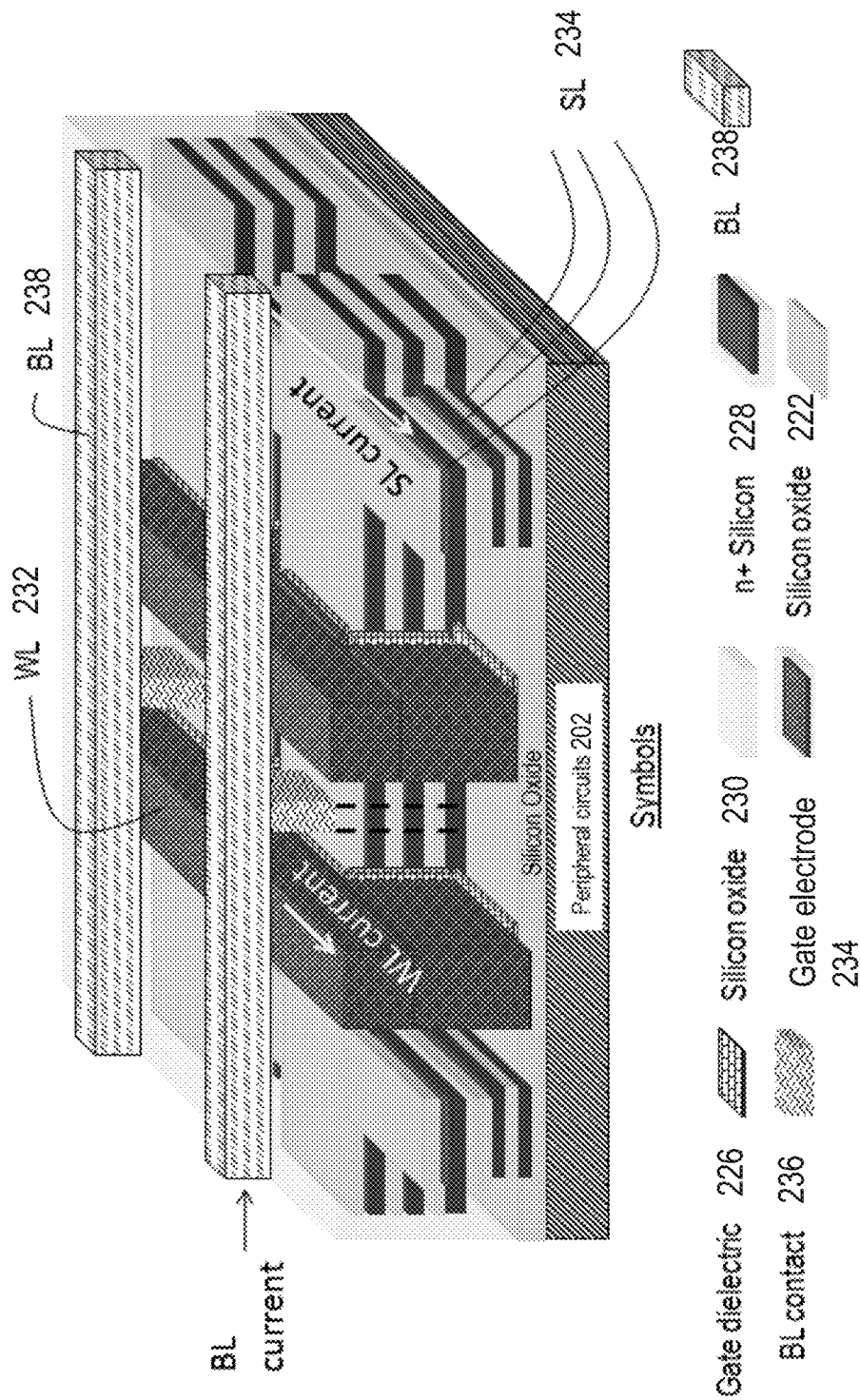

Step (J): FIG. 2J illustrates the structure after Step (J). BLs 238 are then constructed. Contacts are made to BLs, WLs and SLs of the memory array at its edges. SL contacts can be made into stair-like structures using techniques described in "Bit Cost Scalable Technology with Punch and Plug Process for Ultra High Density Flash Memory," *VLSI Technology*, 2007 *IEEE Symposium on*, vol., no., pp. 14-15, 12-14 Jun. 2007 by Tanaka, H; Kido, M.; Yahashi, K; Oomura, M.; et al., following which contacts can be constructed to them. Formation of stair-like structures for SLs could be done in steps prior to Step (J) as well.

FIG. 2K shows cross-sectional views of the array for clarity. Double-gated transistors may be utilized along with the floating body effect for storing information.

A floating-body DRAM has thus been constructed, with (1) horizontally-oriented transistors—i.e. current flowing in substantially the horizontal direction in transistor channels (2) some of the memory cell control lines, e.g., source-lines SL, constructed of heavily doped silicon and embedded in the memory cell layer, (3) side gates simultaneously deposited over multiple memory layers, and (4) monocrystalline (or single-crystal) silicon layers obtained by layer transfer techniques such as ion-cut.

With the explanations for the formation of monolithic 3D DRAM with ion-cut in this section, it is clear to one skilled in the art that alternative implementations are possible. BL and SL nomenclature has been used for two terminals of the 3D DRAM array, and this nomenclature can be interchanged. Each gate of the double gate 3D DRAM can be independently controlled for better control of the memory cell. To implement these changes, the process steps in FIG. 2 may be modified. Moreover, selective epi technology or laser recrystallization technology could be utilized for implementing structures shown in FIG. 2A-K. Various other types of layer transfer schemes that have been described in Section 1.3.4 of the parent application (Ser. No. 12/901,890, 8,026,521) can be utilized for construction of various 3D DRAM structures. Furthermore, buried wiring, i.e. where wiring for memory arrays is below the memory layers but above the periphery, may also be used. In addition, other variations of the monolithic 3D DRAM concepts are possible.

While many of today's memory technologies rely on charge storage, several companies are developing non-volatile memory technologies based on resistance of a material changing. Examples of these resistance-based memories include phase change memory, Metal Oxide memory, resistive RAM (RRAM), memristors, solid-electrolyte memory, ferroelectric RAM, MRAM, etc. Background information on these resistive-memory types is given in "Overview of candidate device technologies for storage-class memory," IBM Journal of Research and Development, vol. 52, no. 4.5, pp. 449-464, July 2008 by Burr, G. W.; Kurdi, B. N.; Scott, J. C.; Lam, C. H.; Gopalakrishnan, K.; Shenoy, R. S.

FIGS. 3A-3J describe a novel memory architecture for resistance-based memories, and a procedure for its construction. The memory architecture utilizes junction-less transistors and has a resistance-based memory element in series with a transistor selector. No mask is utilized on a "per-memory-layer" basis for the monolithic 3D resistance change memory (or resistive memory) concept shown in FIGS. 3A-J, and all other masks are shared between different layers. The process flow may include several steps that occur in the following sequence.

Figure 3A:
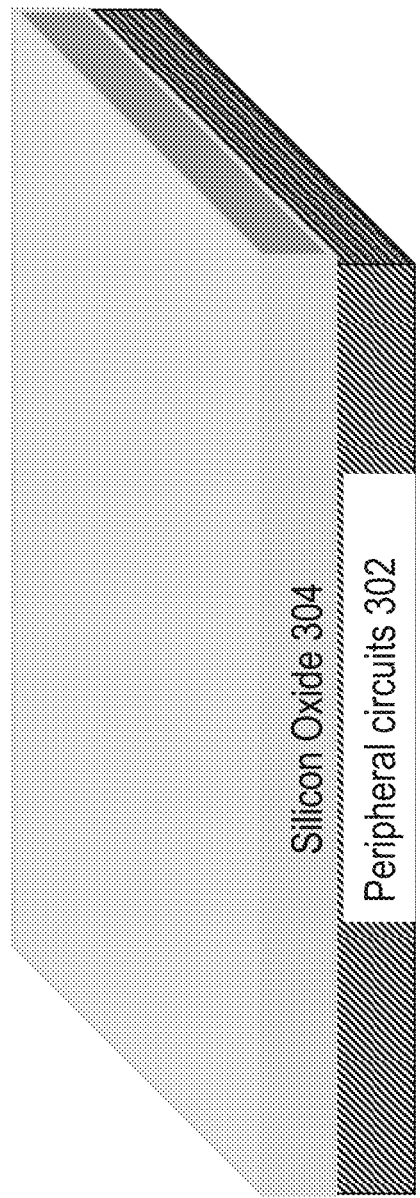
FIGS. 3A-3J show a zero-mask per layer 3D resistive memory with a junction-less transistor.

Step (A): Peripheral circuits 302 are first constructed and above this a layer of silicon dioxide 304 is deposited. FIG. 3A shows a drawing illustration after Step (A).

Figure 3B:
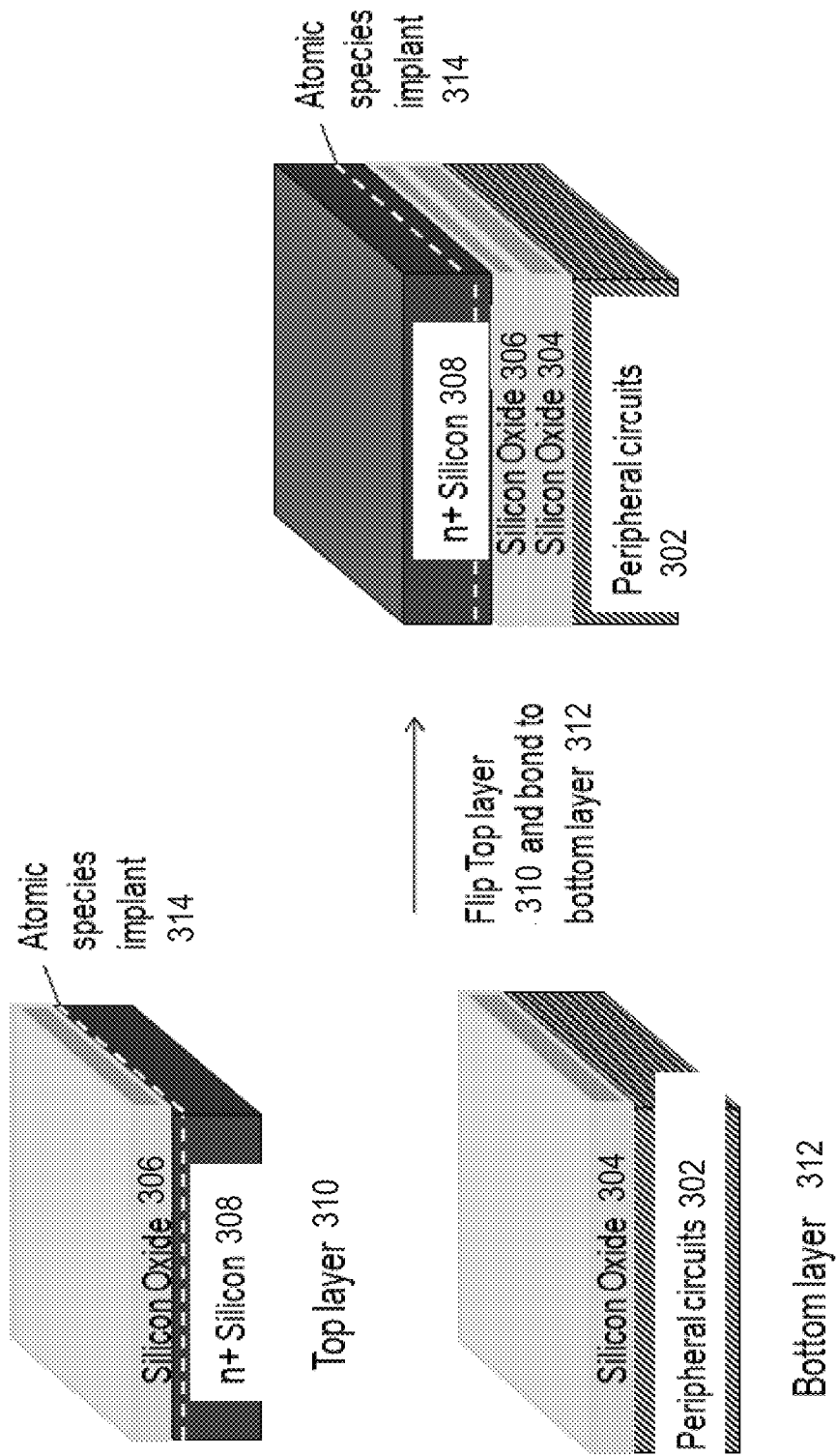

Step (B): FIG. 3B illustrates the structure after Step (B). A wafer of n+ Silicon 308 has an oxide layer 306 grown or deposited above it. Following this, hydrogen is implanted into the n+ Silicon wafer at a certain depth indicated by 314. Alternatively, some other atomic species such as Helium could be (co-)implanted. This hydrogen implanted n+ Silicon wafer 308 forms the top layer 310. The bottom layer 312 may include the peripheral circuits 302 with oxide layer 304. The top layer 310 is flipped and bonded to the bottom layer 312 using oxide-to-oxide bonding.

Figure 3C:
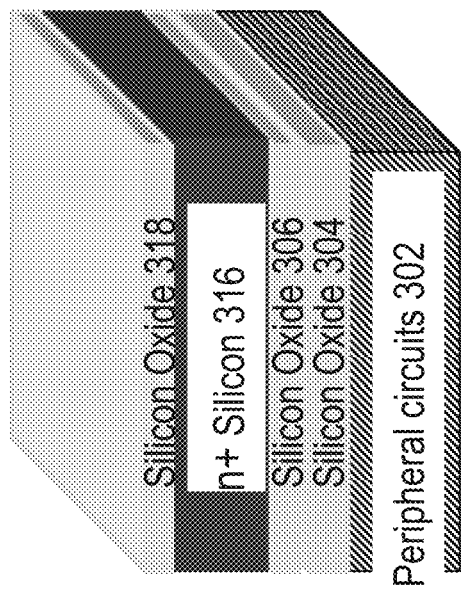

Step (C): FIG. 3C illustrates the structure after Step (C). The stack of top and bottom wafers after Step (B) is cleaved at the hydrogen plane 314 using either an anneal or a sideways mechanical force or other means. A CMP process is then conducted. A layer of silicon oxide 318 is then deposited atop the n+ Silicon layer 316. At the end of this step, a single-crystal n+Si layer 316 exists atop the peripheral circuits, and this has been achieved using layer-transfer techniques.

Figure 3D:
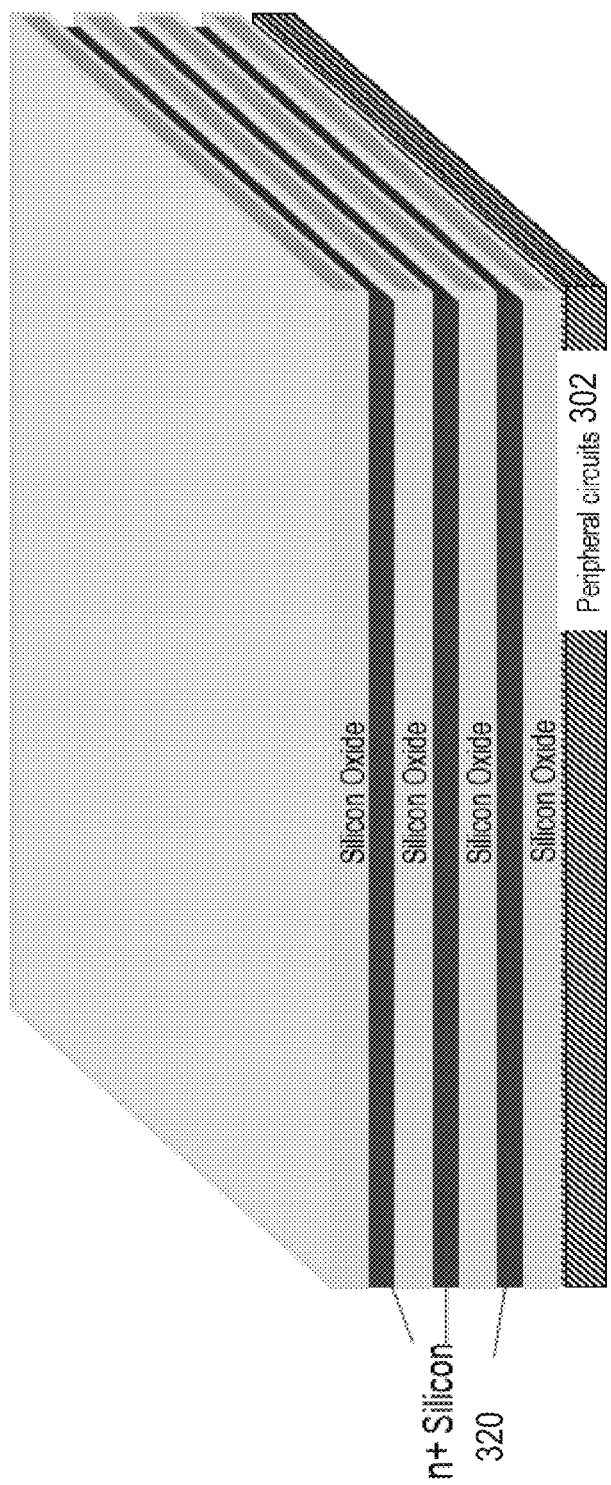

Step (D): FIG. 3D illustrates the structure after Step (D). Using methods similar to Step (B) and (C), multiple n+ silicon layers 320 are formed with silicon oxide layers in between.

Figure 3E:
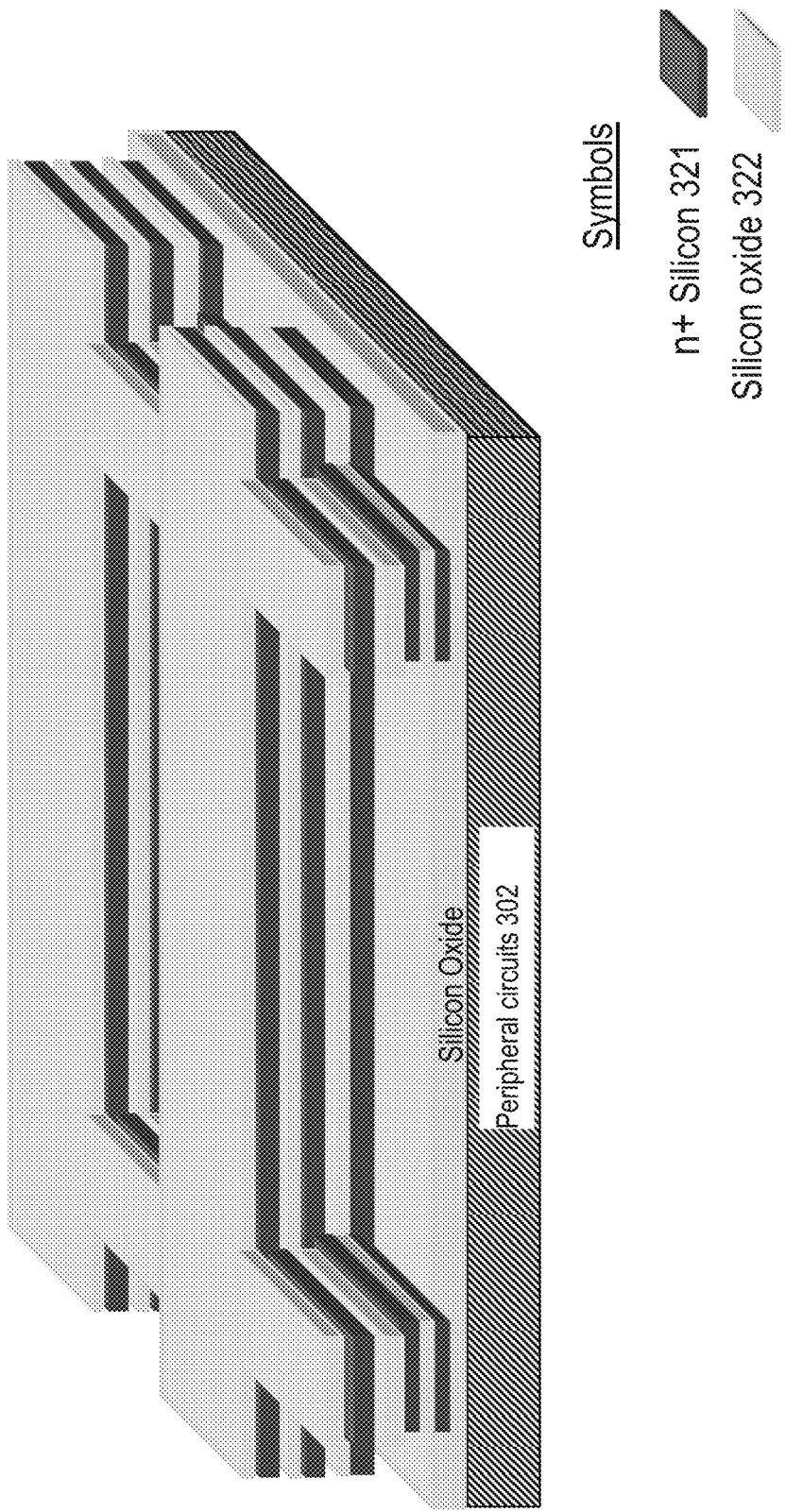

Step (E): FIG. 3E illustrates the structure after Step (E). Lithography and etch processes are then utilized to make a structure as shown in the figure, including layer regions of n+ silicon 321 and associated bonding/isolation oxides 322.

Figure 3F:
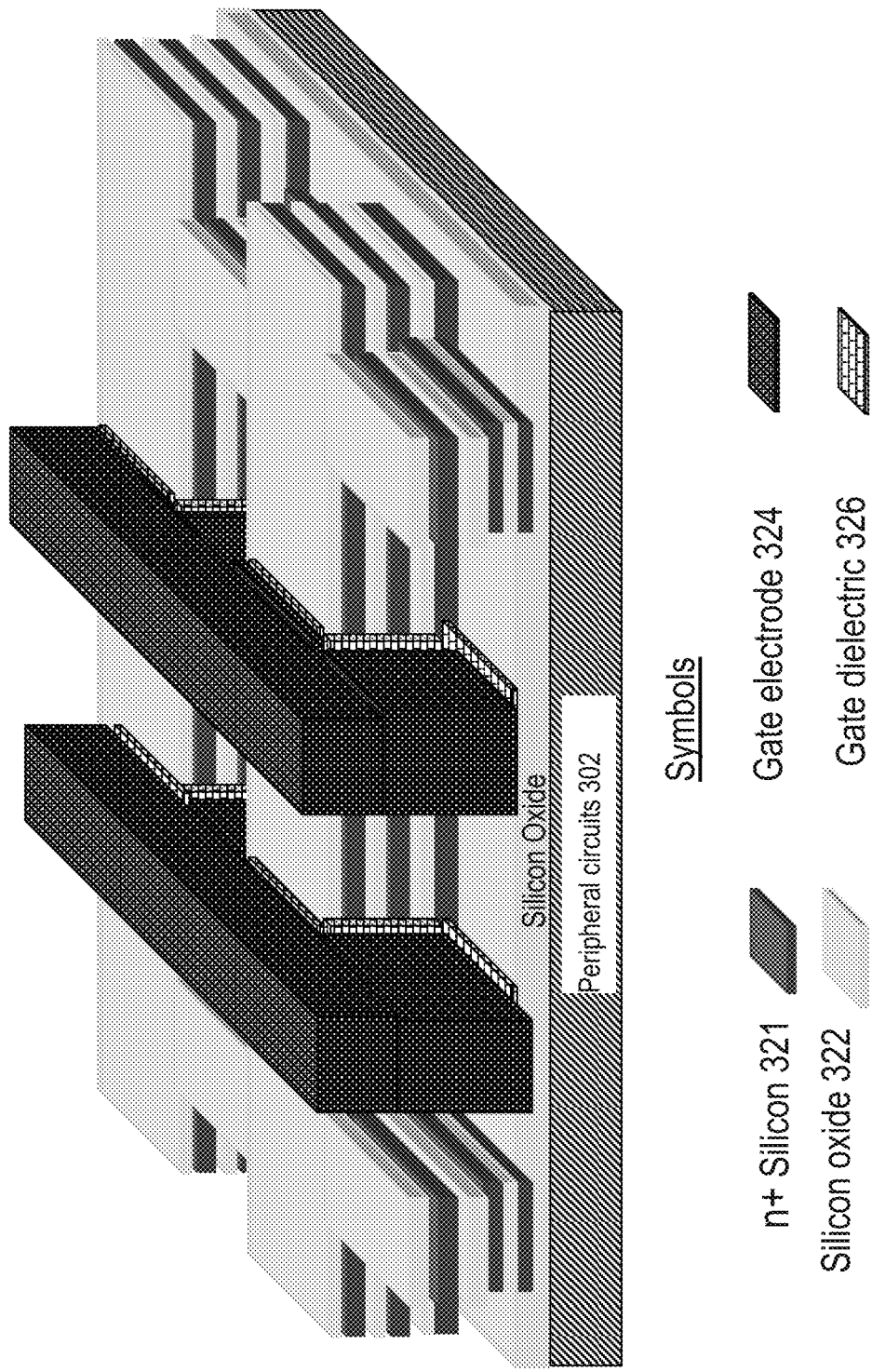

Step (F): FIG. 3F illustrates the structure after Step (F). Gate dielectric 326 and gate electrode 324 are then deposited following which a CMP is performed to planarize the gate electrode 324 regions. Lithography and etch are utilized to define gate regions.

Figure 3G:
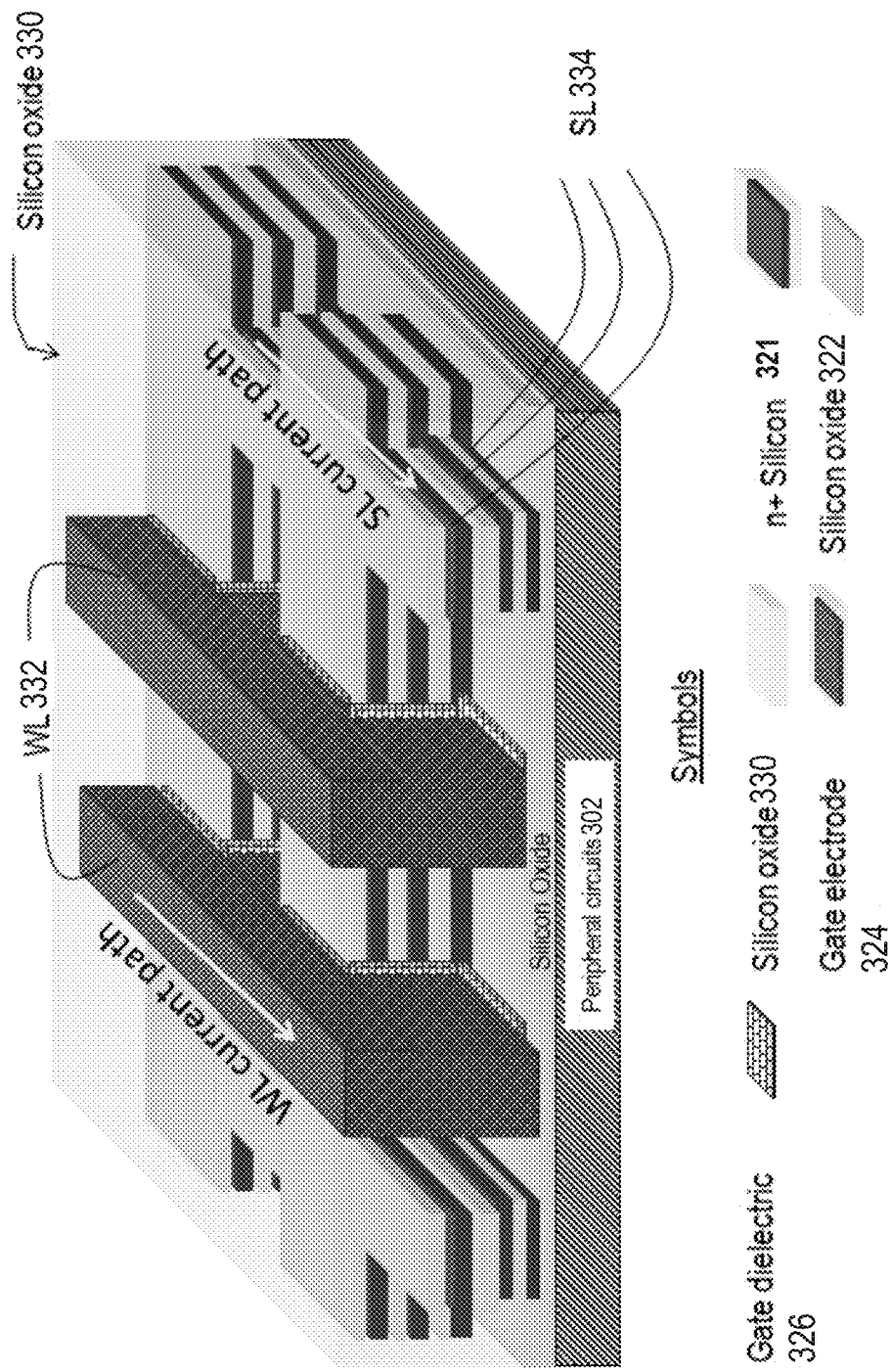

Step (G): FIG. 3G illustrates the structure after Step (G). A silicon oxide layer 330 is then deposited and planarized. The silicon oxide layer is shown transparent in the figure for clarity, along with word-line (WL) 332 and source-line (SL) 334 regions.

Figure 3H:
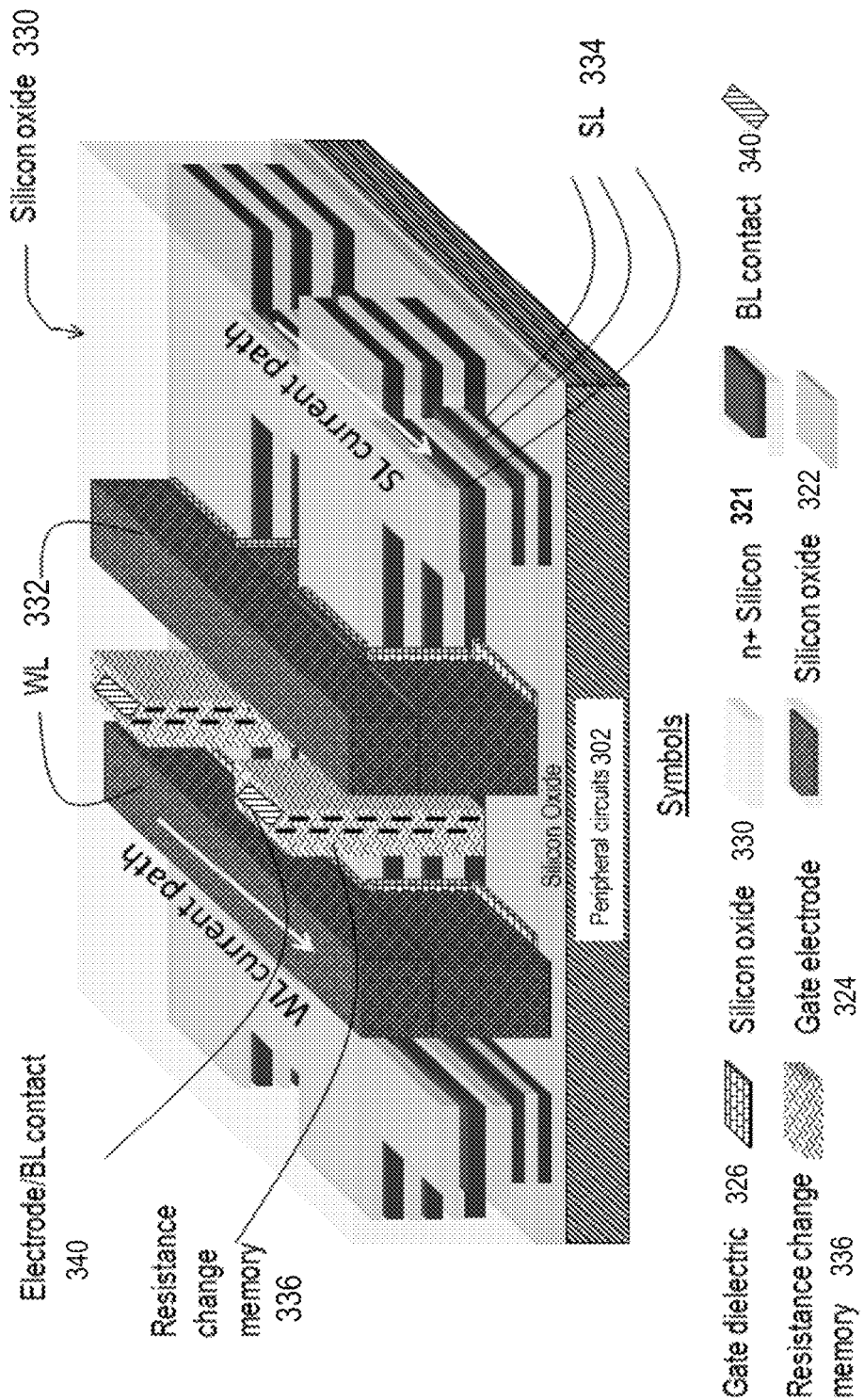

Step (H): FIG. 3H illustrates the structure after Step (H). Vias are etched through multiple layers of silicon and silicon dioxide as shown in the figure. A resistance change memory material 336 is then deposited (preferably with atomic layer deposition (ALD)). Examples of such a material include hafnium oxide, well known to change resistance by applying voltage. An electrode for the resistance change memory element is then deposited (preferably using ALD) and is shown as electrode/BL contact 340. A CMP process is then conducted to planarize the surface. It can be observed that multiple resistance change memory elements in series with junctionless transistors are created after this step.

Figure 3I:
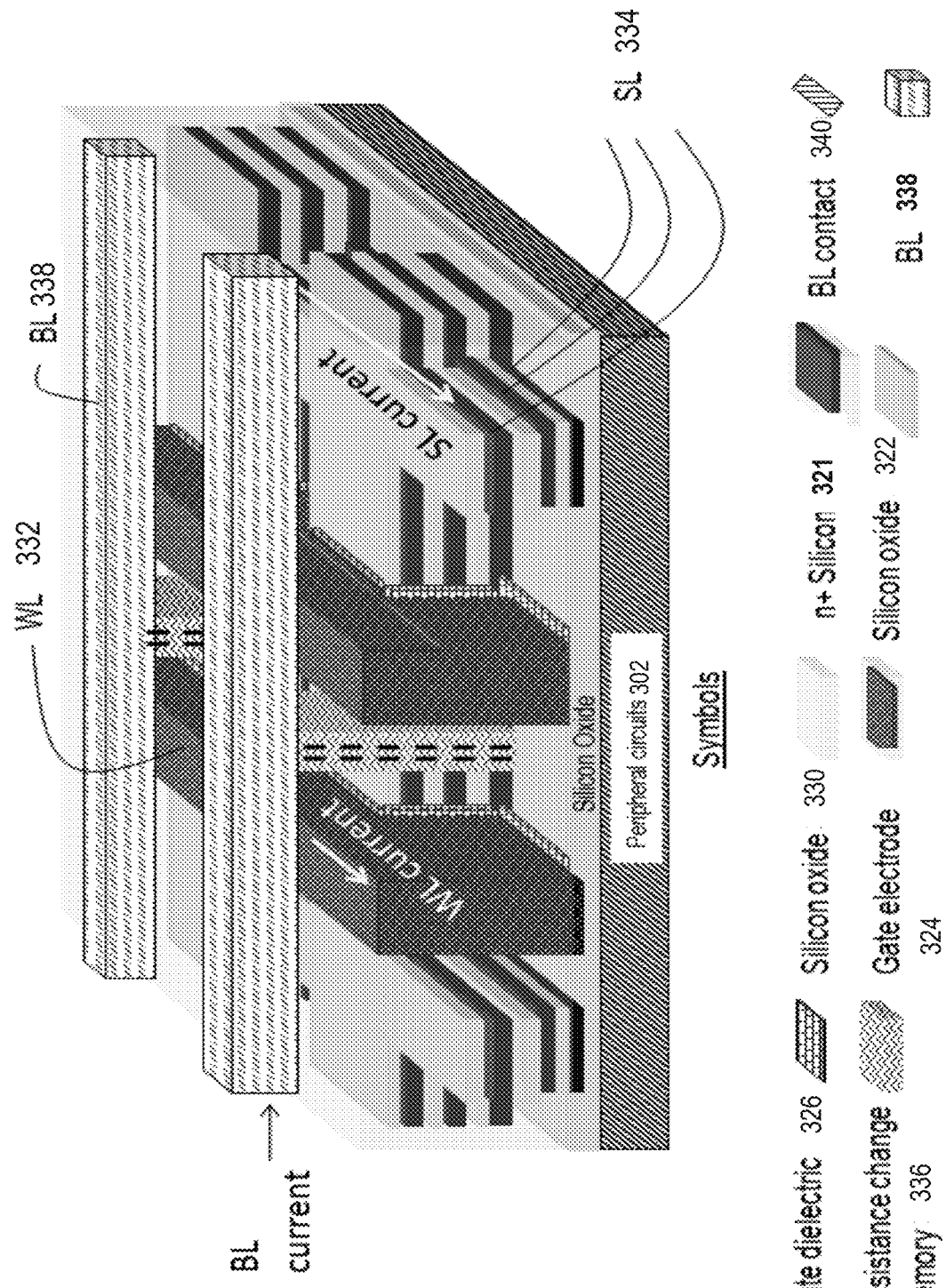

Step (I): FIG. 3I illustrates the structure after Step (I). BLs 338 are then constructed. Contacts are made to BLs, WLs and SLs of the memory array at its edges. SL contacts can be made into stair-like structures using techniques described in in "Bit Cost Scalable Technology with Punch and Plug Process for Ultra High Density Flash Memory," *VLSI Technology*, 2007 *IEEE Symposium on*, vol., no., pp. 14-15, 12-14 Jun. 2007 by Tanaka, H; Kido, M.; Yahashi, K; Oomura, M.; et al., following which contacts can be constructed to them. Formation of stair-like structures for SLs could be achieved in steps prior to Step (I) as well.

Figure 3J:
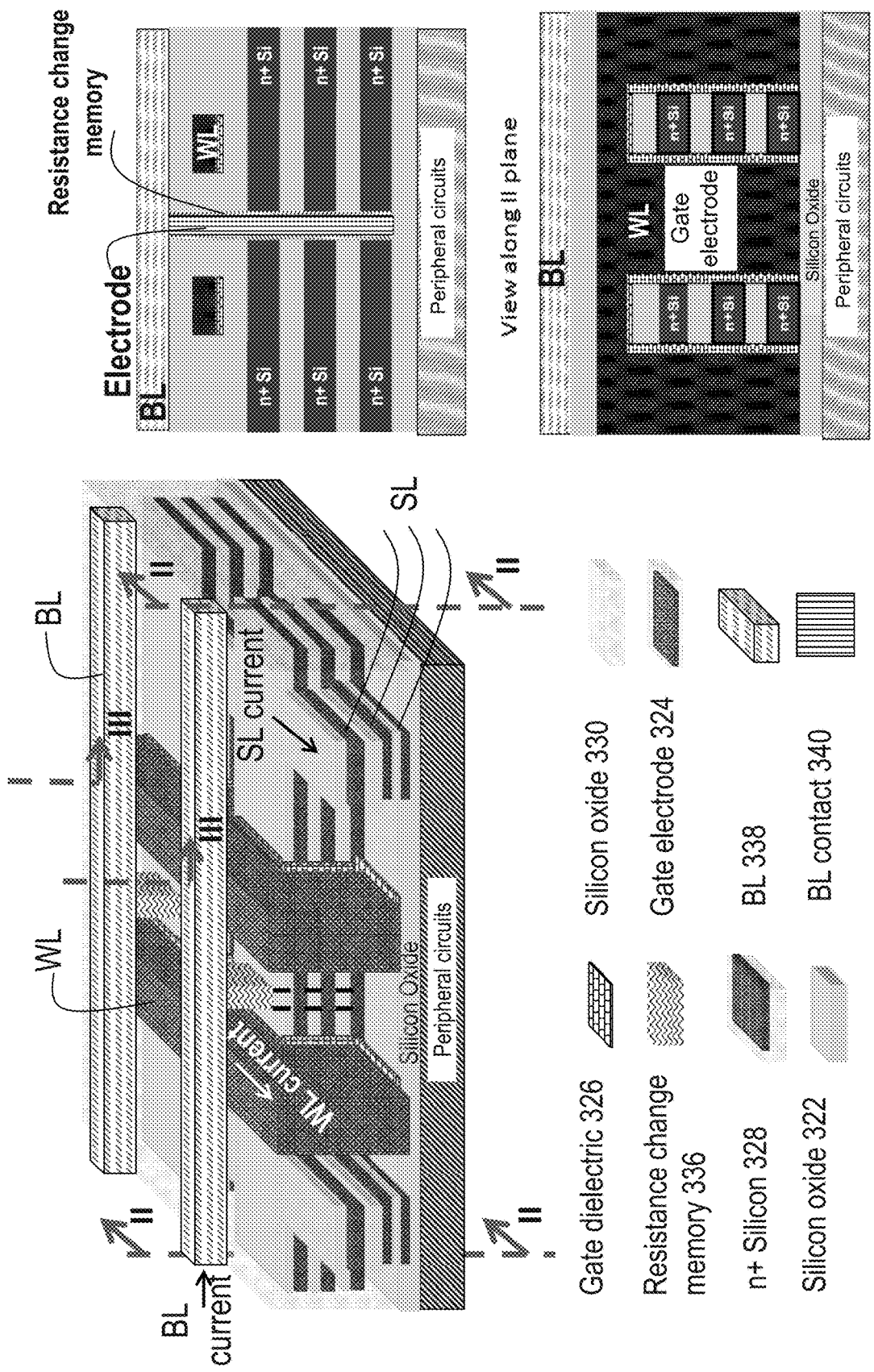

FIG. 3J shows cross-sectional views of the array for clarity.

A 3D resistance change memory has thus been constructed, with (1) horizontally-oriented transistors—i.e. current flowing in substantially the horizontal direction in transistor channels, (2) some of the memory cell control lines, e.g., source-lines SL, constructed of heavily doped silicon and embedded in the memory cell layer, (3) side gates that are simultaneously deposited over multiple memory layers for transistors, and (4) monocrystalline (or single-crystal) silicon layers obtained by layer transfer techniques such as ion-cut.

FIGS. 4A-4K describe an alternative process flow to construct a horizontally-oriented monolithic 3D resistive memory array. This embodiment has a resistance based memory element in series with a transistor selector. No mask is utilized on a "per-memory-layer" basis for the monolithic 3D resistance change memory (or resistive memory) concept shown in FIGS. 4A-4K, and all other masks are shared between different layers. The process flow may include several steps as described in the following sequence.

Figure 4A:
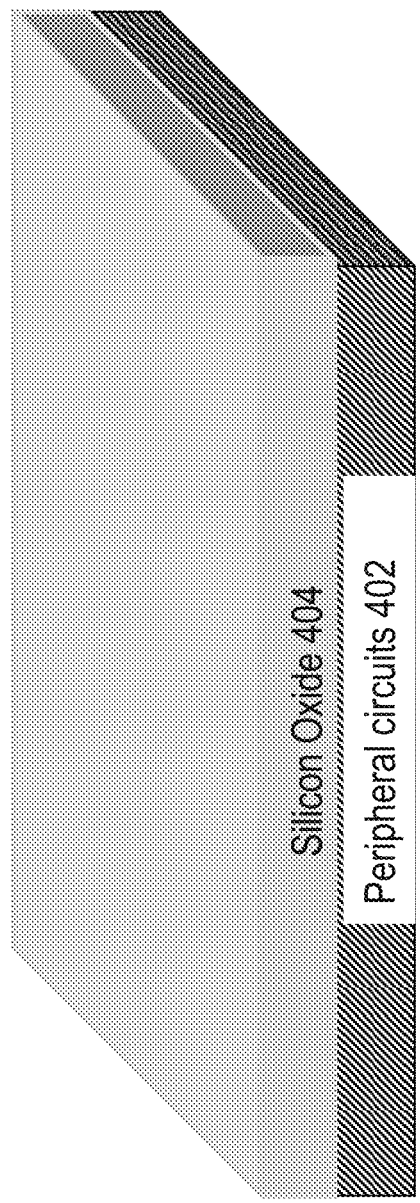

Step (A): Peripheral circuits with tungsten wiring 402 are first constructed and above this a layer of silicon dioxide 404 is deposited. FIG. 4A shows a drawing illustration after Step (A).

Figure 4B:
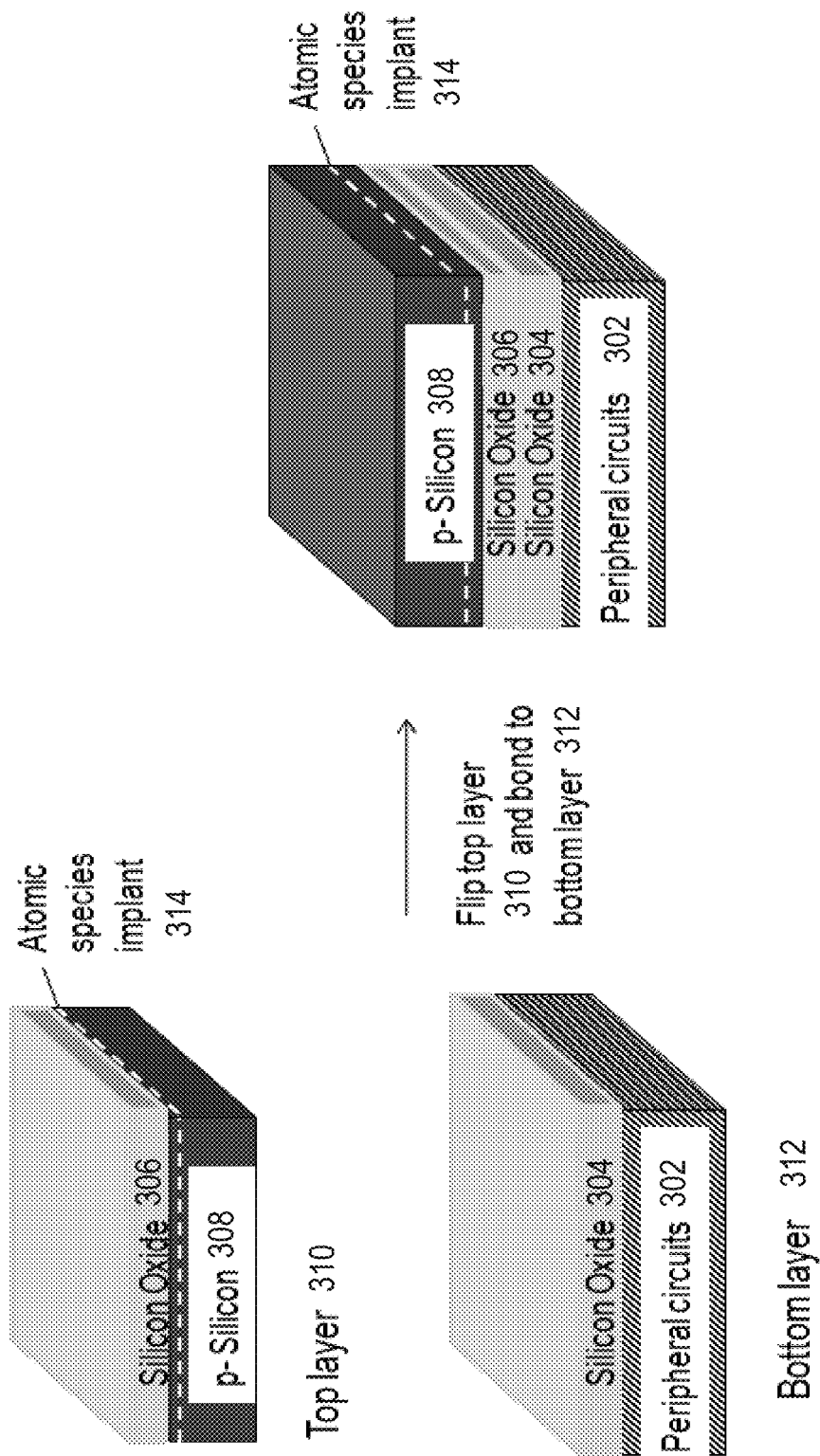

Step (B): FIG. 4B illustrates the structure after Step (B). A wafer of p-Silicon 408 has an oxide layer 406 grown or deposited above it. Following this, hydrogen is implanted into the p-Silicon wafer at a certain depth indicated by 414. Alternatively, some other atomic species such as Helium could be (co-)implanted. This hydrogen implanted p-Silicon wafer 408 forms the top layer 410. The bottom layer 412 may include the peripheral circuits 402 with oxide layer 404. The top layer 410 is flipped and bonded to the bottom layer 412 using oxide-to-oxide bonding.

Figure 4C:
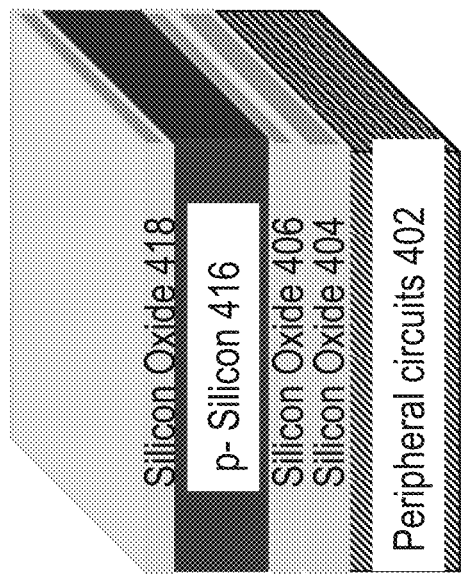

Step (C): FIG. 4C illustrates the structure after Step (C). The stack of top and bottom wafers after Step (B) is cleaved at the hydrogen plane 414 using either a anneal or a sideways mechanical force or other means. A CMP process is then conducted. A layer of silicon oxide 418 is then deposited atop the p-Silicon layer 416. At the end of this step, a single-crystal p-Si layer 416 exists atop the peripheral circuits, and this has been achieved using layer-transfer techniques.

Figure 4D:
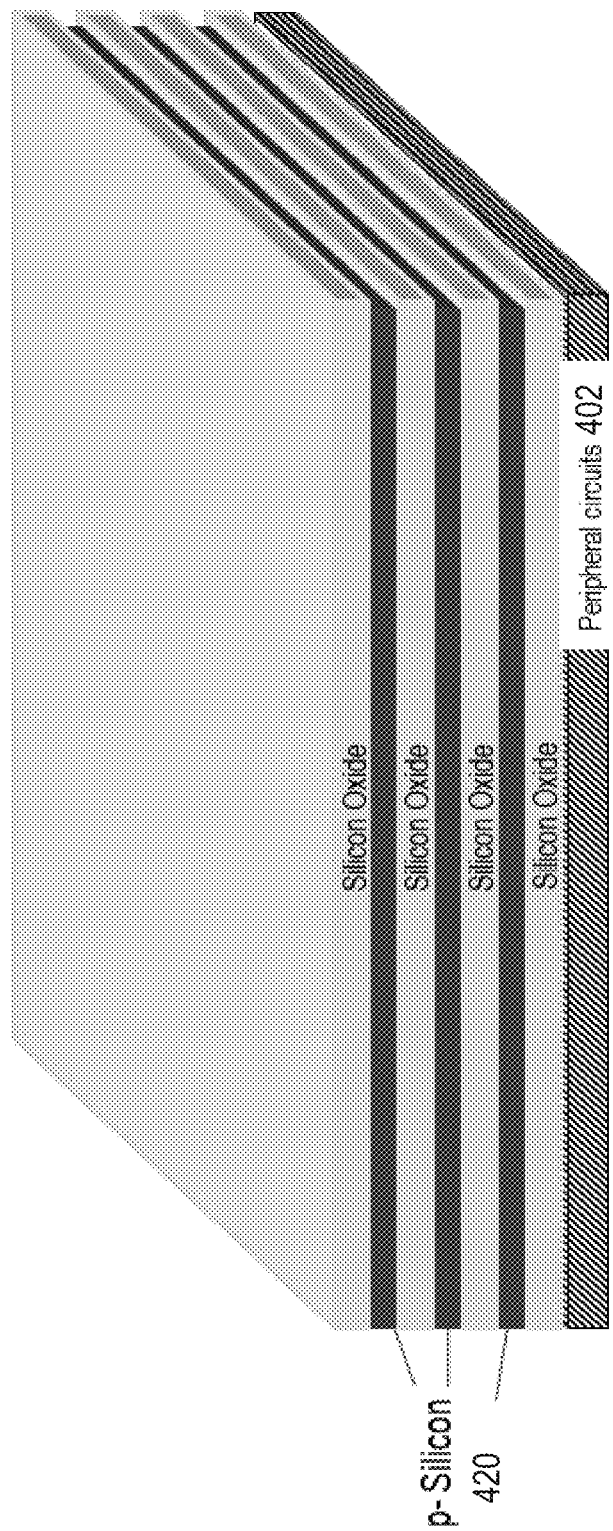

Step (D): FIG. 4D illustrates the structure after Step (D). Using methods similar to Step (B) and (C), multiple p-silicon layers 420 are formed with silicon oxide layers in between.

Figure 4E:
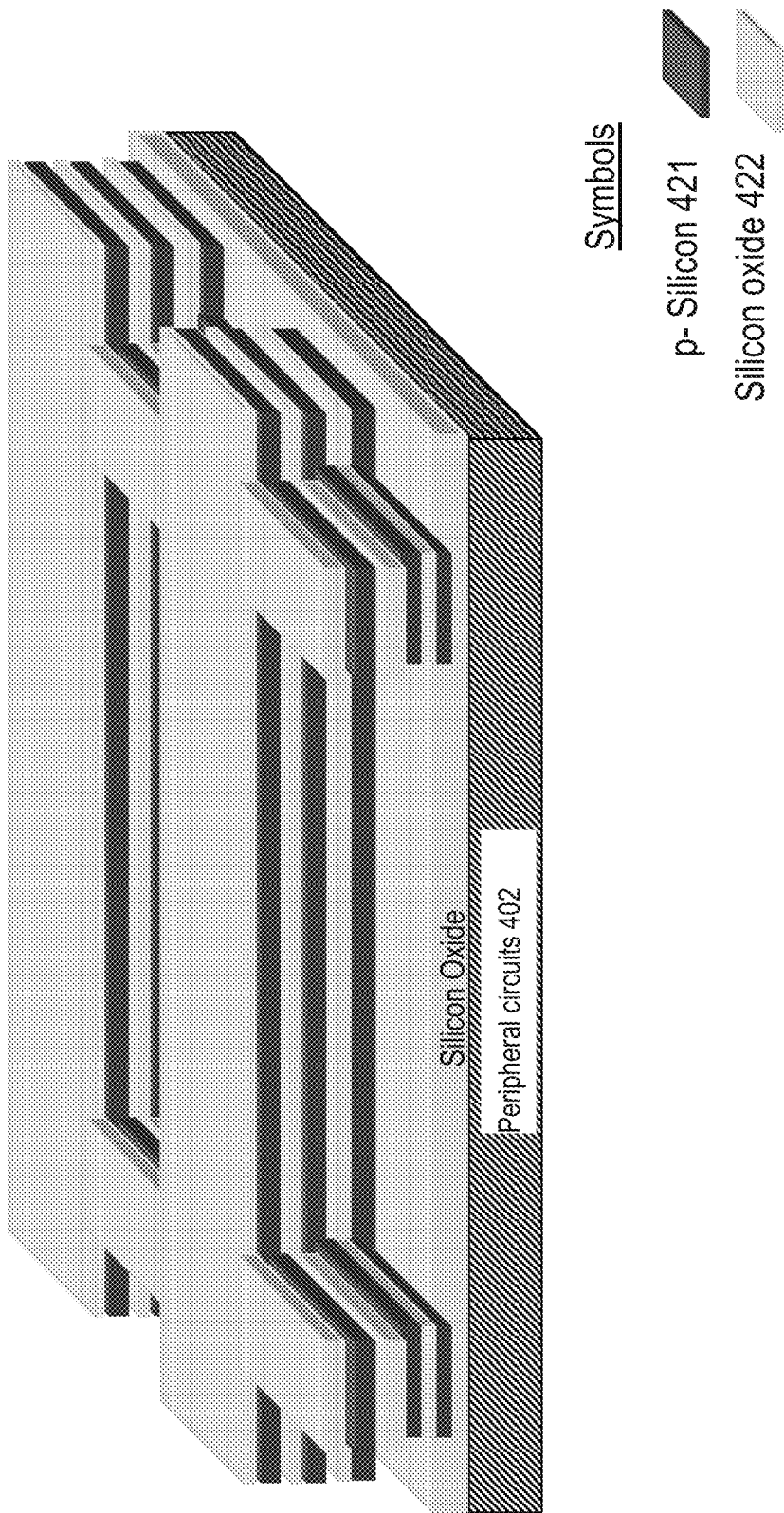

Step (E): FIG. 4E illustrates the structure after Step (E). Lithography and etch processes are then utilized to make a structure as shown in the figure, including layer regions of p-silicon 421 and associated bonding/isolation oxide 422.

Figure 4F:
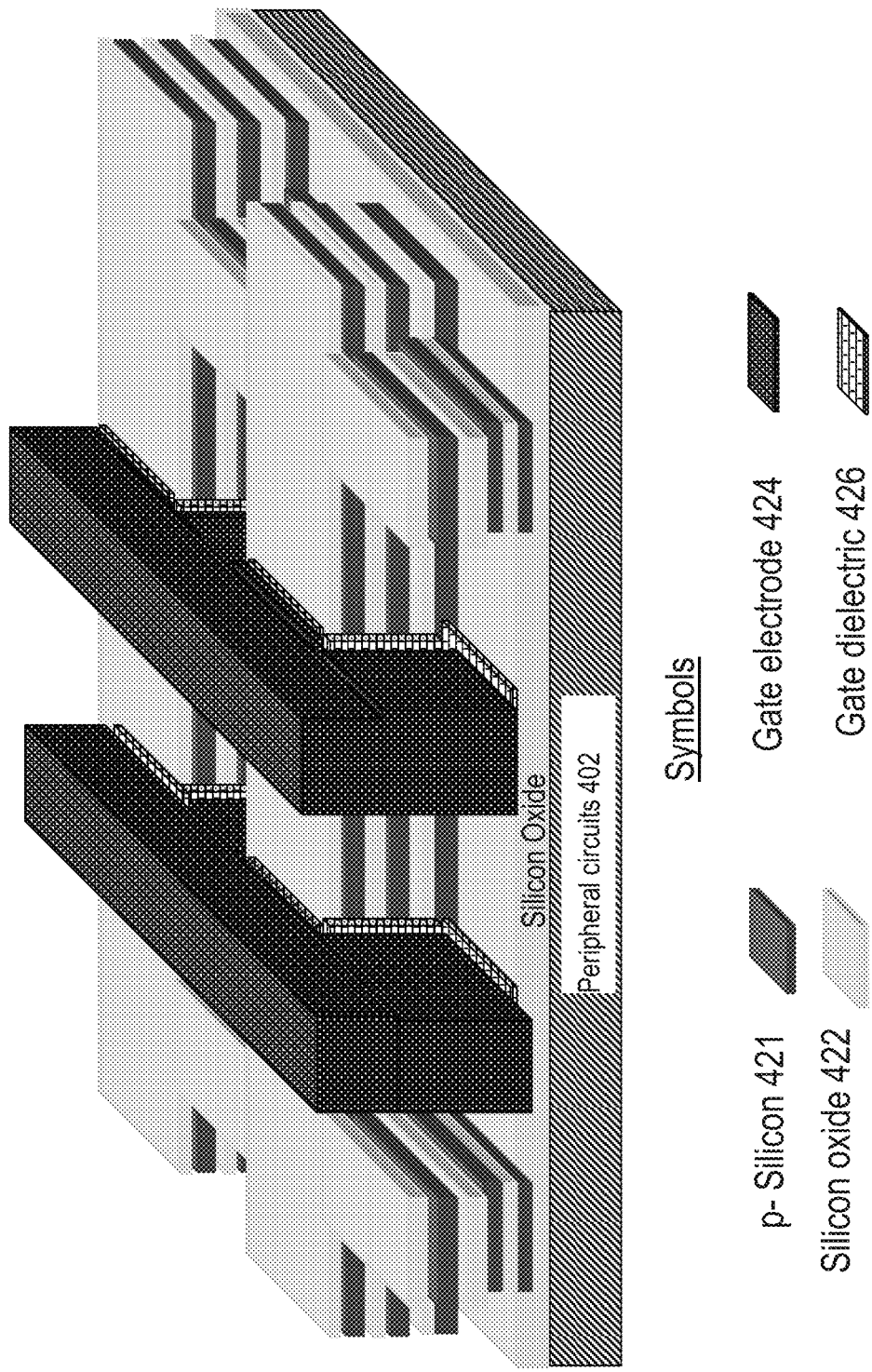

Step (F): FIG. 4F illustrates the structure on after Step (F). Gate dielectric 426 and gate electrode 424 are then deposited following which a CMP is done to planarize the gate electrode 424 regions. Lithography and etch are utilized to define gate regions.

Figure 4G:
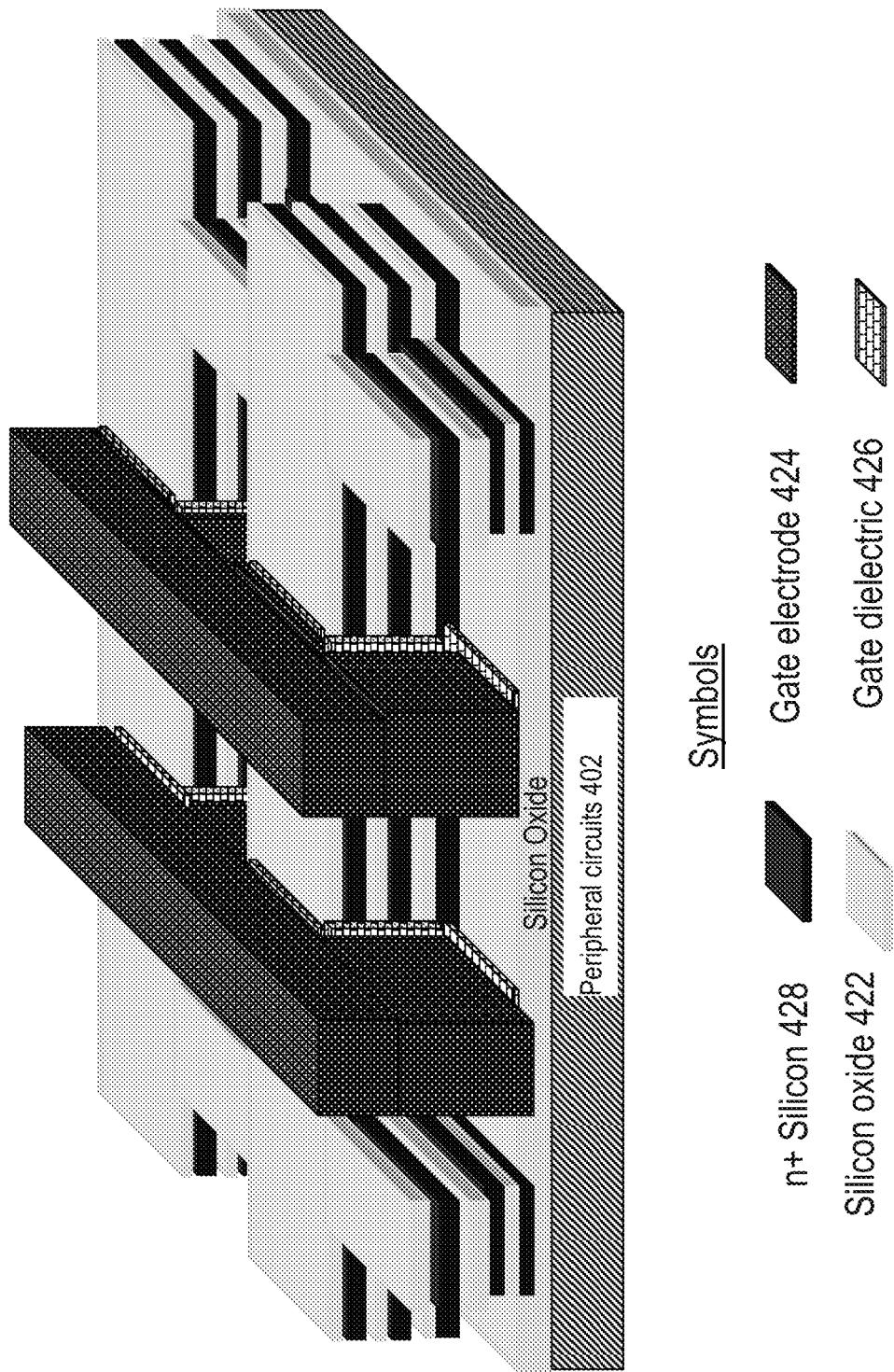

Step (G): FIG. 4G illustrates the structure after Step (G). Using the hard mask defined in Step (F), p-regions not covered by the gate are implanted to form n+ silicon regions 428. Spacers are utilized during this multi-step implantation process and layers of silicon present in different layers of the stack have different spacer widths to account for lateral straggle of buried layer implants. Bottom layers could have larger spacer widths than top layers. A thermal annealing step, such as a RTA or spike anneal or laser anneal or flash anneal, is then conducted to activate n+ doped regions.

Figure 4H:
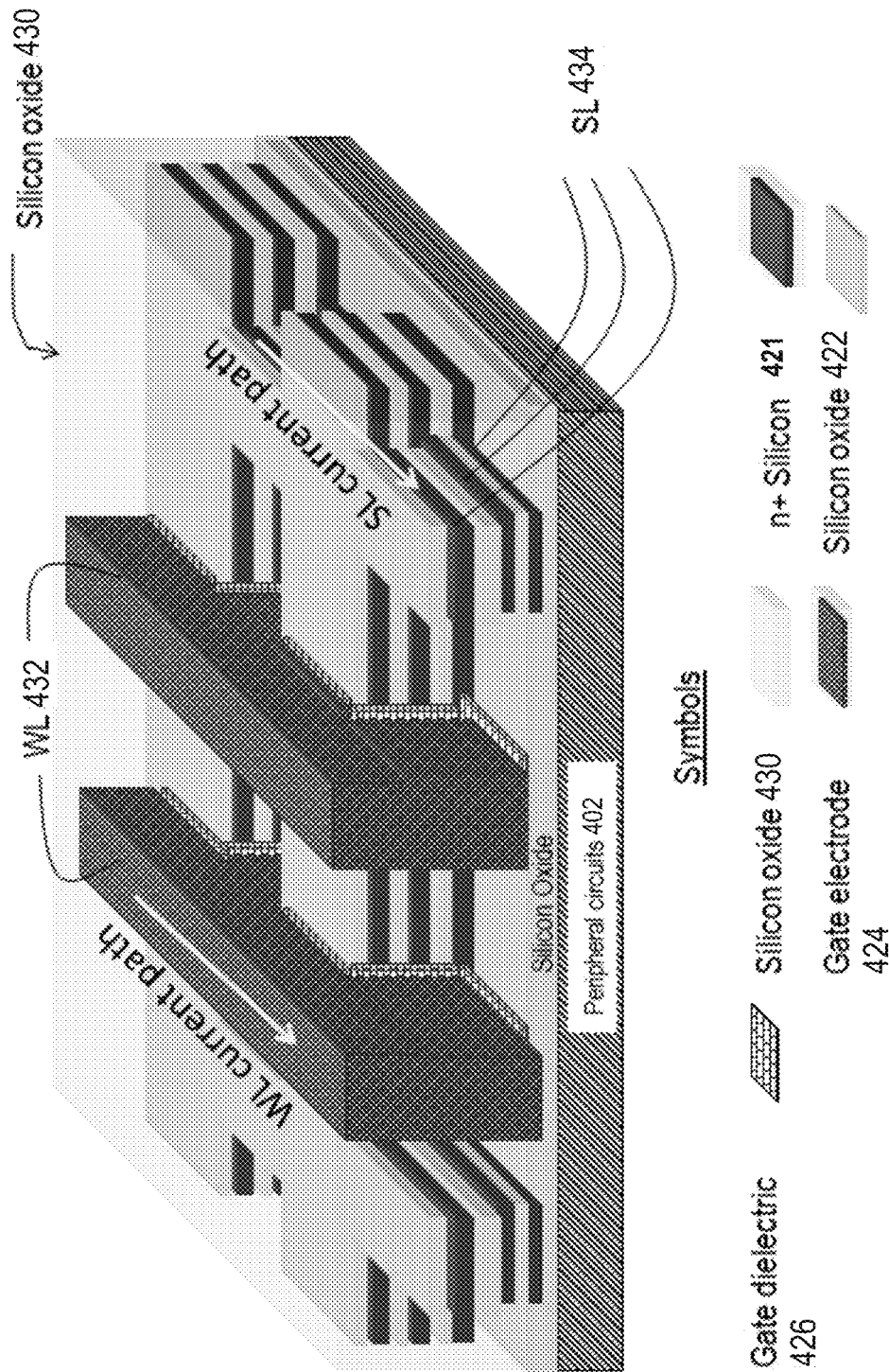
Figure 41:
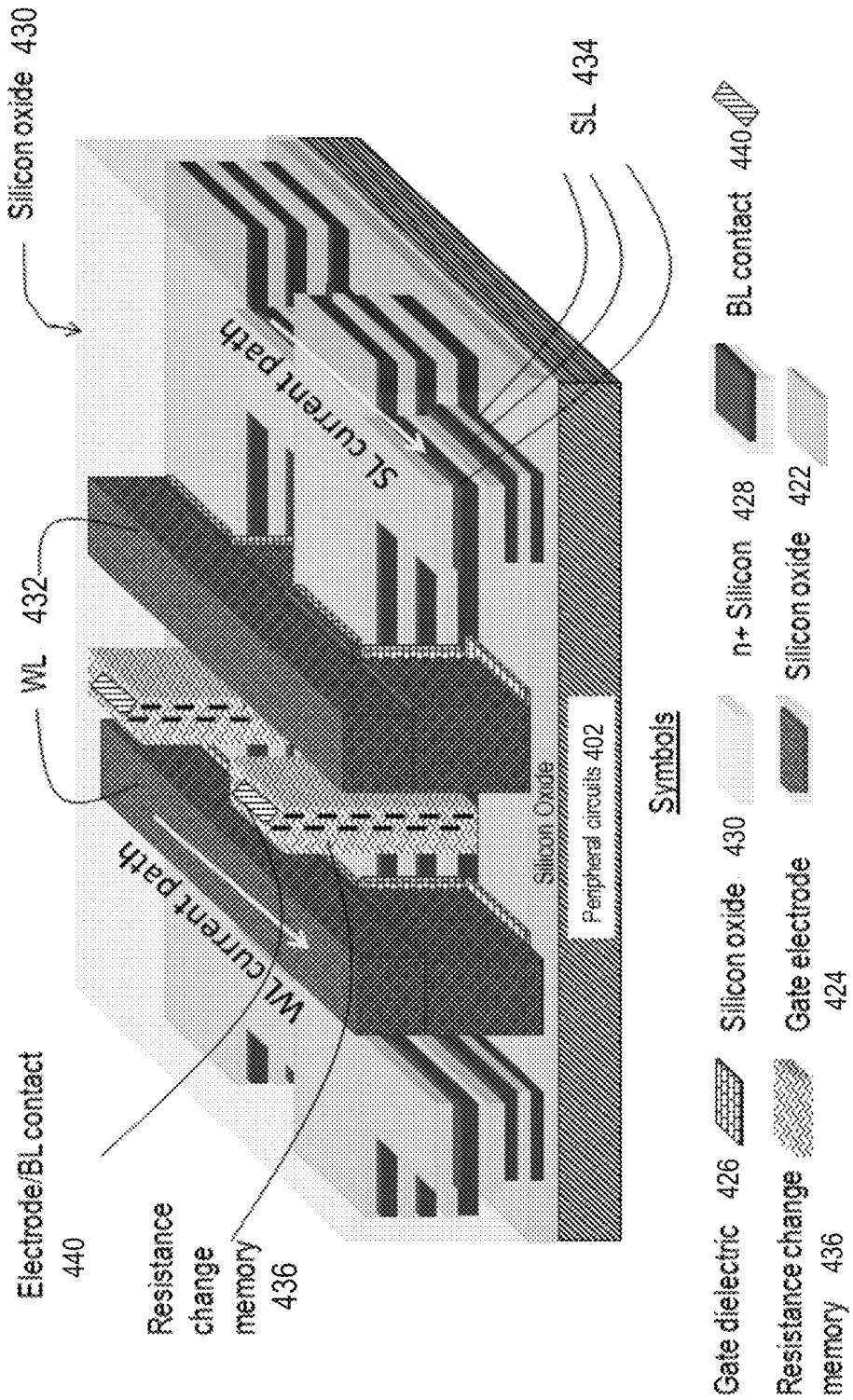

Step (H): FIG. 4H illustrates the structure after Step (H). A silicon oxide layer 430 is then deposited and planarized. The silicon oxide layer is shown transparent in the figure for clarity, along with word-line (WL) 432 and source-line (SL) 434 regions.

Step (I): FIG. 4I illustrates the structure after Step (I). Vias are etched through multiple layers of silicon and silicon dioxide as shown in the figure. A resistance change memory material 436 is then deposited (preferably with atomic layer deposition (ALD)). Examples of such a material include hafnium oxide, which is well known to change resistance by applying voltage. An electrode for the resistance change memory element is then deposited (preferably using ALD) and is shown as electrode/BL contact 440. A CMP process is then conducted to planarize the surface. It can be observed that multiple resistance change memory elements in series with transistors are created after this step.

Figure 4J:
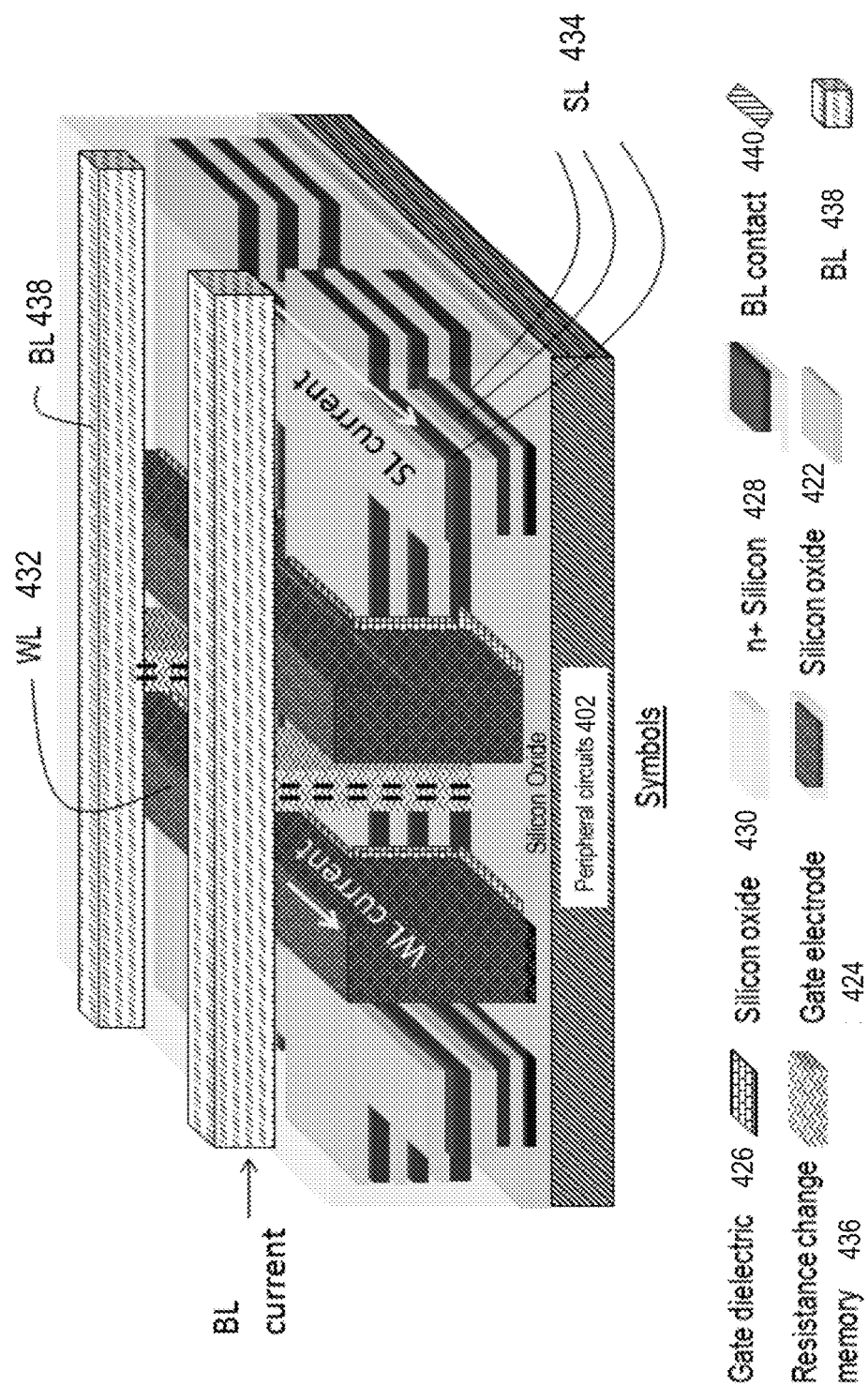

Step (J): FIG. 4J illustrates the structure after Step (J). BLs 438 are then constructed. Contacts are made to BLs, WLs and SLs of the memory array at its edges. SL contacts can be made into stair-like structures using techniques described in "Bit Cost Scalable Technology with Punch and Plug Process for Ultra High Density Flash Memory," *VLSI Technology*, 2007 *IEEE Symposium on*, vol., no., pp. 14-15, 12-14 Jun. 2007 by Tanaka, H; Kido, M.; Yahashi, K; Oomura, M.; et al., following which contacts can be constructed to them. Formation of stair-like structures for SLs could be done in steps prior to Step (I) as well.

Figure 4K:
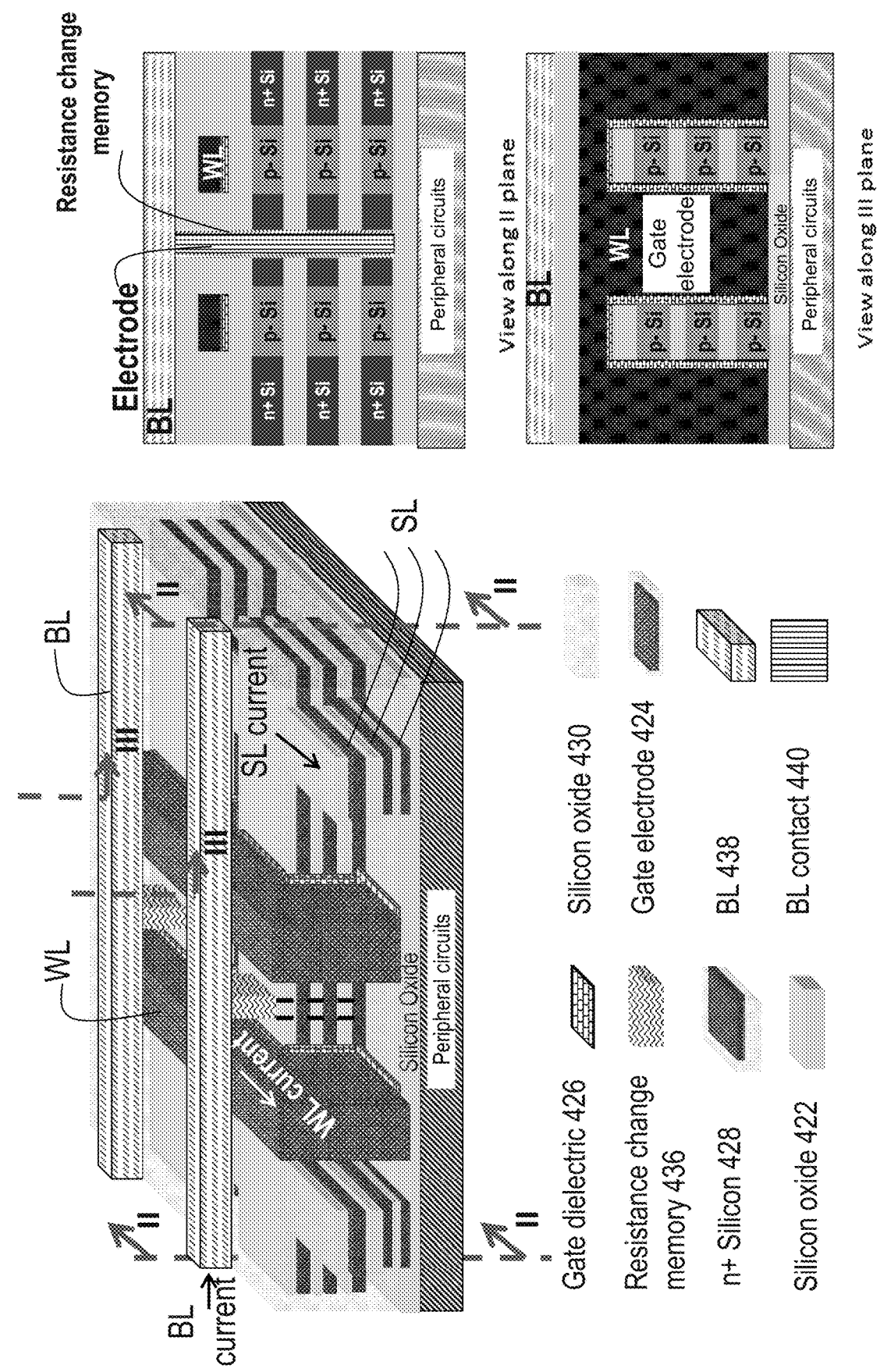

FIG. 4K shows cross-sectional views of the array for clarity.

A 3D resistance change memory has thus been constructed, with (1) horizontally-oriented transistors—i.e. current flowing in substantially the horizontal direction in transistor channels, (2) some of the memory cell control lines—e.g., source-lines SL, constructed of heavily doped silicon and embedded in the memory cell layer, (3) side gates simultaneously deposited over multiple memory layers for transistors, and (4) monocrystalline (or single-crystal) silicon layers obtained by layer transfer techniques such as ion-cut.

While explanations have been given for formation of monolithic 3D resistive memories with ion-cut in this section, it is clear to one skilled in the art that alternative implementations are possible. BL and SL nomenclature has been used for two terminals of the 3D resistive memory array, and this nomenclature can be interchanged. Moreover, selective epi technology or laser recrystallization technology could be utilized for implementing structures shown in FIG. 3A-3J and FIG. 4A-4K. Various other types of layer transfer schemes that have been described in Section 1.3.4 of the parent application can be utilized for construction of various 3D resistive memory structures. One could also use buried wiring, i.e. where wiring for memory arrays is below the memory layers but above the periphery. Other variations of the monolithic 3D resistive memory concepts are possible.

While resistive memories described previously form a class of non-volatile memory, others classes of non-volatile memory exist. NAND flash memory forms one of the most common non-volatile memory types. It can be constructed of two main types of devices: floating-gate devices where charge is stored in a floating gate and charge-trap devices where charge is stored in a charge-trap layer such as Silicon Nitride. Background information on charge-trap memory can be found in "*Integrated Interconnect Technologies for 3D Nanoelectronic Systems*", Artech House, 2009 by Bakir and Meindl ("Bakir") and "A Highly Scalable 8-Layer 3D Vertical-Gate (VG) TFT NAND Flash Using Junction-Free Buried Channel BE-SONOS Device," Symposium on VLSI Technology, 2010 by Hang-Ting Lue, et al. The architectures shown in FIG. 5A-5G are relevant for any type of charge-trap memory.

FIGS. 5A-5G describes a memory architecture for single-crystal 3D charge-trap memories, and a procedure for its construction. It utilizes junction-less transistors. No mask is utilized on a "per-memory-layer" basis for the monolithic 3D charge-trap memory concept shown in FIGS. 5A-5G, and all other masks are shared between different layers. The process flow may include several steps as described in the following sequence.

Figure 5A:
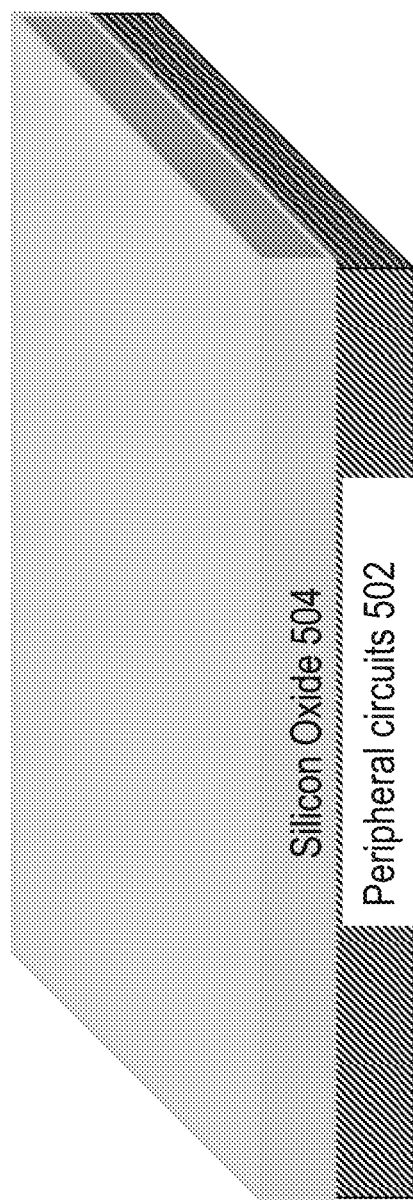
FIGS. 5A-5G show a zero-mask per layer 3D charge-trap memory.

Step (A): Peripheral circuits 502 are first constructed and above this a layer of silicon dioxide 504 is deposited. FIG. 5A shows a drawing illustration after Step (A).

Figure 5B:
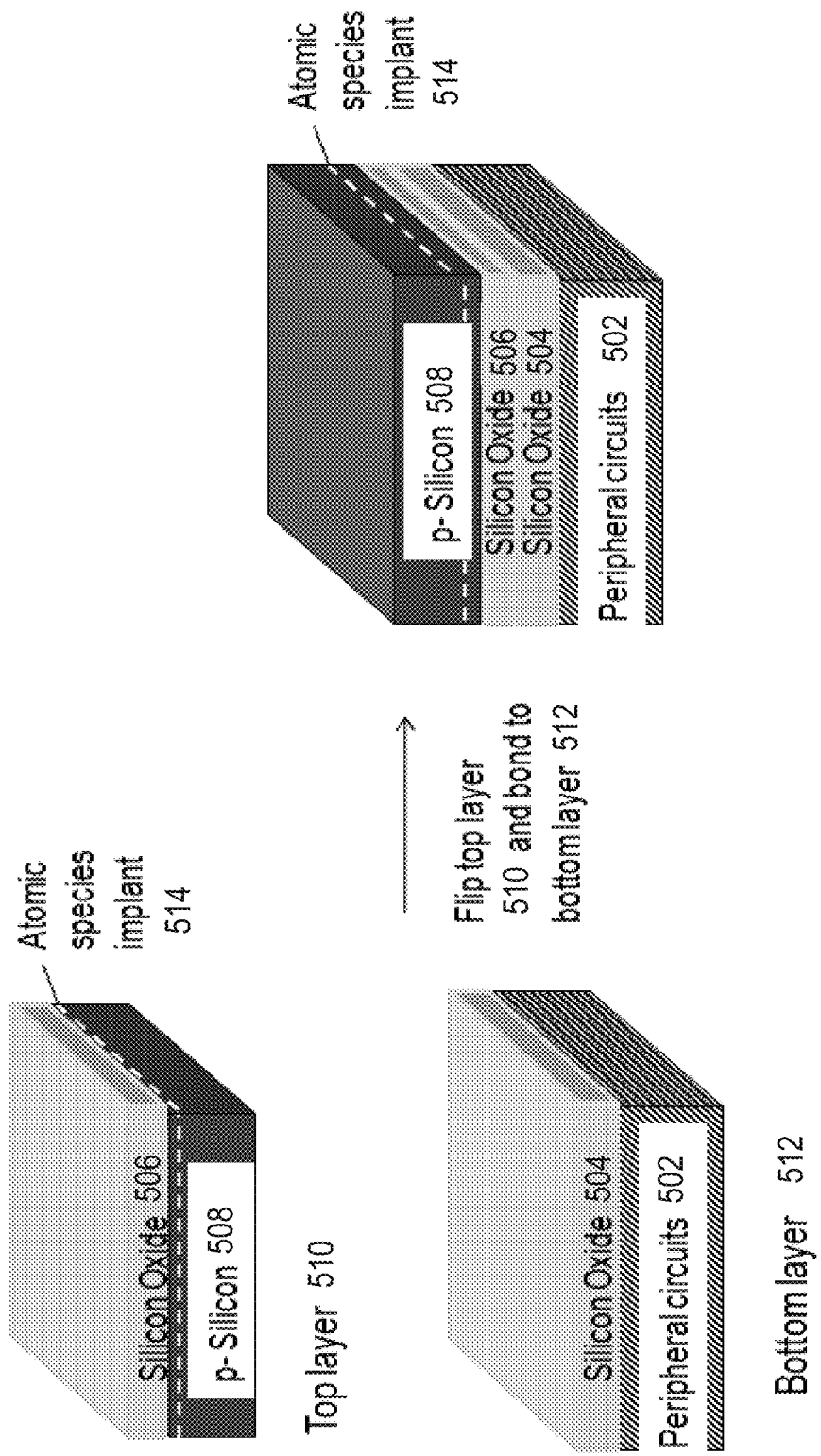

Step (B): FIG. 5B illustrates the structure after Step (B). A wafer of n+ Silicon 508 has an oxide layer 506 grown or deposited above it. Following this, hydrogen is implanted into the n+ Silicon wafer at a certain depth indicated by 514. Alternatively, some other atomic species such as Helium could be implanted. This hydrogen implanted n+ Silicon wafer 508 forms the top layer 510. The bottom layer 512 may include the peripheral circuits 502 with oxide layer 504. The top layer 510 is flipped and bonded to the bottom layer 512 using oxide-to-oxide bonding.

Figure 5C:
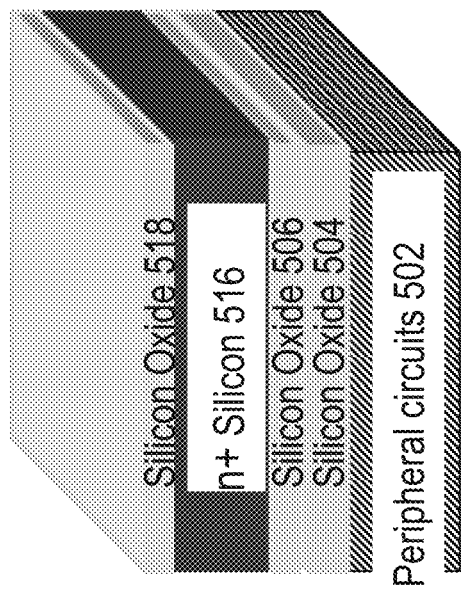

Step (C): FIG. 5C illustrates the structure after Step (C). The stack of top and bottom wafers after Step (B) is cleaved at the hydrogen plane 514 using either a anneal or a sideways mechanical force or other means. A CMP process is then conducted. A layer of silicon oxide 518 is then deposited atop the n+ Silicon layer 516. At the end of this step, a single-crystal n+Si layer 516 exists atop the peripheral circuits, and this has been achieved using layer-transfer techniques.

Figure 5D:
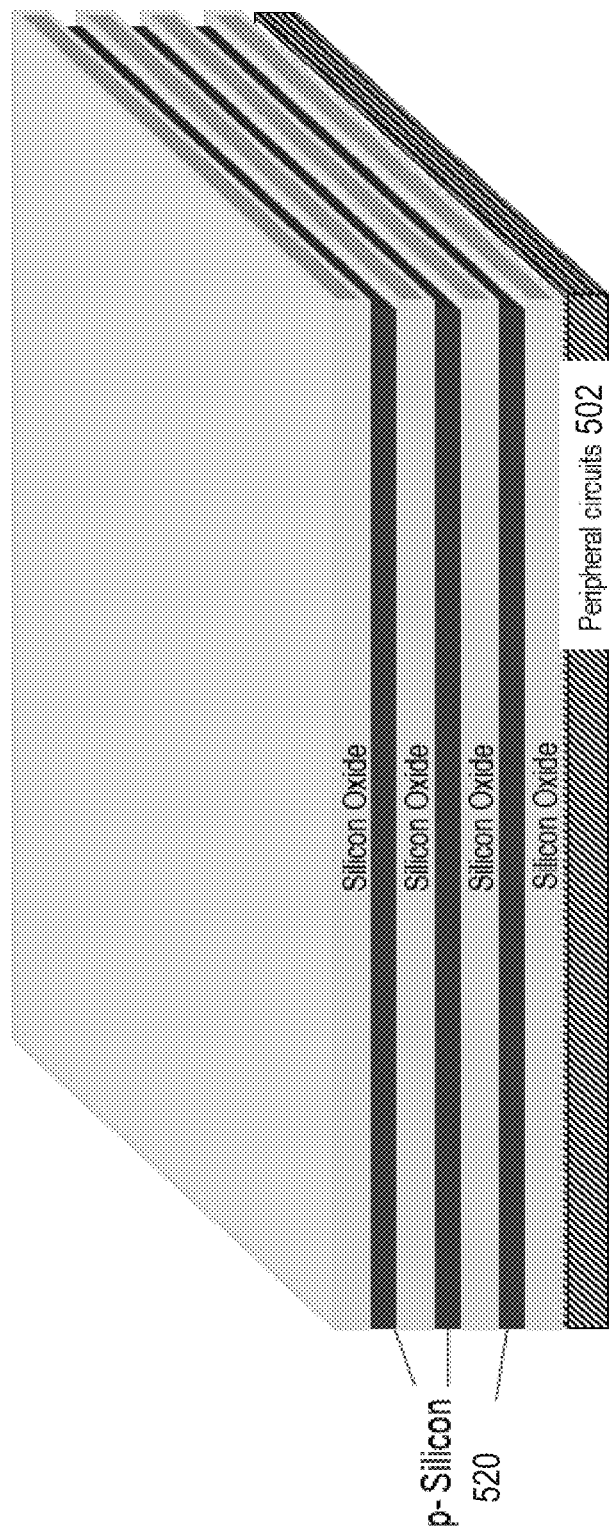

Step (D): FIG. 5D illustrates the structure after Step (D). Using methods similar to Step (B) and (C), multiple n+ silicon layers 520 are formed with silicon oxide layers in between.

Figure 5E:
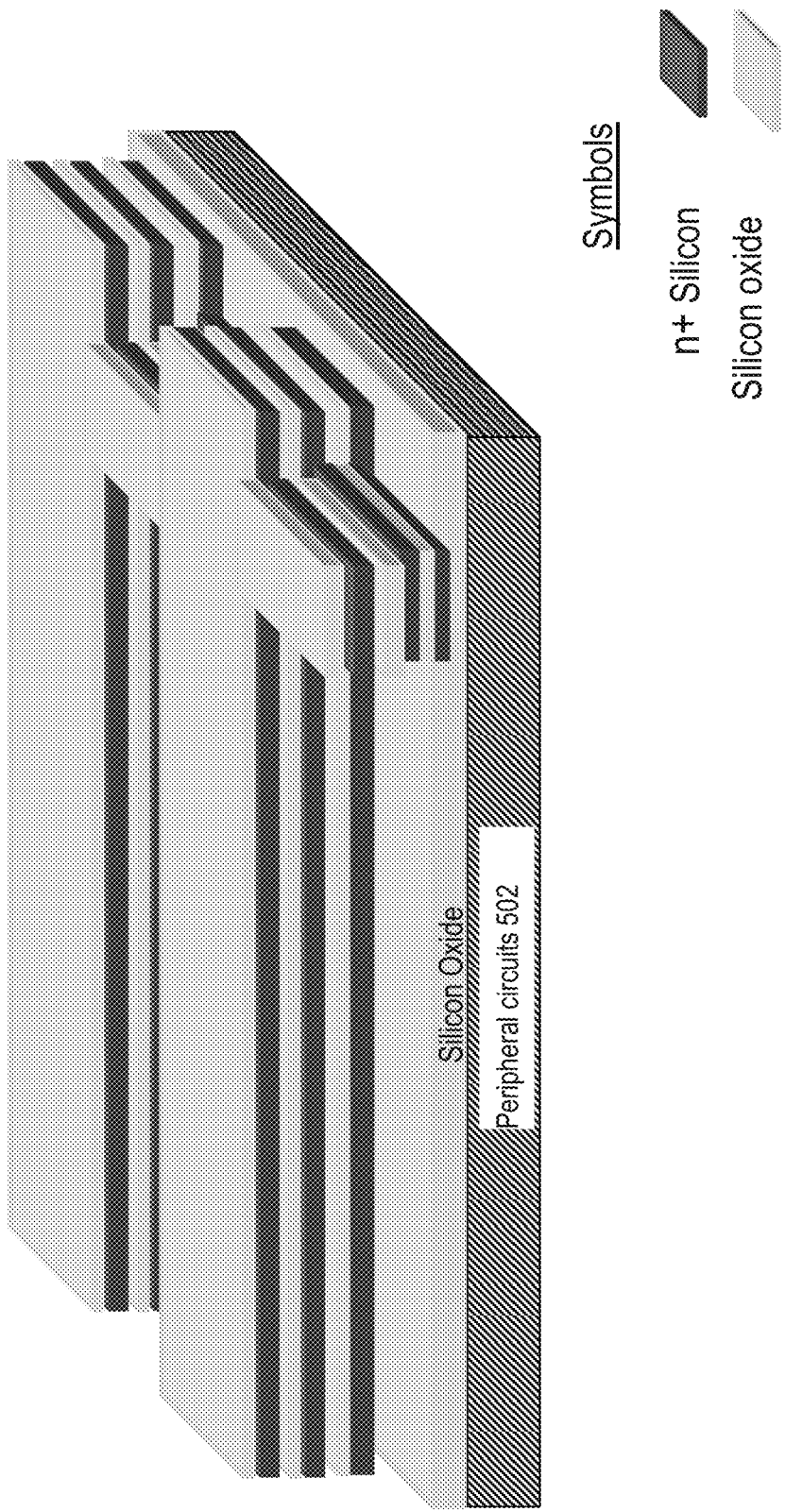

Step (E): FIG. 5E illustrates the structure after Step (E). Lithography and etch processes are then utilized to make a structure as shown in the figure.

Figure 5F:
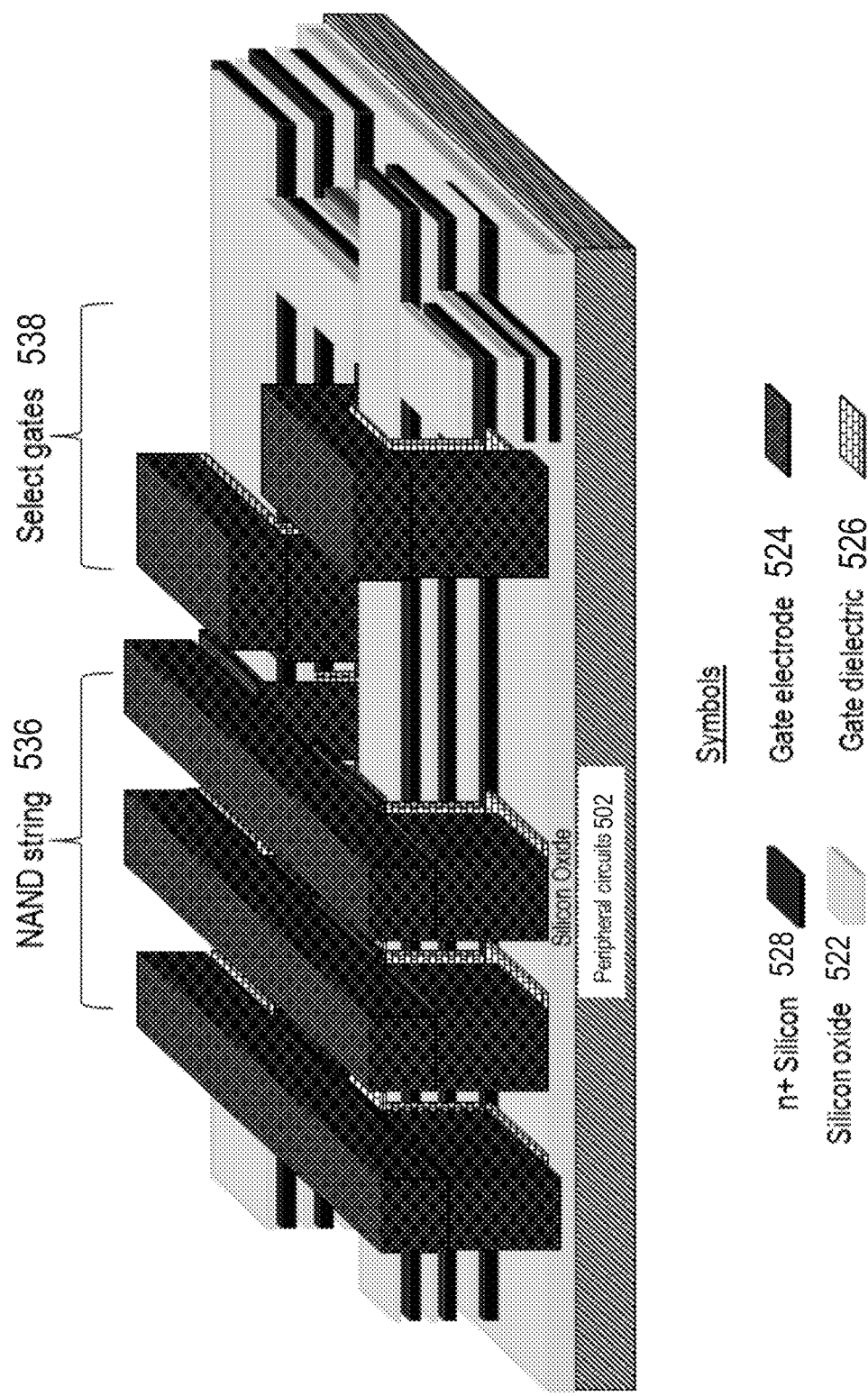

Step (F): FIG. 5F illustrates the structure after Step (F). Gate dielectric 526 and gate electrode 524 are then deposited following which a CMP is done to planarize the gate electrode 524 regions. Lithography and etch are utilized to define gate regions. Gates of the NAND string 536 as well gates of select gates of the NAND string 538 are defined.

Figure 5G:
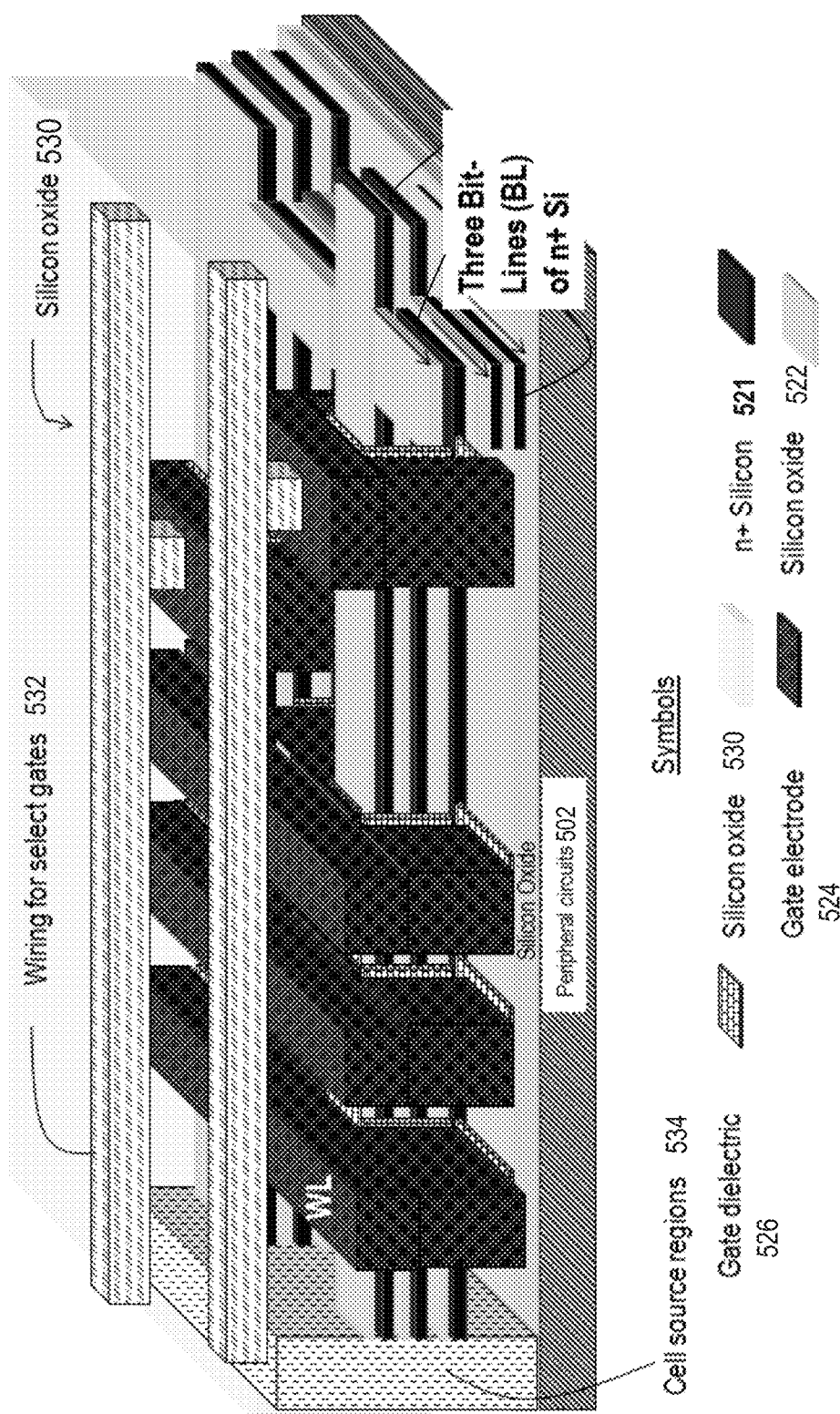

Step (G): FIG. 5G illustrates the structure after Step (G). A silicon oxide layer 530 is then deposited and planarized. It is shown transparent in the figure for clarity. Word-lines, bit-lines and source-lines are defined as shown in the figure. Contacts are formed to various regions/wires at the edges of the array as well. SL contacts can be made into stair-like structures using techniques described in "Bit Cost Scalable Technology with Punch and Plug Process for Ultra High Density Flash Memory," *VLSI Technology*, 2007 *IEEE Symposium on*, vol., no., pp. 14-15, 12-14 Jun. 2007 by Tanaka, H.; Kido, M.; Yahashi, K; Oomura, M.; et al., following which contacts can be constructed to them. Formation of stair-like structures for SLs could be performed in steps prior to Step (G) as well.

A 3D charge-trap memory has thus been constructed, with (1) horizontally-oriented transistors—i.e. current flowing in substantially the horizontal direction in transistor channels, (2) some of the memory cell control lines—e.g., bit lines BL, constructed of heavily doped silicon and embedded in the memory cell layer, (3) side gates simultaneously deposited over multiple memory layers for transistors, and (4) monocrystalline (or single-crystal) silicon layers obtained by layer transfer techniques such as ion-cut. This use of single-crystal silicon obtained with ion-cut is a key differentiator from past work on 3D charge-trap memories such as "A Highly Scalable 8-Layer 3D Vertical-Gate (VG) TFT NAND Flash Using Junction-Free Buried Channel BE-SONOS Device," Symposium on *VLSI Technology*, 2010 by Hang-Ting Lue, et al. that used polysilicon.

While FIGS. 5A-5G give two examples of how single-crystal silicon layers with ion-cut can be used to produce 3D charge-trap memories, the ion-cut technique for 3D charge-trap memory is fairly general. It could be utilized to produce any horizontally-oriented 3D monocrystalline-silicon charge-trap memory.

While the 3D DRAM and 3D resistive memory implementations in Section 3 and Section 4 have been described with single crystal silicon constructed with ion-cut technology, other options exist. One could construct them with selective epi technology. Procedures for doing these will be clear to those skilled in the art.

FIGS. 6A-6B show it is not the only option for the architecture to have the peripheral transistors, such as periphery 602, below the memory layers, including, for example, memory layer 604, memory layer 606, and/or memory layer 608. Peripheral transistors, such as periphery 610, could also be constructed above the memory layers, including, for example, memory layer 604, memory layer 606, and/or memory layer 608, and substrate or memory layer 612, as shown in FIG. 6B. This periphery layer would utilize technologies described in this application; parent application and incorporated references, and could utilize transistors, for example, junction-less transistors or recessed channel transistors.

The monolithic 3D integration concepts described in this patent application can lead to novel embodiments of polysilicon-based memory architectures as well. Poly silicon based architectures could potentially be cheaper than single crystal silicon based architectures when a large number of memory layers need to be constructed. While the below concepts are explained by using resistive memory architectures as an example, it will be clear to one skilled in the art that similar concepts can be applied to NAND flash memory and DRAM architectures described previously in this patent application.

Figure 7A:
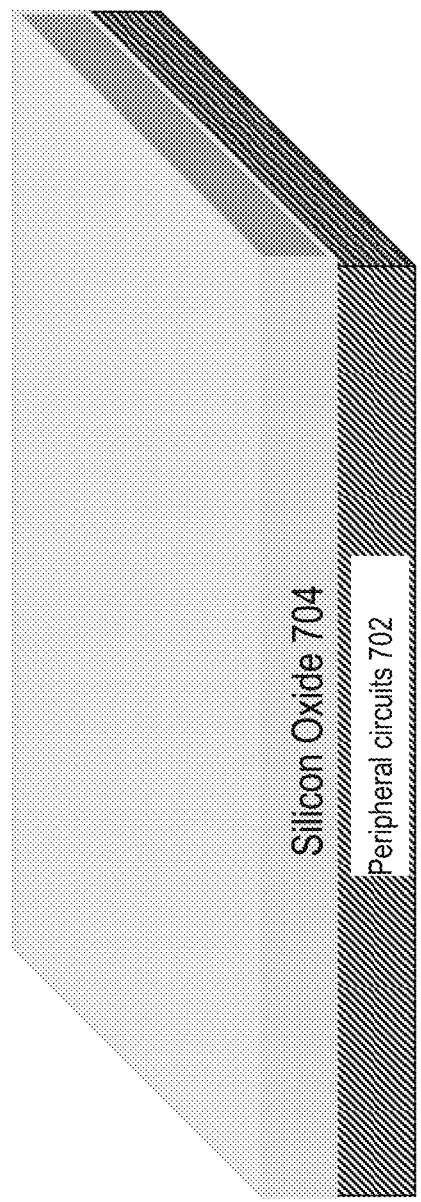
FIGS. 7A-7E show polysilicon select devices for 3D memory and peripheral circuits at the bottom according to some embodiments of the current invention.

FIGS. 7A-7E show one embodiment of the current invention, where polysilicon junction-less transistors are used to form a 3D resistance-based memory. The utilized junction-less transistors can have either positive or negative threshold voltages. The process may include the following steps as described in the following sequence:

Step (A): As illustrated in FIG. 7A, peripheral circuits 702 are constructed above which a layer of silicon dioxide 704 is made.

Figure 7B:
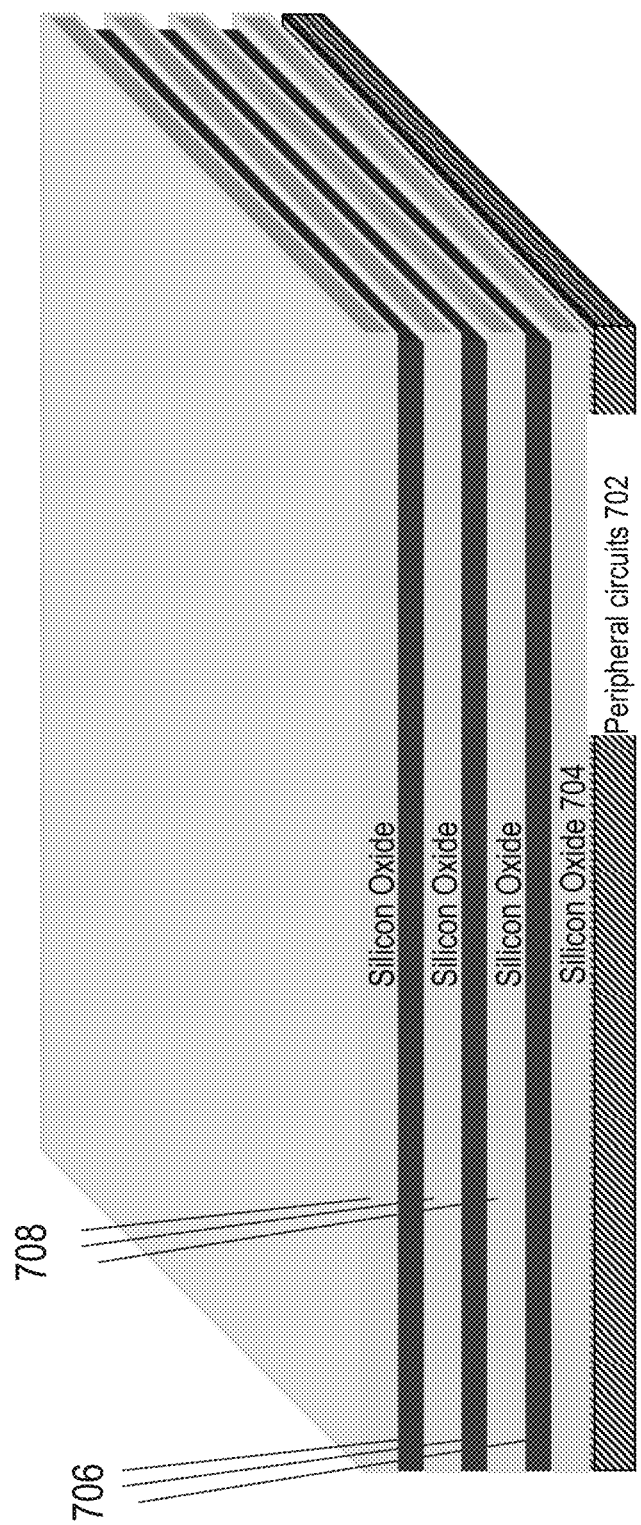

Step (B): As illustrated in FIG. 7B, multiple layers of n+ doped amorphous silicon or polysilicon 706 are deposited with layers of silicon dioxide 708 in between. The amorphous silicon or polysilicon layers 706 could be deposited using a chemical vapor deposition process, such as LPCVD or PECVD.

Figure 7C:
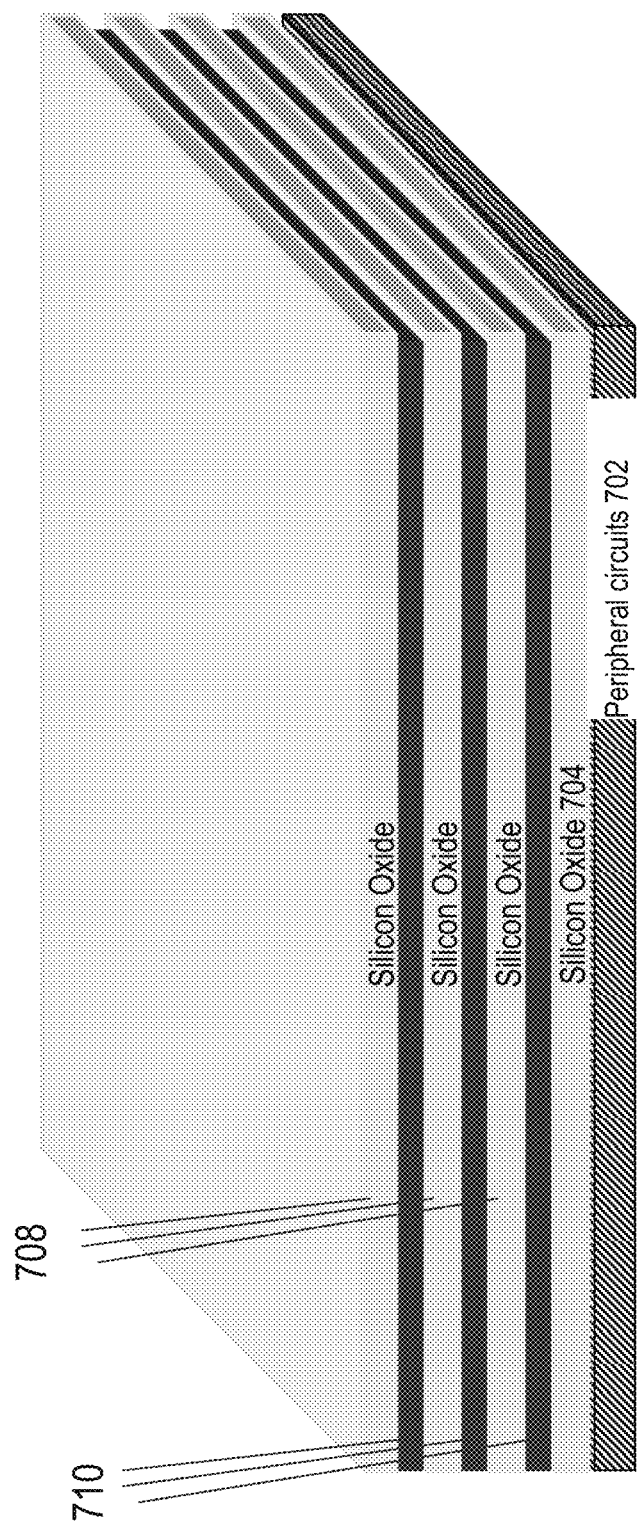

Step (C): As illustrated in FIG. 7C, a Rapid Thermal Anneal (RTA) is conducted to crystallize the layers of polysilicon or amorphous silicon deposited in Step (B). Temperatures during this RTA could be as high as 700° C. or more, and could even be as high as 800° C. The polysilicon region obtained after Step (C) is indicated as 710. Alternatively, a laser anneal could be conducted, either for all layers 706 at the same time or layer by layer. The thickness of the oxide 704 would need to be optimized if that process were conducted.

Figure 7D:
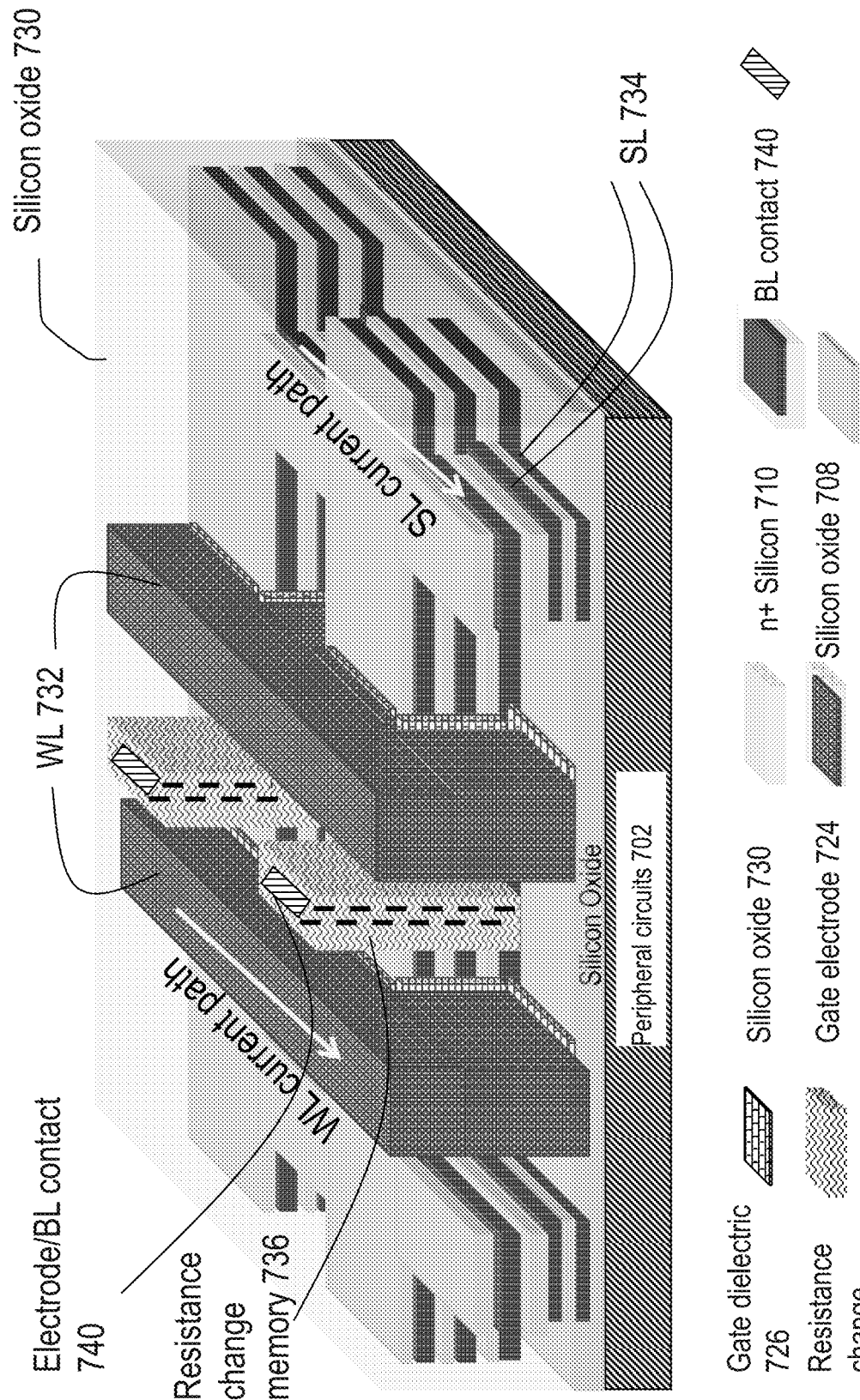

Step (D): As illustrated in FIG. 7D, procedures similar to those described in FIGS. 3E-3H are utilized to construct the structure shown. The structure in FIG. 7D has multiple levels of junction-less transistor selectors for resistive memory devices. The resistance change memory is indicated as 736 while its electrode and contact to the BL is indicated as 740. The WL is indicated as 732, while the SL is indicated as 734. Gate dielectric of the junction-less transistor is indicated as 726 while the gate electrode of the junction-less transistor is indicated as 724, this gate electrode also serves as part of the WL 732. Silicon oxide is indicated as 730.

Figure 7E:
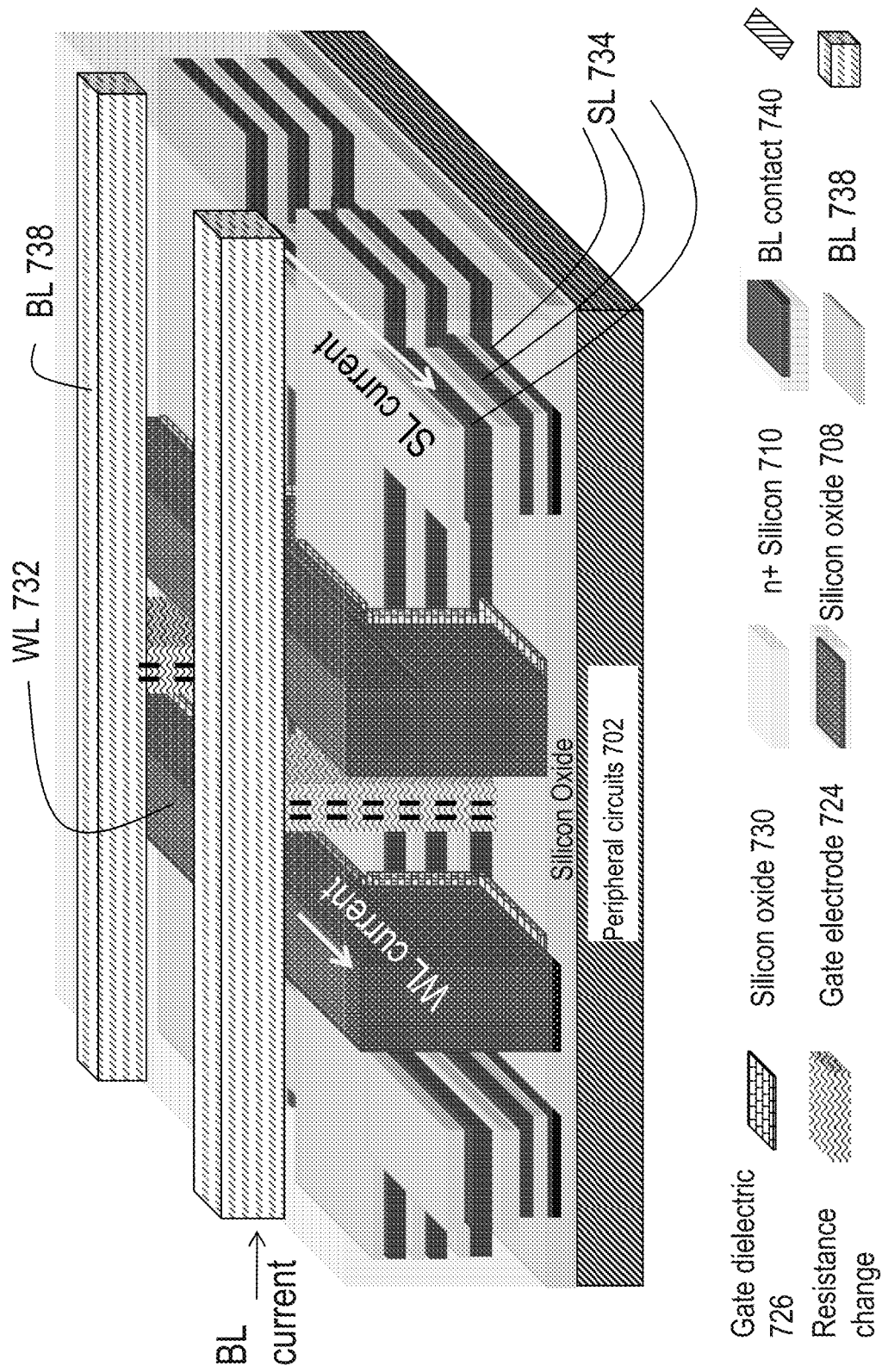

Step (E): As illustrated in FIG. 7E, bit lines (indicated as BL 738) are constructed. Contacts are then made to peripheral circuits and various parts of the memory array as described in embodiments described previously.

Figure 8A:
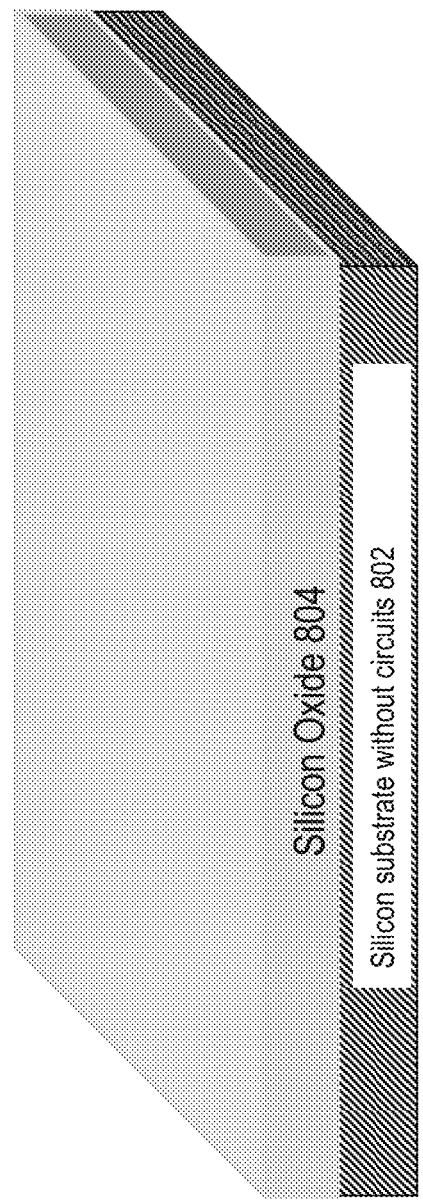
FIGS. 8A-8F show polysilicon select devices for 3D memory and peripheral circuits at the top according to some embodiments of the current invention.

FIG. 8A-F show another embodiment of the current invention, where polysilicon junction-less transistors are used to form a 3D resistance-based memory. The utilized junction-less transistors can have either positive or negative threshold voltages. The process may include the following steps occurring in sequence:

Step (A): As illustrated in FIG. 8A, a layer of silicon dioxide 804 is deposited or grown above a silicon substrate without circuits 802.

Figure 8B:
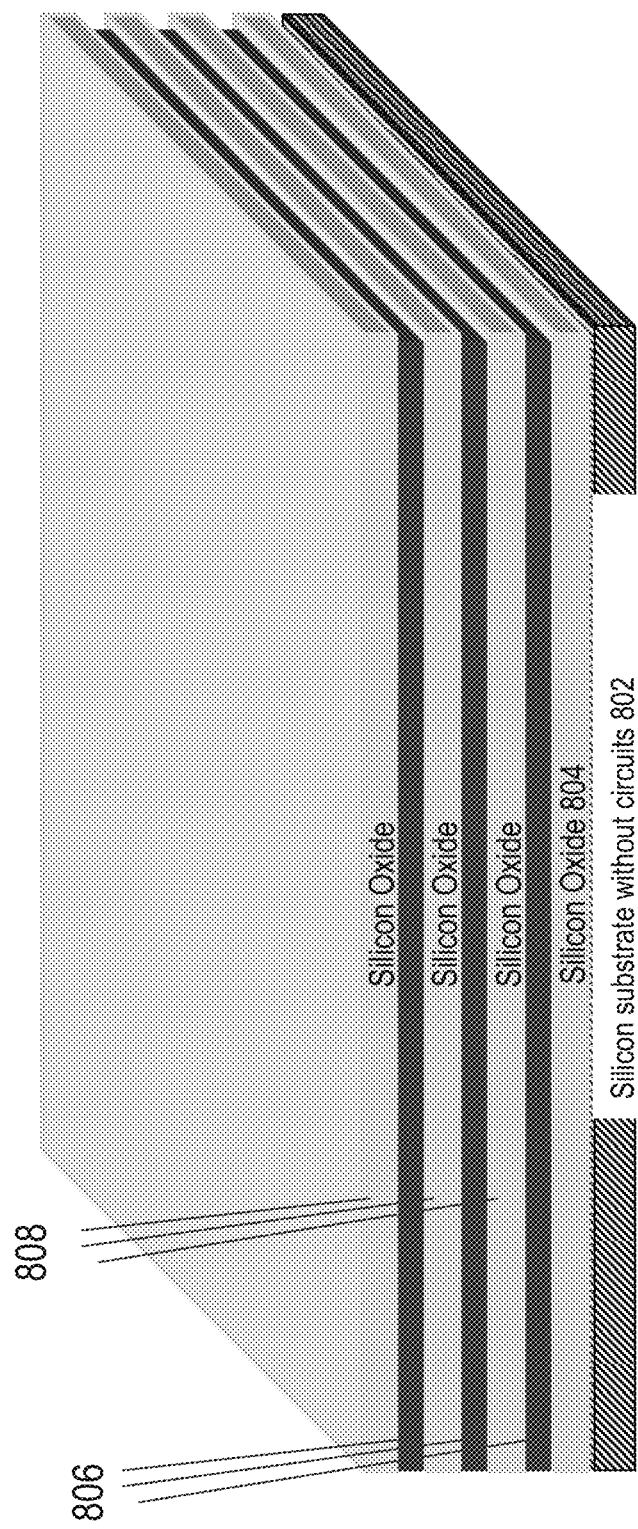

Step (B): As illustrated in FIG. 8B, multiple layers of n+ doped amorphous silicon or polysilicon 806 are deposited with layers of silicon dioxide 808 in between. The amorphous silicon or polysilicon layers 806 could be deposited using a chemical vapor deposition process, such as LPCVD or PECVD abbreviated as above.

Figure 8C:
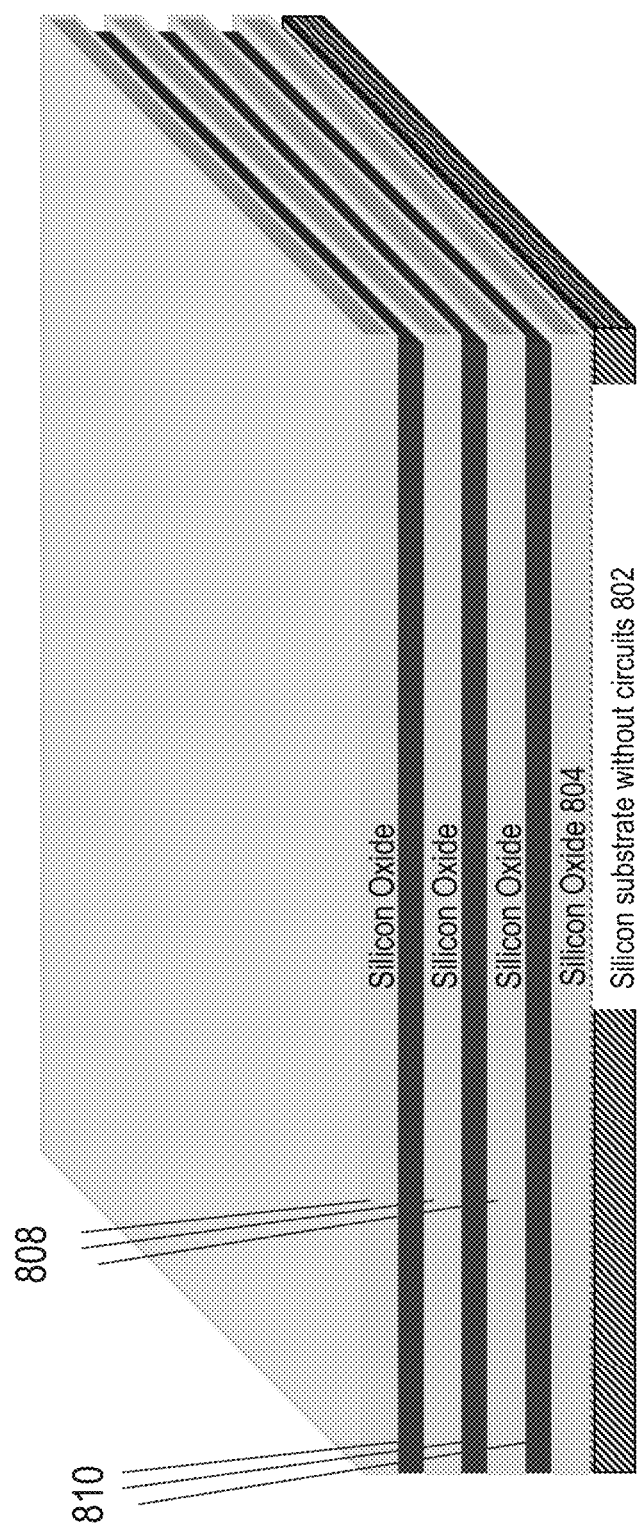

Step (C): As illustrated in FIG. 8C, a Rapid Thermal Anneal (RTA) or standard anneal is conducted to crystallize the layers of polysilicon or amorphous silicon deposited in Step (B). Temperatures during this RTA could be as high as 700° C. or more, and could even be as high as 1400° C. The polysilicon region obtained after Step (C) is indicated as 810. Since there are no circuits under these layers of polysilicon, very high temperatures (such as 1400° C.) can be used for the anneal process, leading to very good quality polysilicon with few grain boundaries and very high mobilities approaching those of single crystal silicon. Alternatively, a laser anneal could be conducted, either for all layers 806 at the same time or layer by layer at different times.

Figure 8D:
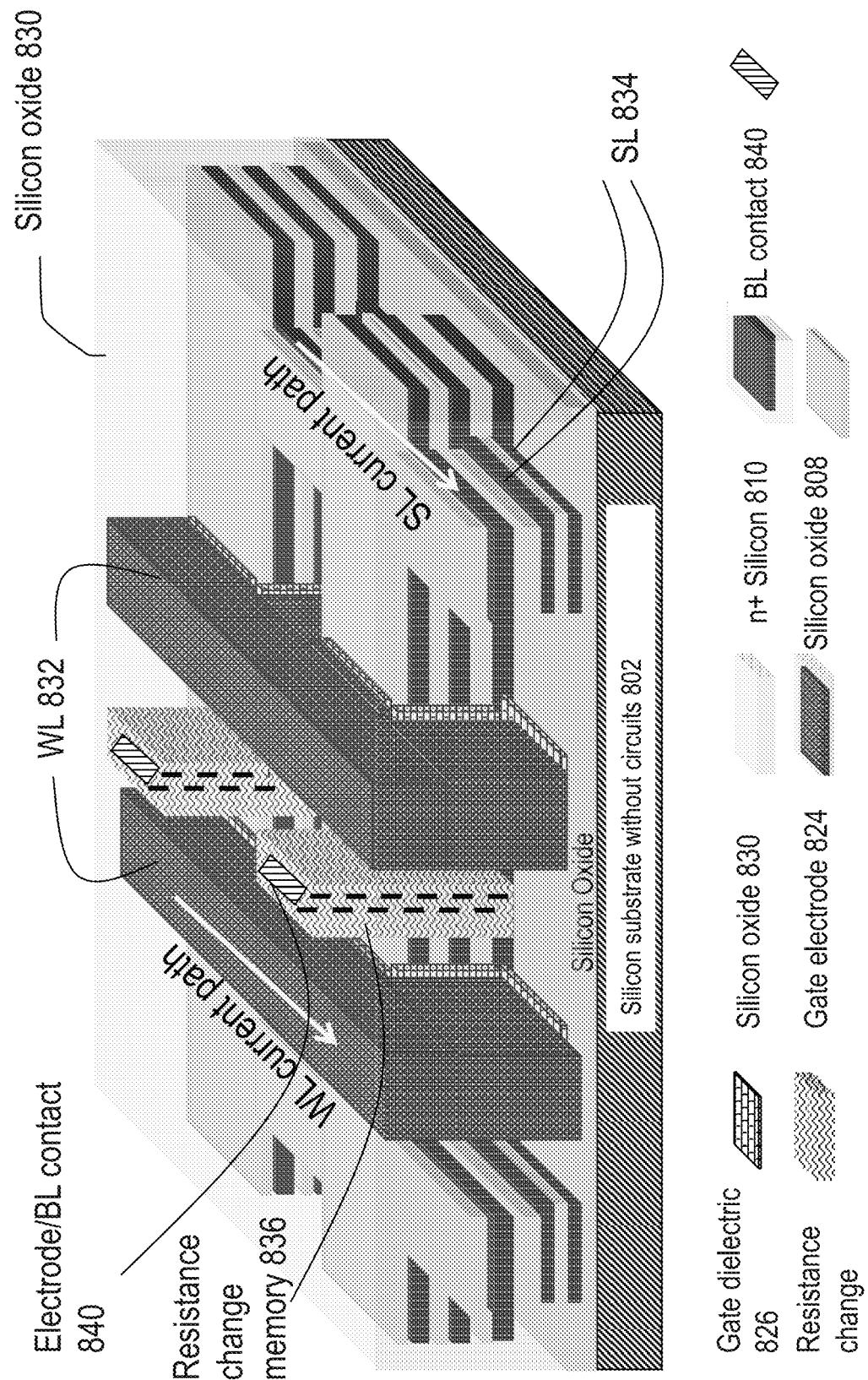

Step (D): This is illustrated in FIG. 8D. Procedures similar to those described in FIG. 32E-H of incorporated parent reference U.S. Pat. No. 8,026,521, are utilized to obtain the structure shown in FIG. 8D which has multiple levels of junctionless transistor selectors for resistive memory devices. The resistance change memory is indicated as 836 while its electrode and contact to the BL is indicated as 840. The WL is indicated as 832, while the SL is indicated as 834. Gate dielectric of the junction-less transistor is indicated as 826 while the gate electrode of the junction-less transistor is indicated as 824, this gate electrode also serves as part of the WL 832. Silicon oxide is indicated as 830.

Figure 8E:
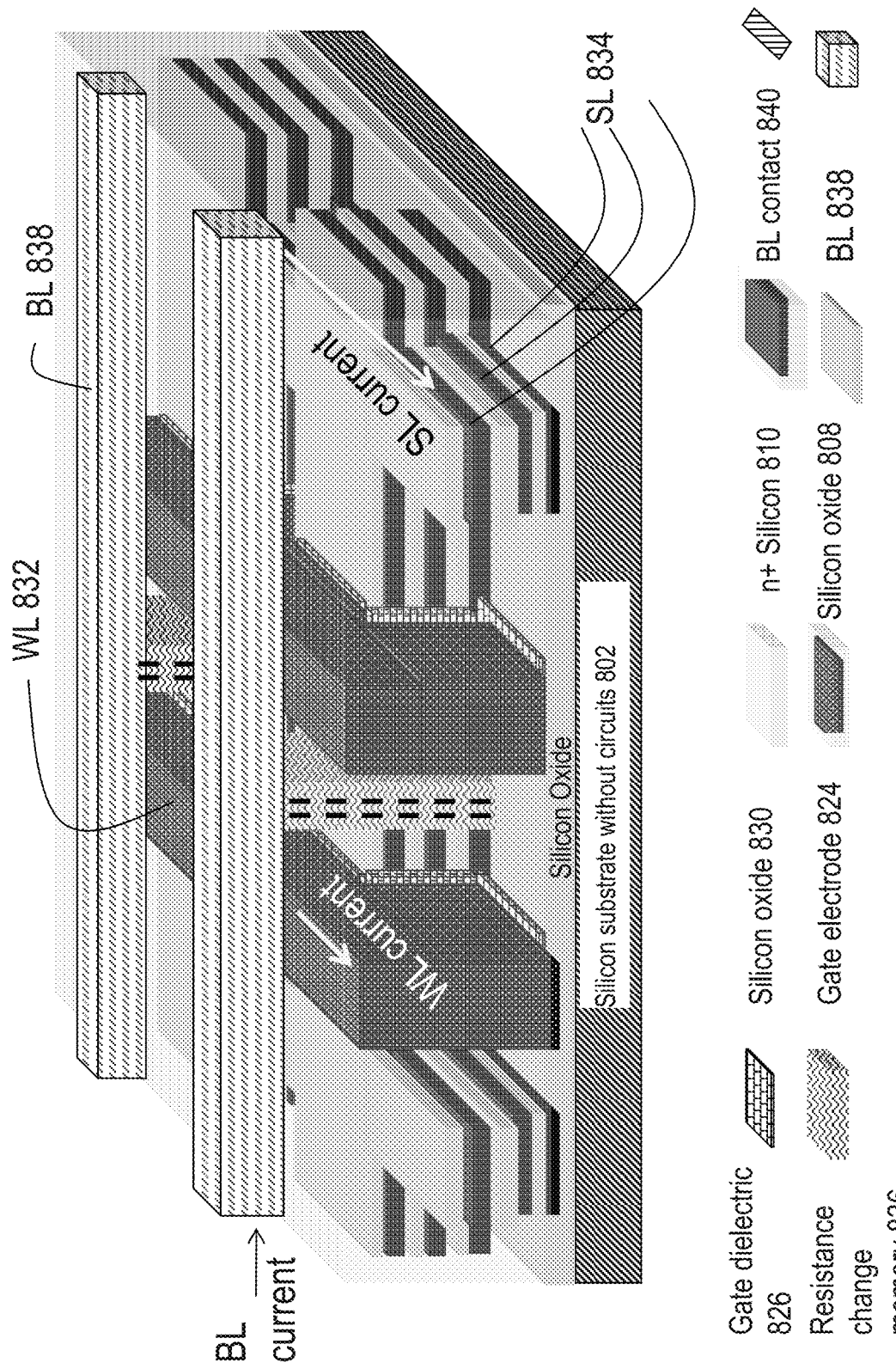
Figure 8F:
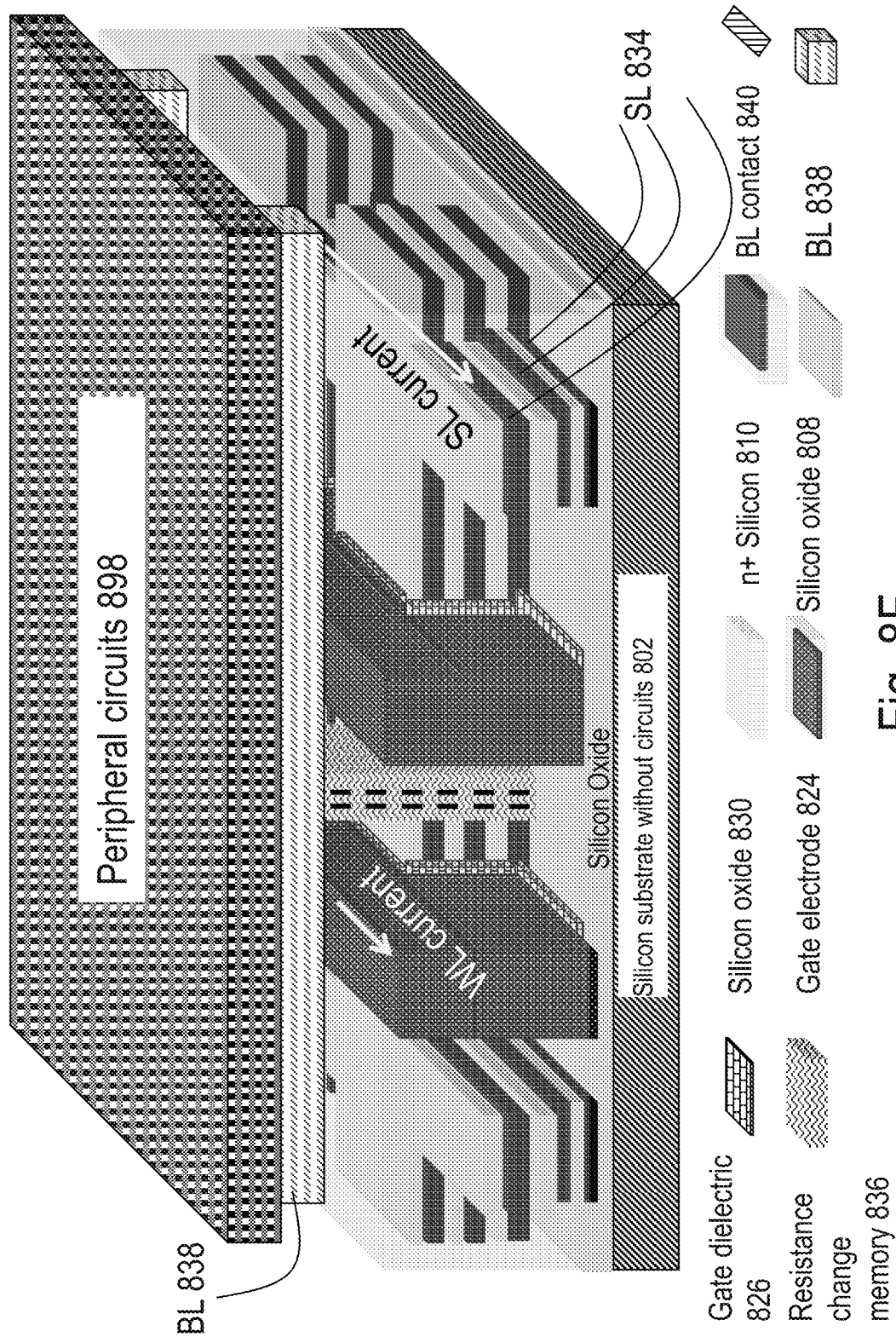

Step (E): This is illustrated in FIG. 8E. Bit lines (indicated as BL 838) are constructed. Contacts are then made to peripheral circuits and various parts of the memory array as described in embodiments described previously.

Step (F): Using procedures described in Section 1 and Section 2 of this patent application's parent, peripheral circuits 898 (with transistors and wires) could be formed well aligned to the multiple memory layers shown in Step (E). For the periphery, one could use the process flow shown in Section 2 where replacement gate processing is used, or one could use sub −400° C. processed transistors such as junction-less transistors or recessed channel transistors. Alternatively, one could use laser anneals for peripheral transistors' source-drain processing. Various other procedures described in Section 1 and Section 2 could also be used. Connections can then be formed between the multiple memory layers and peripheral circuits. By proper choice of materials for memory layer transistors and memory layer wires (e.g., by using tungsten and other materials that withstand high temperature processing for wiring), even standard transistors processed at high temperatures (>1000° C.) for the periphery could be used.

Section 1, of incorporated parent reference U.S. Pat. No. 8,026,521, described the formation of 3D stacked semiconductor circuits and chips with sub −400° C. processing temperatures to build transistors and high density of vertical connections. In this section an alternative method is explained, in which a transistor is built with any replacement gate (or gate-last) scheme that is utilized widely in the industry. This method allows for high temperatures (above 400° C.) to build the transistors. This method utilizes a combination of three concepts:

Replacement gate (or gate-last) high k/metal gate fabrication

Face-up layer transfer using a carrier wafer

Misalignment tolerance techniques that utilize regular or repeating layouts. In these repeating layouts, transistors could be arranged in substantially parallel bands.

A very high density of vertical connections is possible with this method. Single crystal silicon (or monocrystalline silicon) layers that are transferred are less than 2 um thick, or could even be thinner than 0.4 um or 0.2 um.

Figure 9A:
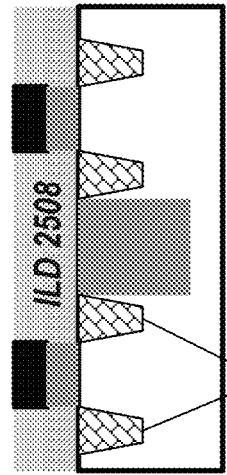

The method mentioned in the previous paragraph is described in FIG. 9A-9F. The procedure may include several steps as described in the following sequence:

Step (A): After creating isolation regions using a shallow-trench-isolation (STI) process 2504, dummy gates 2502 are constructed with silicon dioxide and poly silicon. The term "dummy gates" is used since these gates will be replaced by high k gate dielectrics and metal gates later in the process flow, according to the standard replacement gate (or gate-last) process. Further details of replacement gate processes are described in "A 45 nm Logic Technology with High-k+Metal Gate Transistors, Strained Silicon, 9 Cu Interconnect Layers, 193 nm Dry Patterning, and 100% Pb-free Packaging," IEDM Tech. Dig., pp. 247-250, 2007 by K. Mistry, et al. and "Ultralow-EOT (5 Å) Gate-First and Gate-Last High Performance CMOS Achieved by Gate-Electrode Optimization," IEDM Tech. Dig., pp. 663-666, 2009 by L. Ragnarsson, et al. FIG. 9A illustrates the structure after Step (A).

Figure 9B:
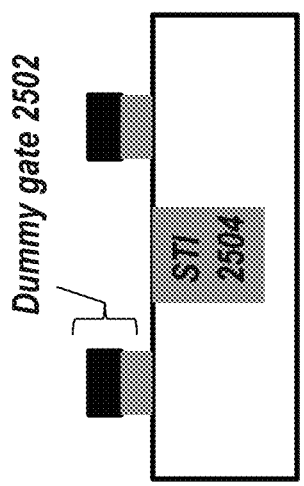

Step (B): Rest of the transistor fabrication flow proceeds with formation of source-drain regions 2506, strain enhancement layers to improve mobility, high temperature anneal to activate source-drain regions 2506, formation of inter-layer dielectric (ILD) 2508, etc. FIG. 9B illustrates the structure after Step (B).

Figure 9C:
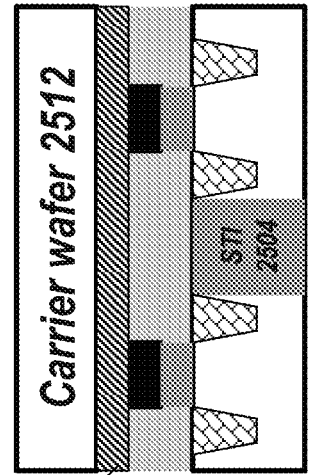

Step (C): Hydrogen is implanted into the wafer at the dotted line regions indicated by 2510. FIG. 9C illustrates the structure after Step (C).

Figure 9D:
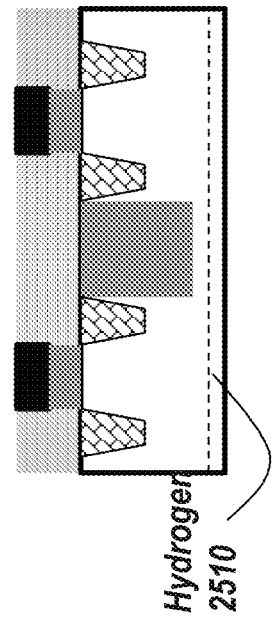

Step (D): The wafer after step (C) is bonded to a temporary carrier wafer 2512 using a temporary bonding adhesive 2514. This temporary carrier wafer 2512 could be constructed of glass. Alternatively, it could be constructed of silicon. The temporary bonding adhesive 2514 could be a polymer material, such as a polyimide. A anneal or a sideways mechanical force is utilized to cleave the wafer at the hydrogen plane 2510. A CMP process is then conducted. FIG. 9D illustrates the structure after Step (D).

Step (E): An oxide layer 2520 is deposited onto the bottom of the wafer shown in Step (D). The wafer is then bonded to the bottom layer of wires and transistors 2522 using oxide-to-oxide bonding. The bottom layer of wires and transistors 2522 could also be called a base wafer. The temporary carrier wafer 2512 is then removed by shining a laser onto the temporary bonding adhesive 2514 through the temporary carrier wafer 2512 (which could be constructed of glass). Alternatively, an anneal could be used to remove the temporary bonding adhesive 2514. Through-silicon connections 2516 with a non-conducting (e.g. oxide) liner 2515 to the landing pads 2518 in the base wafer could be constructed at a very high density using special alignment methods described in at least FIGS. 26A-D and FIG. 27A-F of incorporated parent reference U.S. Pat. No. 8,026,521. FIG. 9E illustrates the structure after Step (E).

Step (F) Dummy gates 2502 are etched away, followed by the construction of a replacement with high k gate dielectrics 2524 and metal gates 2526. Essentially, partially-formed high performance transistors are layer transferred atop the base wafer (may also be called target wafer) followed by the completion of the transistor processing with a low (sub 400° C.) process. FIG. 9F illustrates the structure after Step (F). The remainder of the transistor, contact, and wiring layers are then constructed.

It will be obvious to someone skilled in the art that alternative versions of this flow are possible with various methods to attach temporary carriers and with various versions of the gate-last process flow.

Figure 10A:
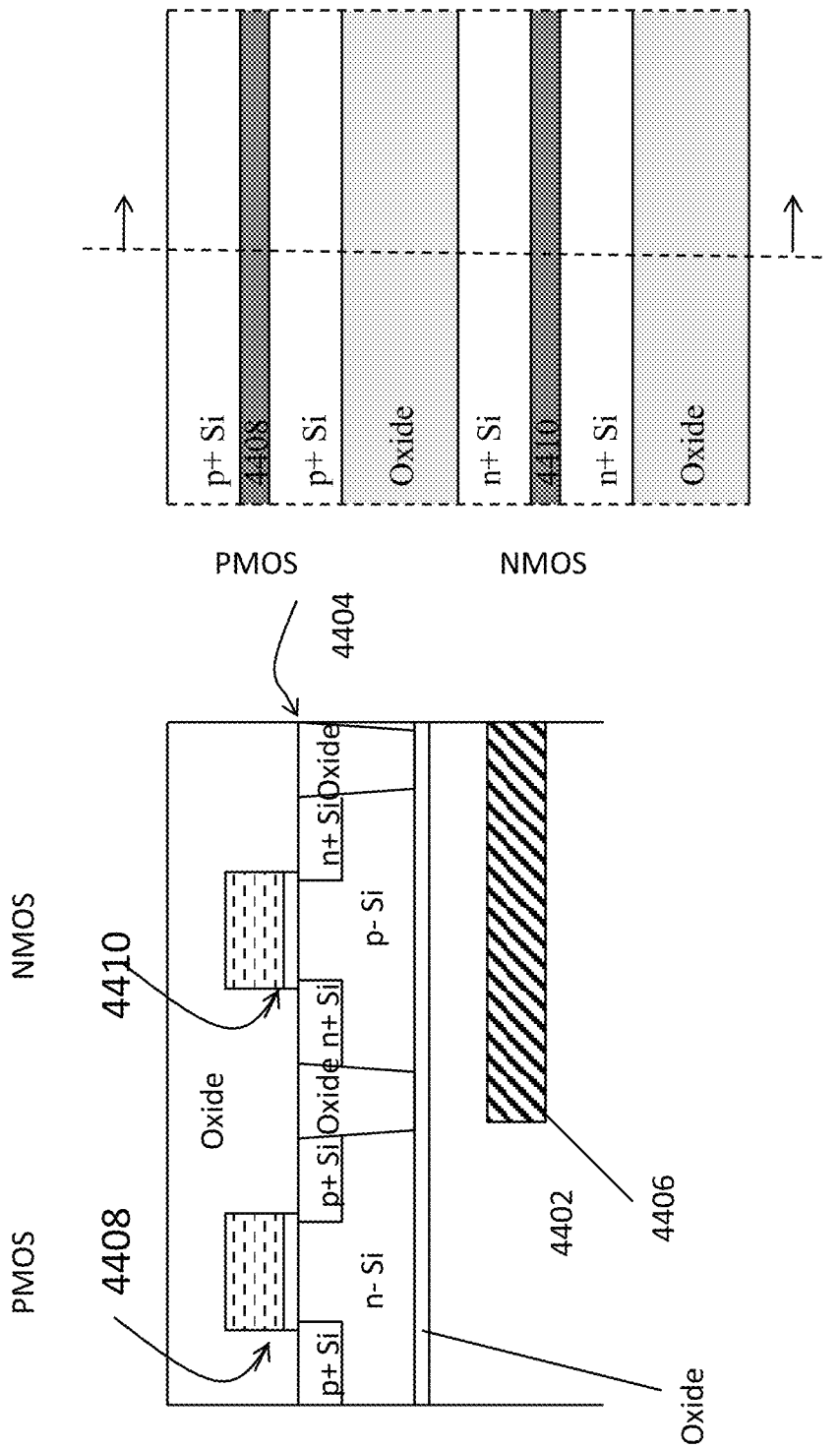
FIGS. 10A-10D depict a process flow for constructing 3D integrated chips and circuits with misalignment tolerance techniques and repeating pattern in one direction.

FIGS. 10A-10D (and FIG. 45A-D of incorporated parent reference U.S. Pat. No. 8,026,521) show an alternative procedure for forming CMOS circuits with a high density of connections between stacked layers. The process utilizes a repeating pattern in one direction for the top layer of transistors. The procedure may include several steps in the following sequence:

Step (A): Using procedures similar to FIG. 9A-F, a top layer of transistors 4404 is transferred atop a bottom layer of transistors and wires 4402. Landing pads 4406 are utilized on the bottom layer of transistors and wires 4402. Dummy gates 4408 and 4410 are utilized for nMOS and pMOS. The key difference between the structures shown in FIGS. 9A-F and this structure is the layout of oxide isolation regions between transistors. FIG. 10A illustrates the structure after Step (A).

Figure 10B:
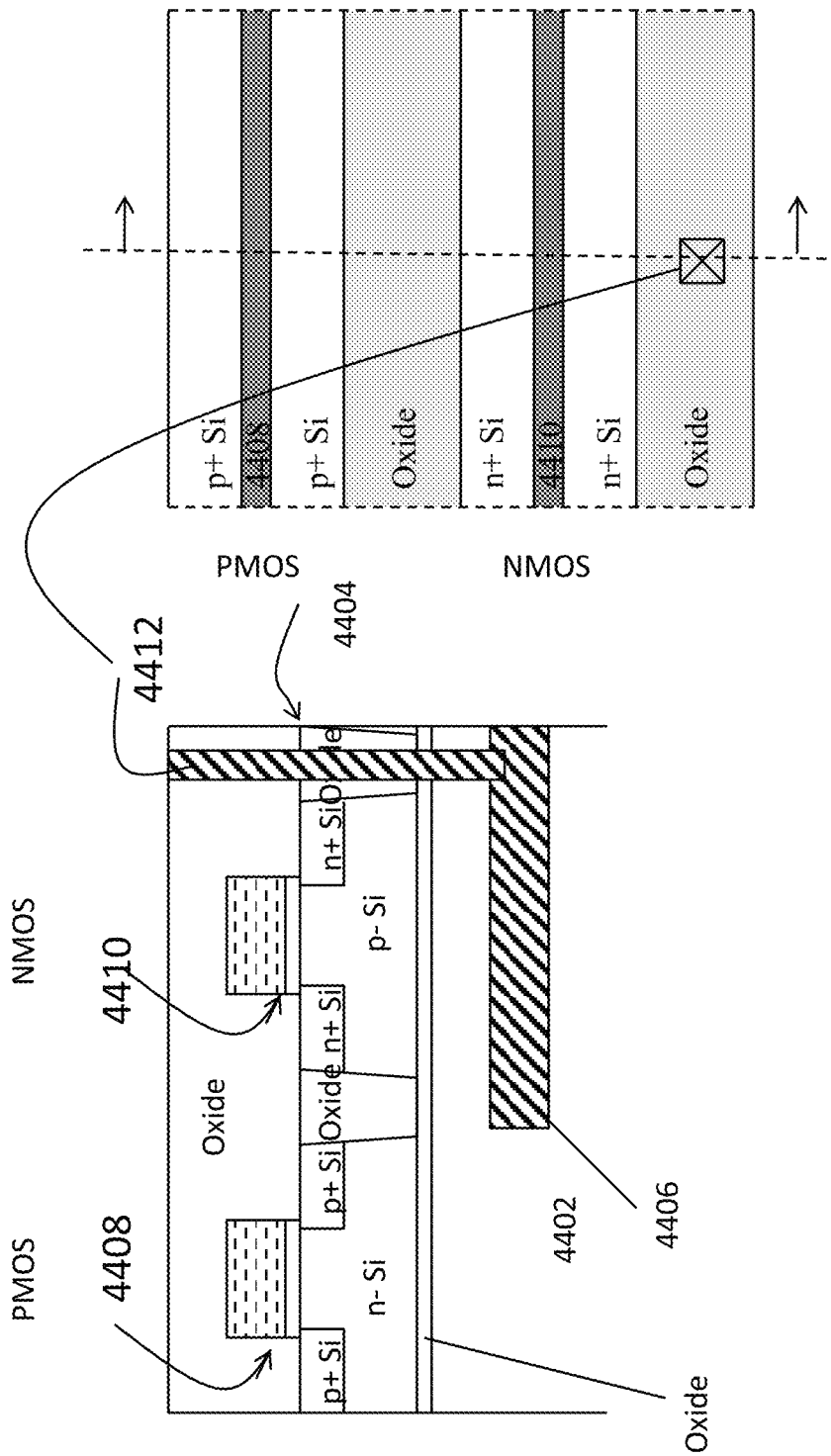

Step (B): Through-silicon connections 4412 are formed well-aligned to the bottom layer of transistors and wires 4402. Alignment schemes to be described in FIG. 45A-D of incorporated parent reference U.S. Pat. No. 8,026,521 are utilized for this purpose. All features constructed in future steps are also formed well-aligned to the bottom layer of transistors and wires 4402. FIG. 10B illustrates the structure after Step (B).

Figure 10C:
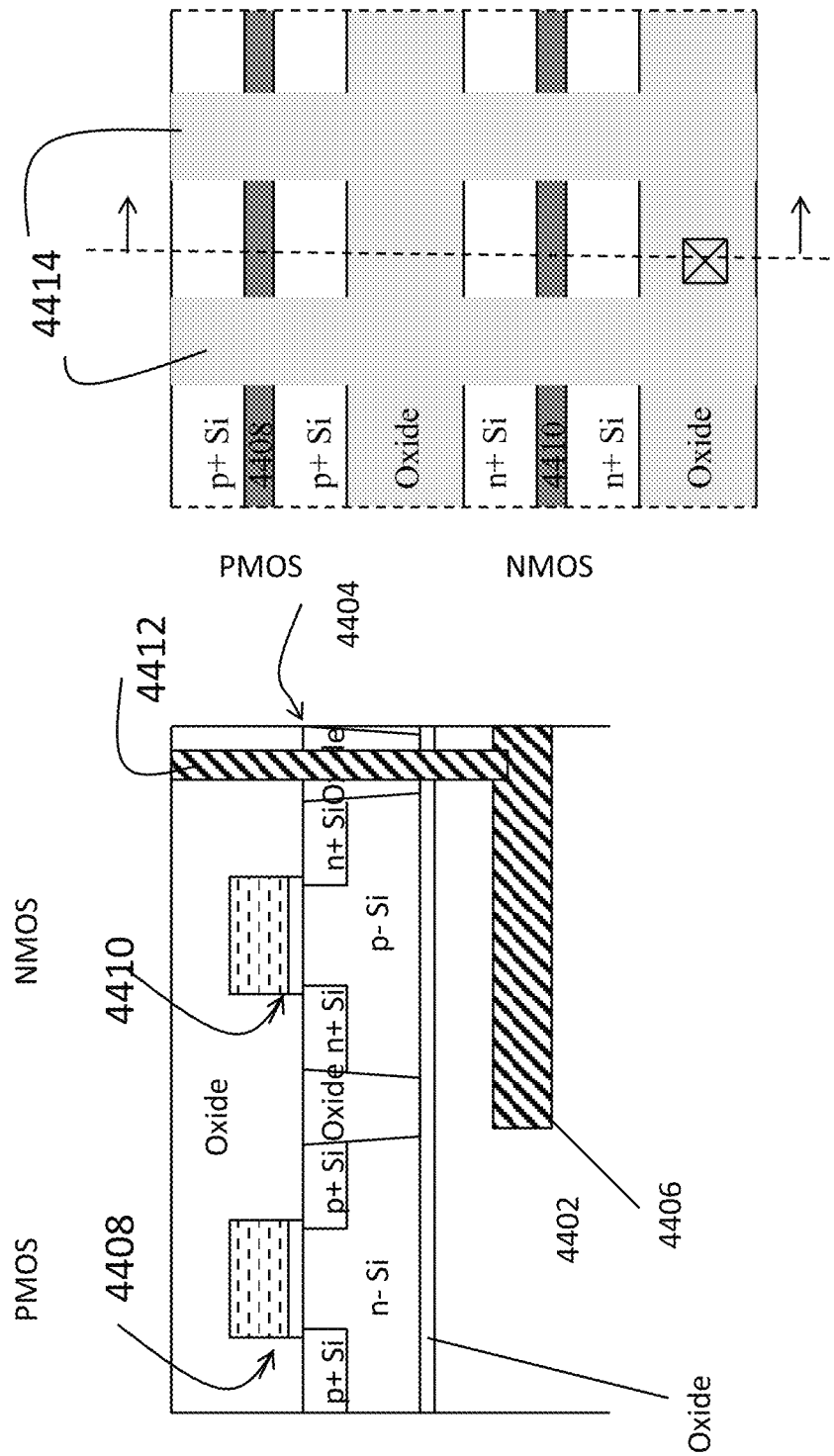

Step (C): Oxide isolation regions 4414 are formed between adjacent transistors to be defined. These isolation regions are formed by lithography and etch of gate and silicon regions and then fill with oxide. FIG. 10C illustrates the structure after Step (C).

Figure 10D:
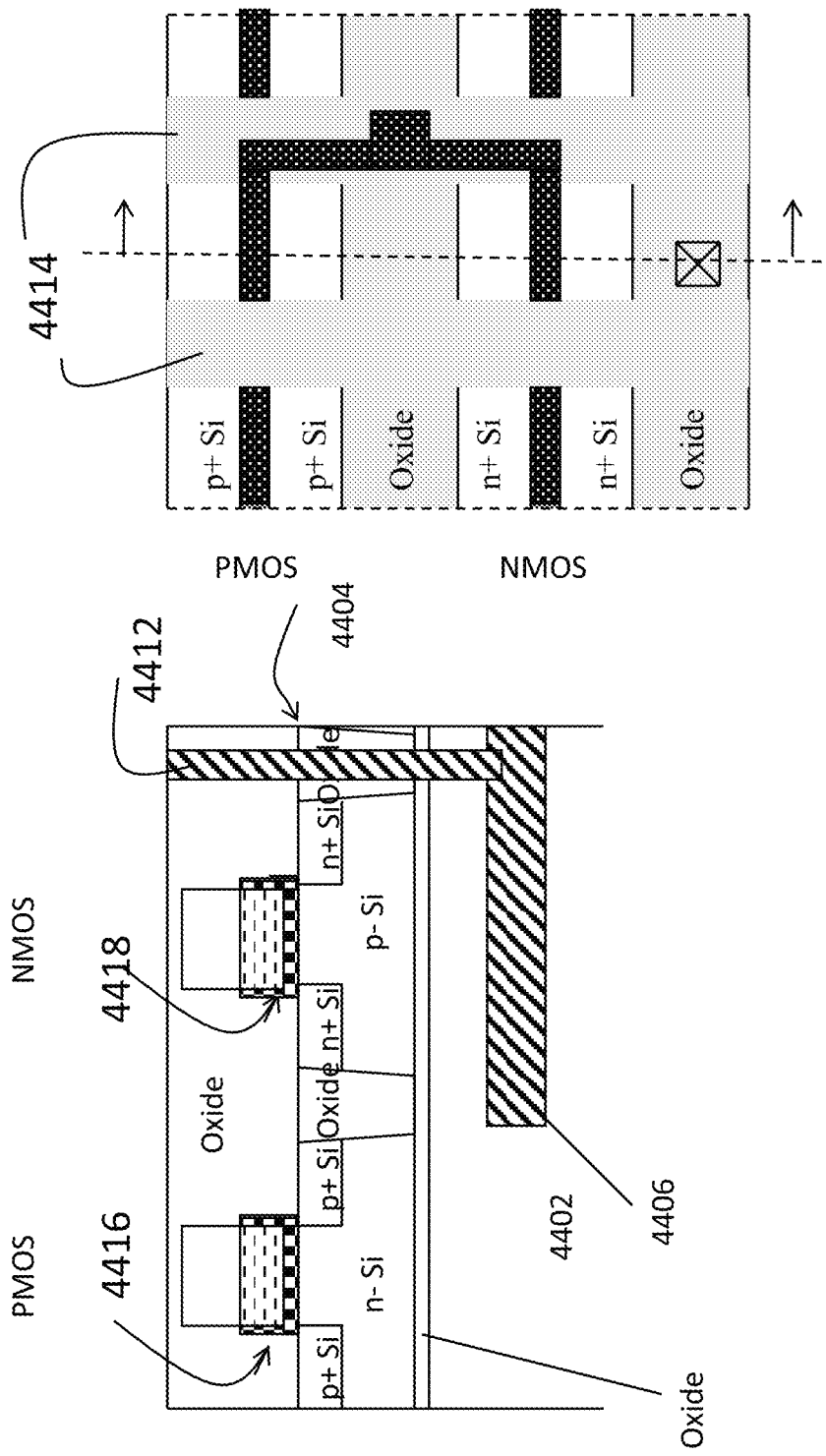

Step (D): The dummy gates 4408 and 4410 are etched away and replaced with replacement gates 4416 and 4418. These replacement gates are patterned and defined to form gate contacts as well. FIG. 10D illustrates the structure after Step (D). Following this, other process steps in the fabrication flow proceed as usual.

Figure 11A:
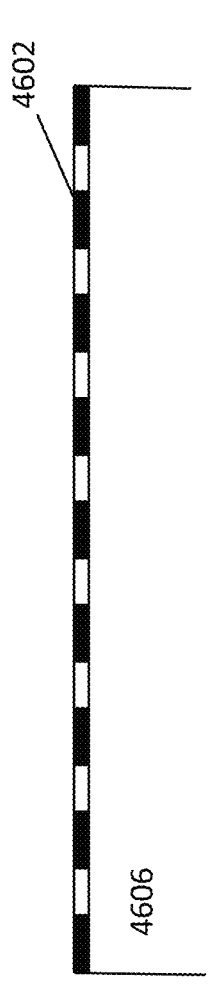

FIGS. 11A-11G illustrate using a carrier wafer for layer transfer. FIG. 11A illustrates the first step of preparing transistors with dummy gates 4602 on first donor wafer (or top wafer) 4606. This completes the first phase of transistor formation.

Figure 11B:
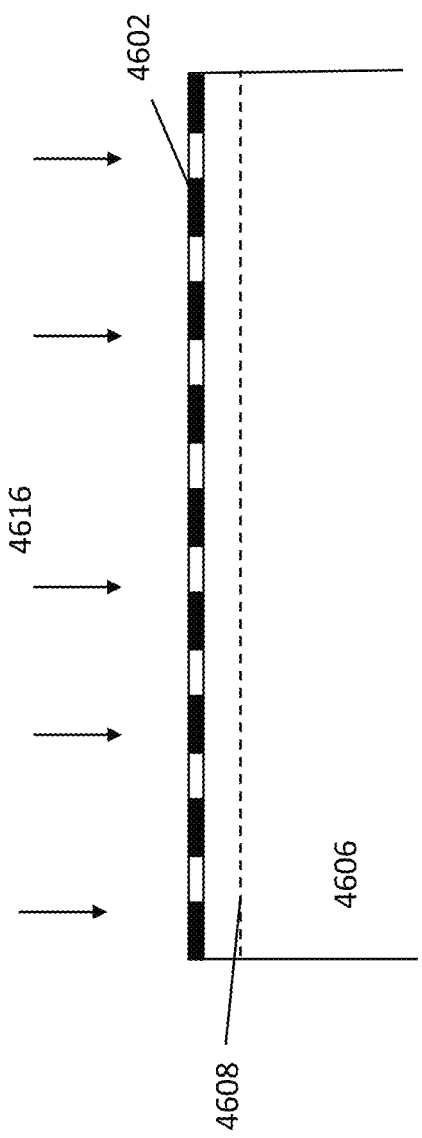

FIG. 11B illustrates forming a cleave line 4608 by implant 4616 of atomic particles such as H+. FIG. 11C illustrates permanently bonding the first donor wafer 4606 to a second donor wafer 4626. The permanent bonding may be oxide to oxide wafer bonding as described previously.

FIG. 11D illustrates the second donor wafer 4626 acting as a carrier wafer after cleaving the first donor wafer off potentially at face 4632; leaving a thin layer 4606 with the now buried dummy gate transistors 4602. FIG. 11E illustrates forming a second cleave line 4618 in the second donor wafer 4626 by implant 4646 of atomic species such as H+.

FIG. 11F illustrates the second layer transfer step to bring the dummy gate transistors 4602 ready to be permanently bonded on top of the bottom layer of transistors and wires 4601. For the simplicity of the explanation we left out the now obvious steps of surface layer preparation done for each of these bonding steps.

Figure 11G:
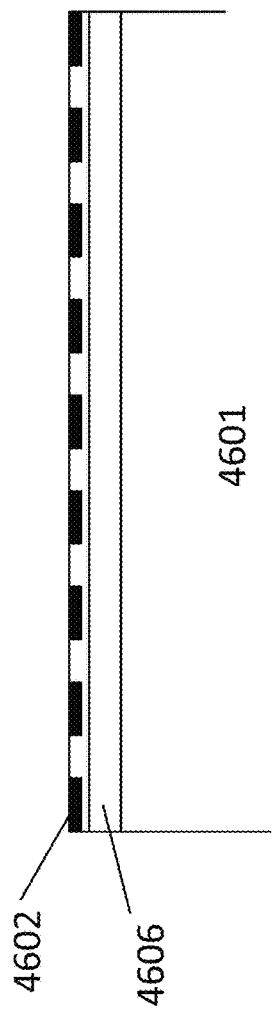

FIG. 11G illustrates the bottom layer of transistors and wires 4601 with the dummy gate transistor 4602 on top after cleaving off the second donor wafer and removing the layers on top of the dummy gate transistors. Now we can proceed and replace the dummy gates with the final gates, form the metal interconnection layers, and continue the 3D fabrication process.

Figure 12A:
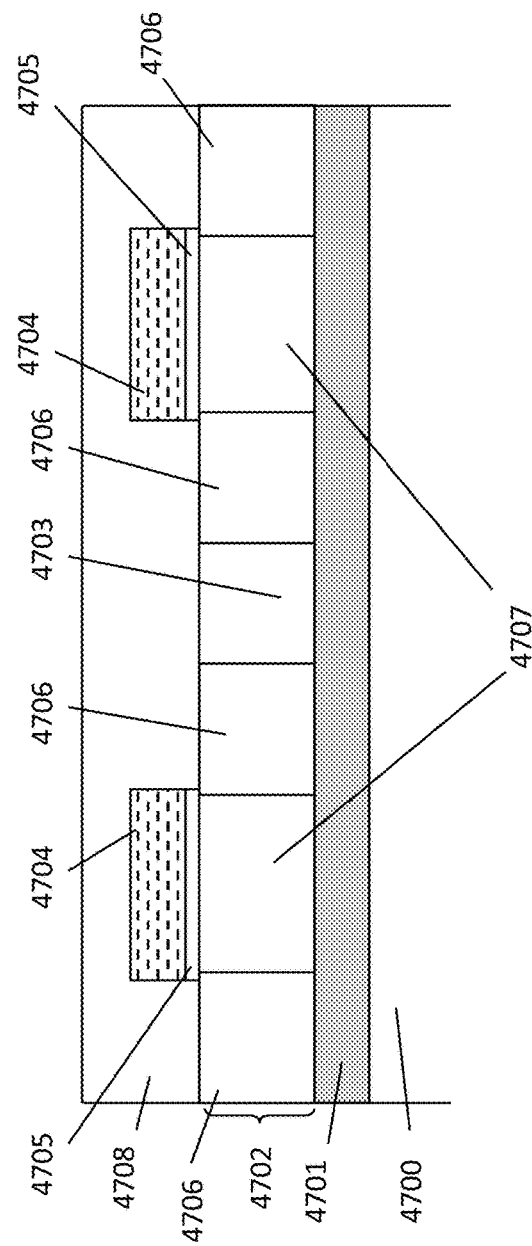

An interesting alternative is available when using the carrier wafer flow described in FIG. 11A-11G. In this flow we can use the two sides of the transferred layer to build NMOS on one side and PMOS on the other side. Timing properly the replacement gate step such flow could enable full performance transistors properly aligned to each other. As illustrated in FIG. 12A, an SOI (Silicon On Insulator) donor (or top) wafer 4700 may be processed in the normal state of the art high k metal gate gate-last manner with adjusted thermal cycles to compensate for later thermal processing up to the step prior to where CMP exposure of the polysilicon dummy gates 4704 takes place. FIG. 12A illustrates a cross section of the SOI donor wafer substrate 4700, the buried oxide (BOX) 4701, the thin silicon layer 4702 of the SOI wafer, the isolation 4703 between transistors, the polysilicon 4704 and gate oxide 4705 of n-type CMOS transistors with dummy gates, their associated source and drains 4706 for NMOS, NMOS transistor channel regions 4707, and the NMOS interlayer dielectric (ILD) 4708. Alternatively, the PMOS device may be constructed at this stage. This completes the first phase of transistor formation.

At this step, or alternatively just after a CMP of layer 4708 to expose the polysilicon dummy gates 4704 or to planarize the oxide layer 4708 and not expose the dummy gates 4704, an implant of an atomic species 4710, such as H+, is done to prepare the cleaving plane 4712 in the bulk of the donor substrate, as illustrated in FIG. 12B.

The SOI donor wafer 4700 is now permanently bonded to a carrier wafer 4720 that has been prepared with an oxide layer 4716 for oxide to oxide bonding to the donor wafer surface 4714 as illustrated in FIG. 12C. The details have been described previously. The donor wafer 4700 may then be cleaved at the cleaving plane 4712 and may be thinned by chemical mechanical polishing (CMP) and surface 4722 may be prepared for transistor formation. The donor wafer layer 4700 at surface 4722 may be processed in the normal state of the art gate last processing to form the PMOS transistors with dummy gates. During processing the wafer is flipped so that surface 4722 is on top, but for illustrative purposes this is not shown in the subsequent FIGS. 12E-12G.

Figure 12E:
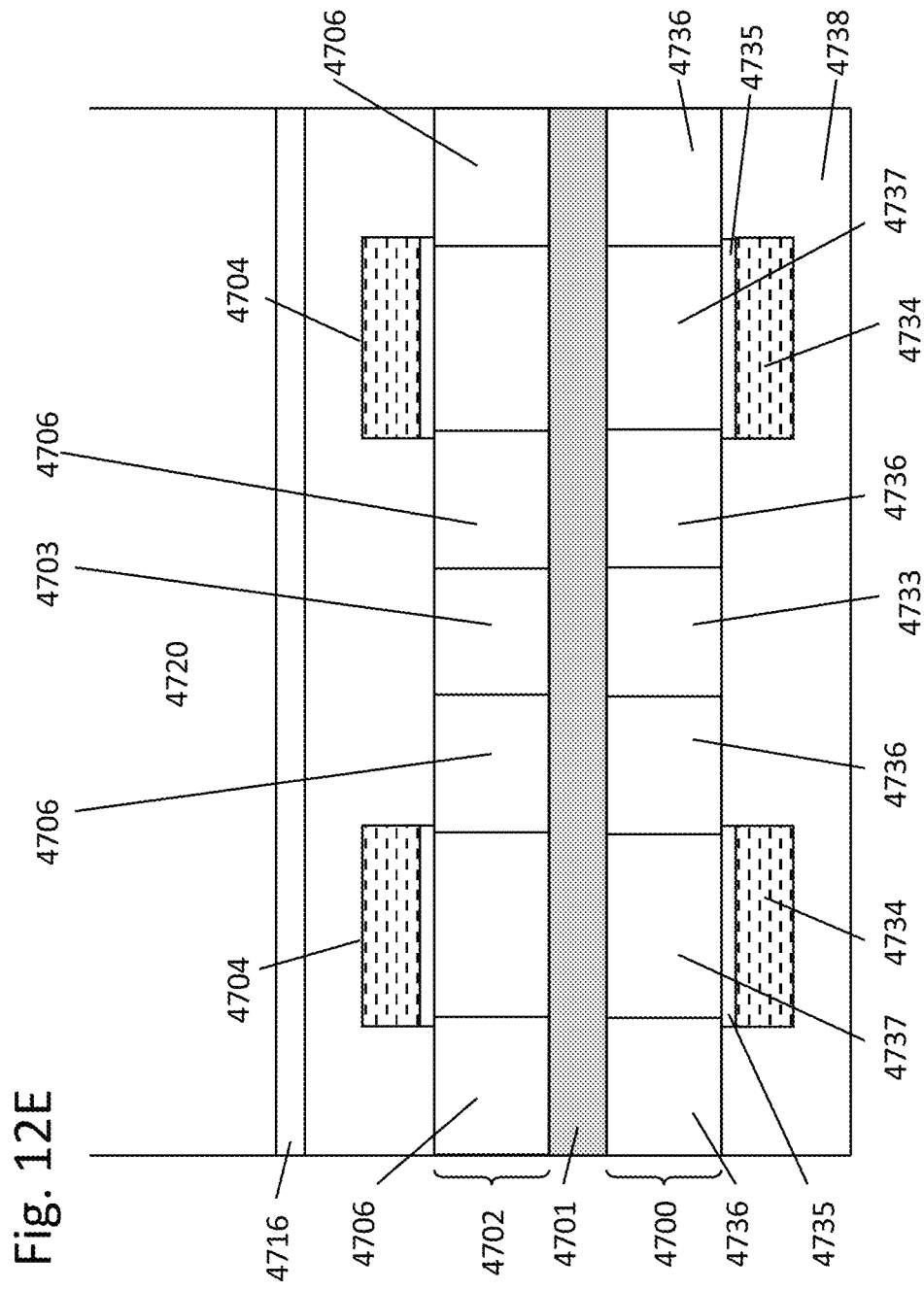

FIG. 12E illustrates the cross section with the buried oxide (BOX) 4701, the now thin silicon layer 4700 of the SOI substrate, the isolation 4733 between transistors, the polysilicon 4734 and gate oxide 4735 of p-type CMOS dummy gates, their associated source and drains 4736 for PMOS, PMOS transistor channel regions 4737 and the PMOS interlayer dielectric (ILD) 4738. The PMOS transistors may be precisely aligned at state of the art tolerances to the NMOS transistors due to the shared substrate 4700 possessing the same alignment marks. At this step, or alternatively just after a CMP of layer 4738 to expose the PMOS polysilicon dummy gates or to planarize the oxide layer 4738 and not expose the dummy gates, the wafer could be put into high temperature cycle to activate both the dopants in the NMOS and the PMOS source drain regions.

Figure 12F:
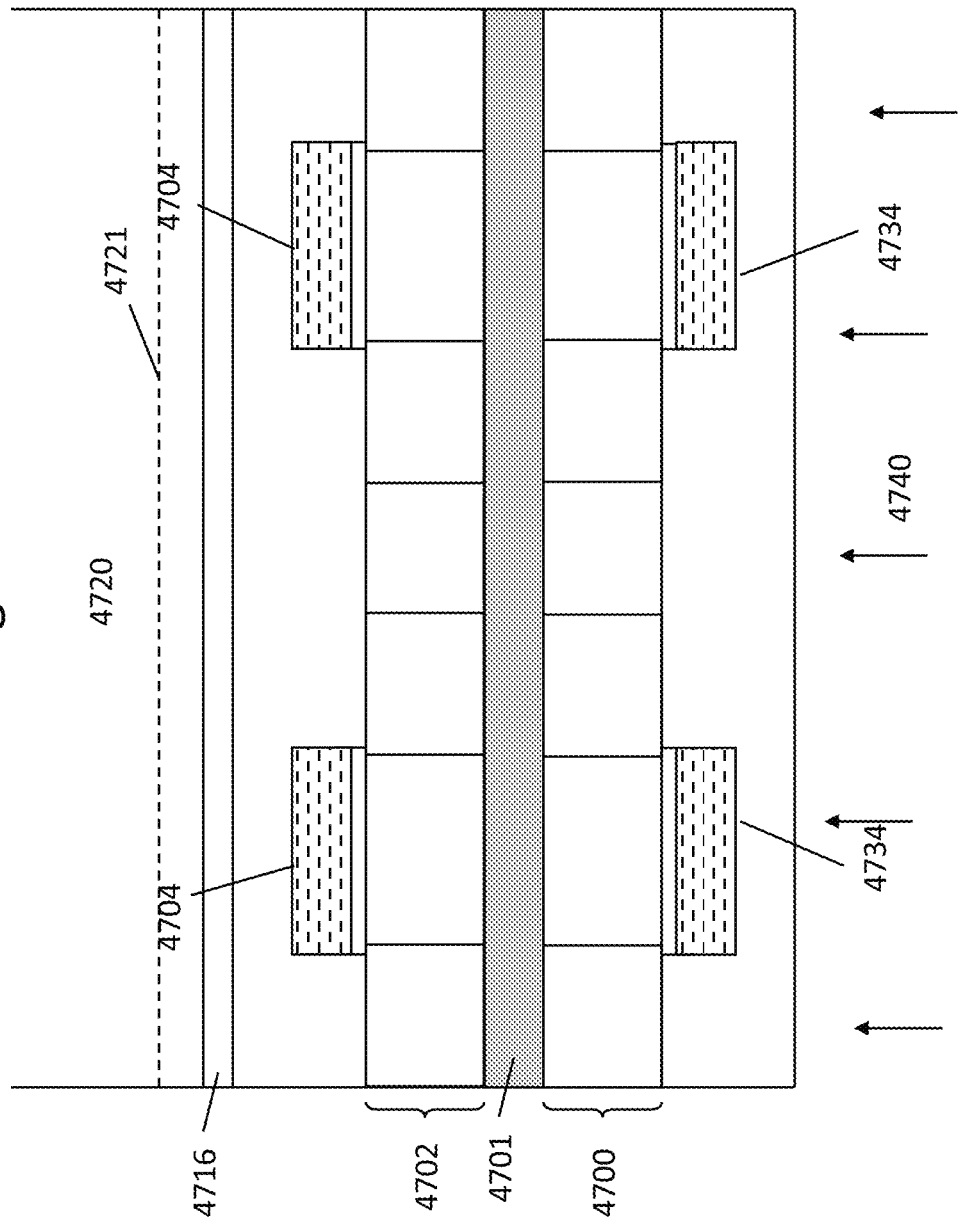

Then an implant of an atomic species 4740, such as H+, may prepare the cleaving plane 4721 in the bulk of the carrier wafer substrate 4720 for layer transfer suitability, as illustrated in FIG. 12F. The PMOS transistors are now ready for normal state of the art gate-last transistor formation completion.

Figure 12G:
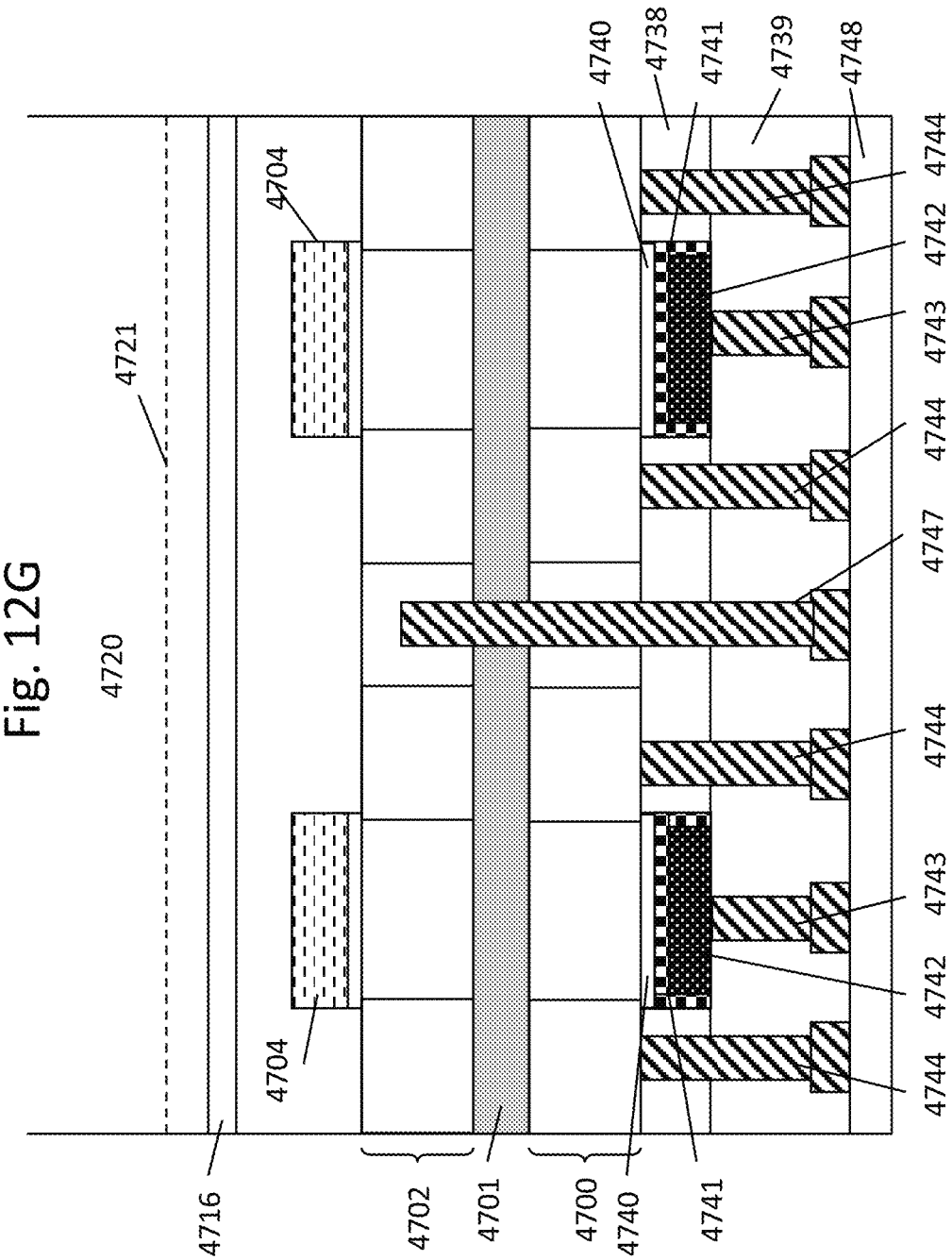
Figure 121:
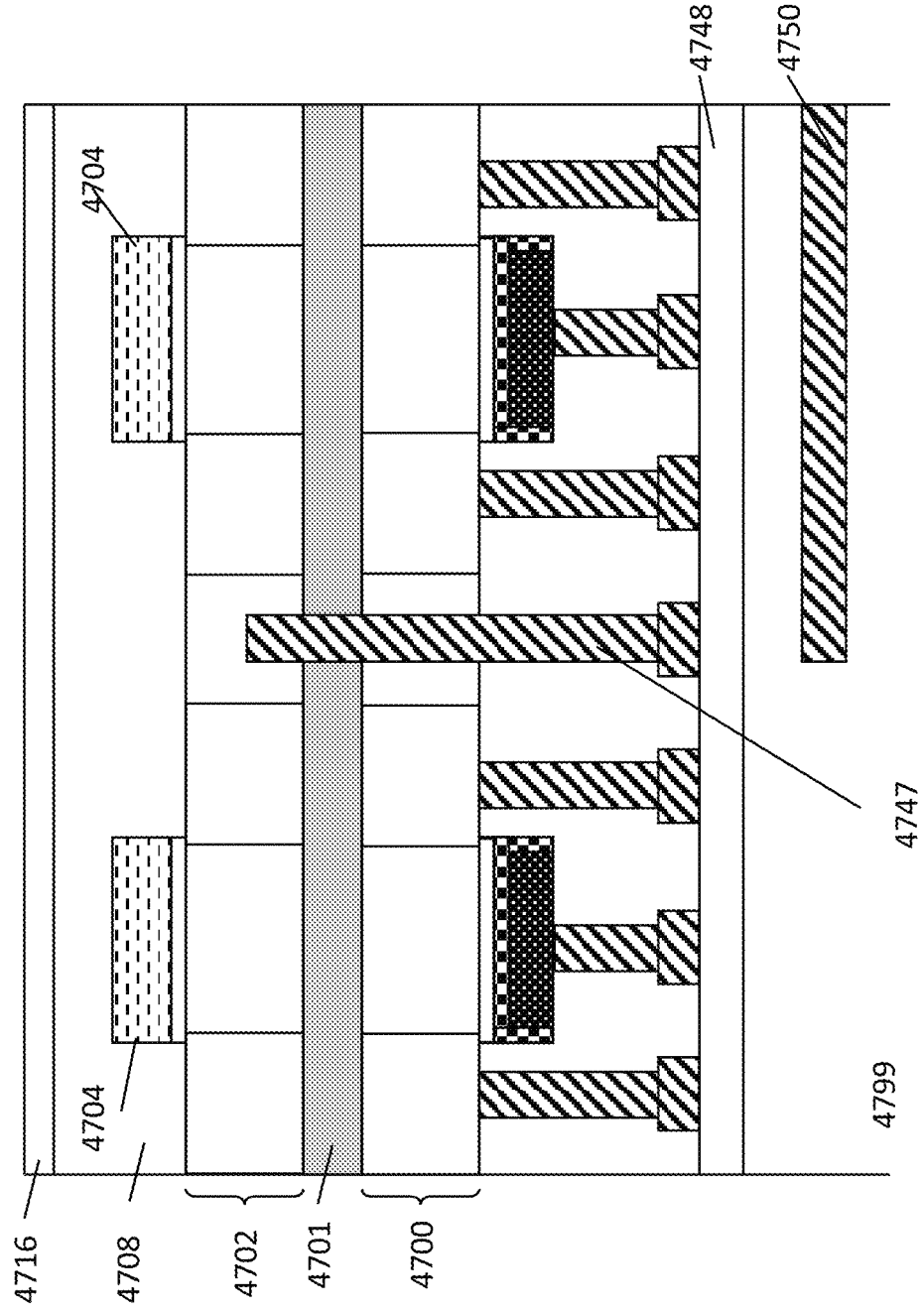

As illustrated in FIG. 12G, the inter layer dielectric 4738 may be chemical mechanically polished to expose the top of the polysilicon dummy gates 4734. The dummy polysilicon gates 4734 may then be removed by etch and the PMOS hi-k gate dielectric 4740 and the PMOS specific work function metal gate 4741 may be deposited. An aluminum fill 4742 may be performed on the PMOS gates and the metal CMP'ed. A dielectric layer 4739 may be deposited and the normal gate 4743 and source/drain 4744 contact formation and metallization.

The PMOS layer to NMOS layer via 4747 and metallization may be partially formed as illustrated in FIG. 12G and an oxide layer 4748 is deposited to prepare for bonding.

The carrier wafer and two sided n/p layer is then permanently bonded to bottom wafer having transistors and wires 4799 with associated metal landing strip 4750 as illustrated in FIG. 12H.

The carrier wafer 4720 may then be cleaved at the cleaving plane 4721 and may be thinned by chemical mechanical polishing (CMP) to oxide layer 4716 as illustrated in FIG. 12I.

Figure 12J:
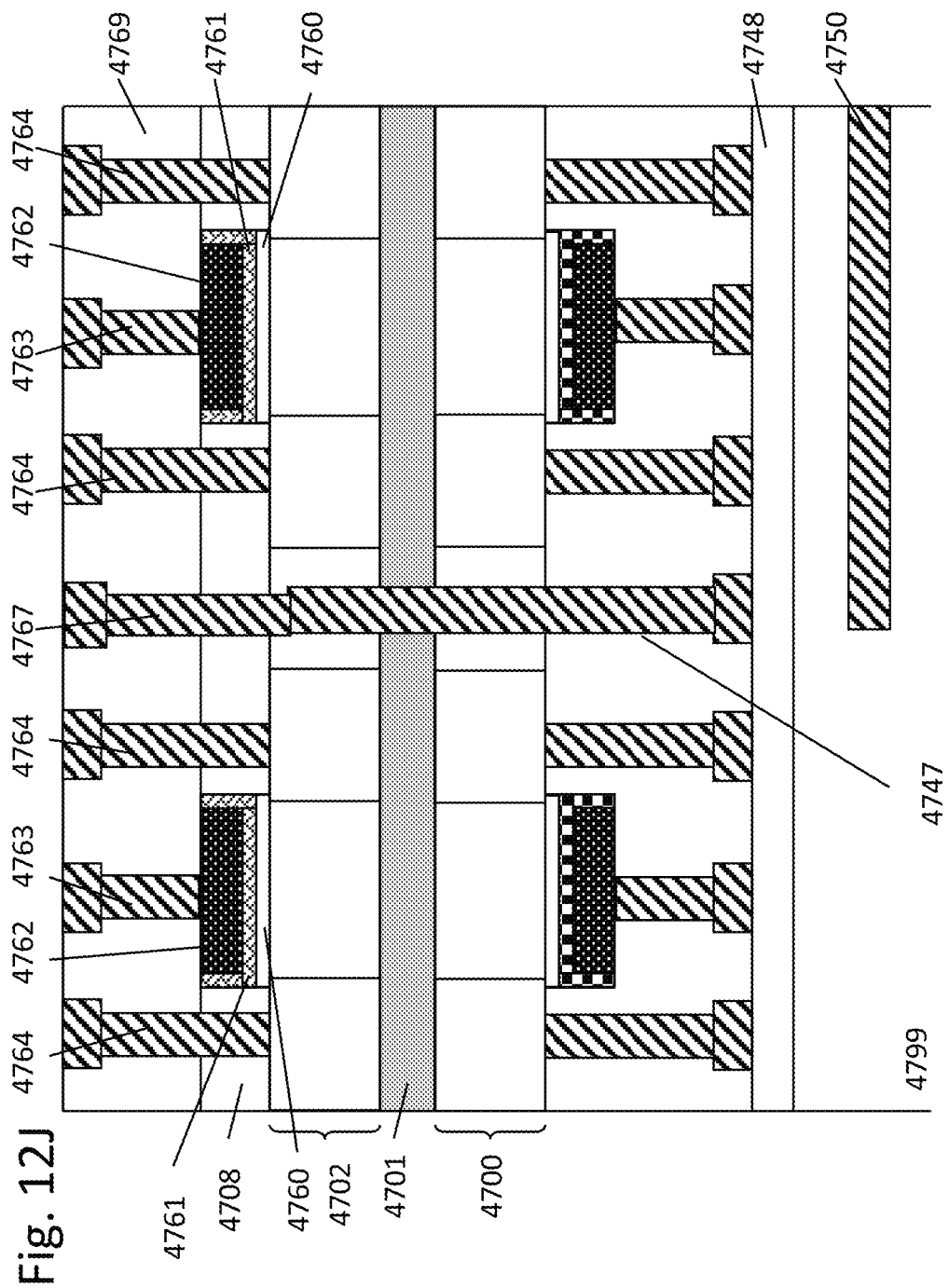

The NMOS transistors are now ready for normal state of the art gate-last transistor formation completion. As illustrated in FIG. 12J, the oxide layer 4716 and the NMOS inter layer dielectric 4708 may be chemical mechanically polished to expose the top of the NMOS polysilicon dummy gates 4704. The dummy polysilicon gates 4704 may then be removed by etch and the NMOS hi-k gate dielectric 4760 and the NMOS specific work function metal gate 4761 may be deposited. An aluminum fill 4762 may be performed on the NMOS gates and the metal CMP'ed. A dielectric layer 4769 may be deposited and the normal gate 4763 and source/drain 4764 contact formation and metallization. The NMOS layer to PMOS layer via 4767 to connect to 4747 and metallization may be formed.

Figure 12K:
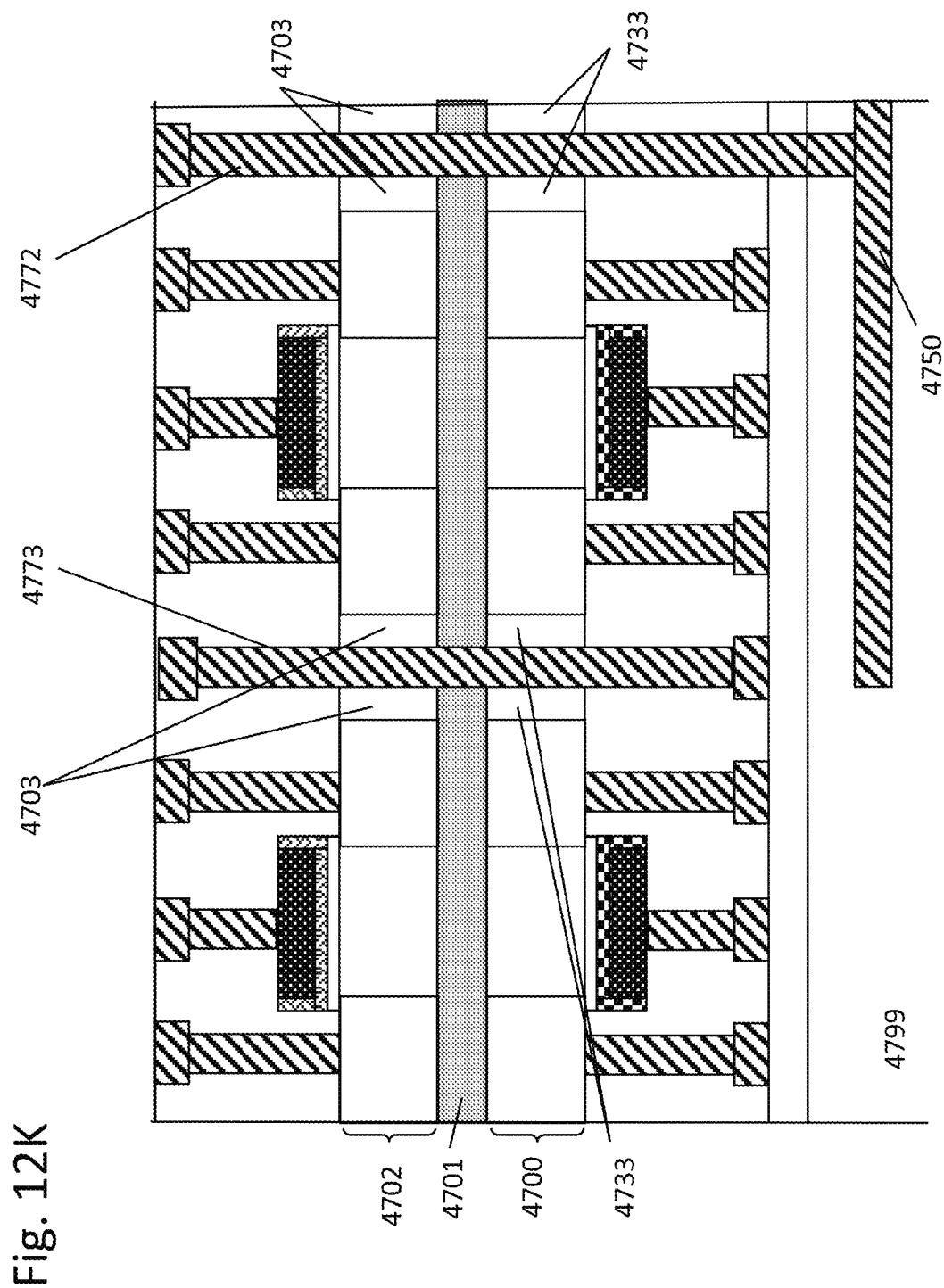

As illustrated in FIG. 12K, the layer-to-layer contacts 4772 to the landing pads in the base wafer are now made. This same contact etch could be used to make the connections 4773 between the NMOS and PMOS layer as well, instead of using the two step (4747 and 4767) method in FIG. 12H.

Using procedures similar to FIG. 12A-K, it is possible to construct structures such as FIG. 13 where a transistor is constructed with front gate 4902 and back gate 4904. The back gate could be utilized for many purposes such as threshold voltage control, reduction of variability, increase of drive current and other purposes.

Figure 14A:
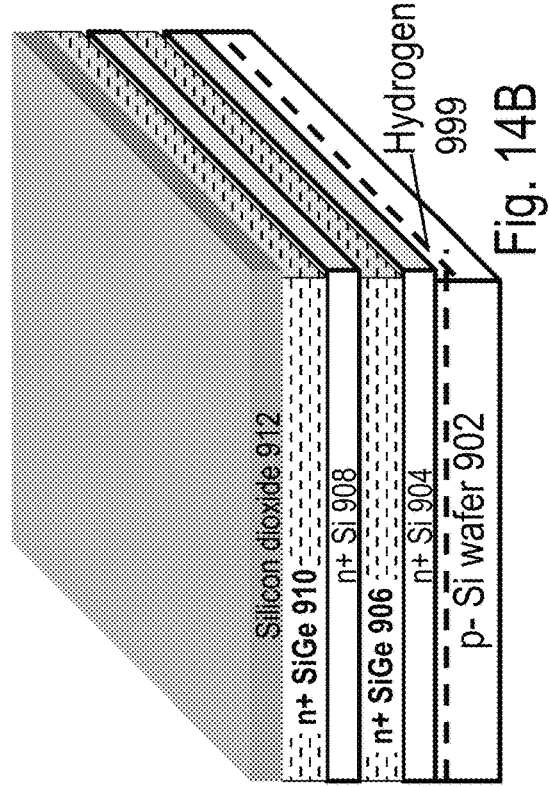

FIG. 14A-14J describes a process flow for forming four-side gated JLTs in 3D stacked circuits and chips. Four-side gated JLTs can also be referred to as gate-all around JLTs or silicon nanowire JLTs. They offer excellent electrostatic control of the channel and provide high-quality I-V curves with low leakage and high drive currents. The process flow in FIG. 14A-14J may include several steps in the following sequence:

Step (A): On a p-Si wafer 902, multiple n+Si layers 904 and 908 and multiple n+ SiGe layers 906 and 910 are epitaxially grown. The Si and SiGe layers are carefully engineered in terms of thickness and stoichiometry to keep defect density due to lattice mismatch between Si and SiGe low. Some techniques for achieving this include keeping thickness of SiGe layers below the critical thickness for forming defects. A silicon dioxide layer 912 is deposited above the stack. FIG. 14A illustrates the structure after Step (A) is completed.

Figure 14B:
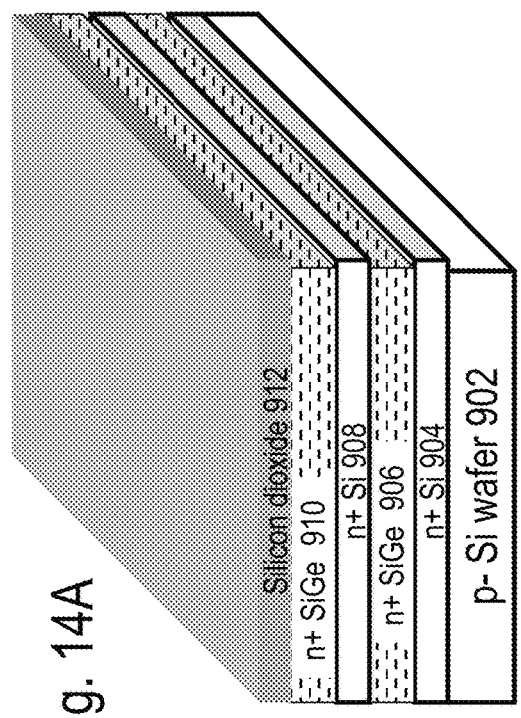

Step (B): Hydrogen is implanted at a certain depth in the p-wafer, to form a cleave plane 920 after bonding to bottom wafer of the two-chip stack. Alternatively, some other atomic species such as He can be used. FIG. 14B illustrates the structure after Step (B) is completed.

Figure 14D:
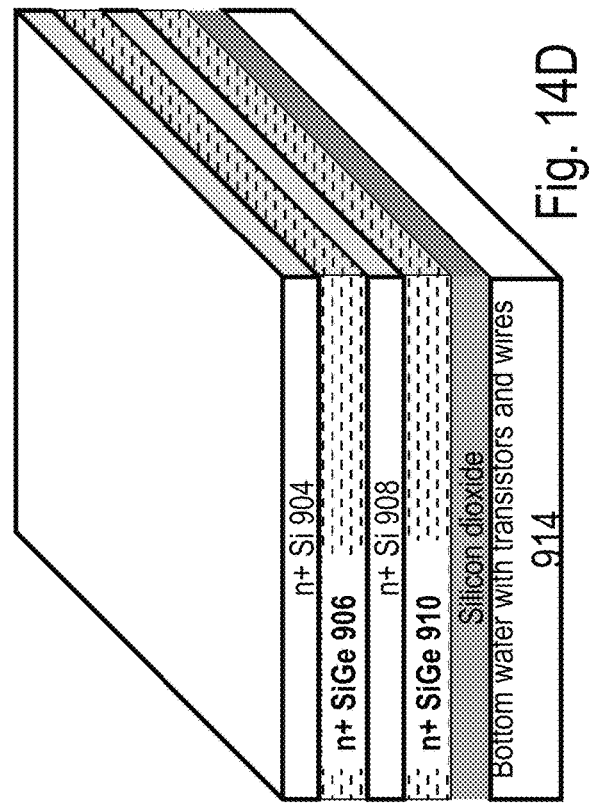
Figure 14C:
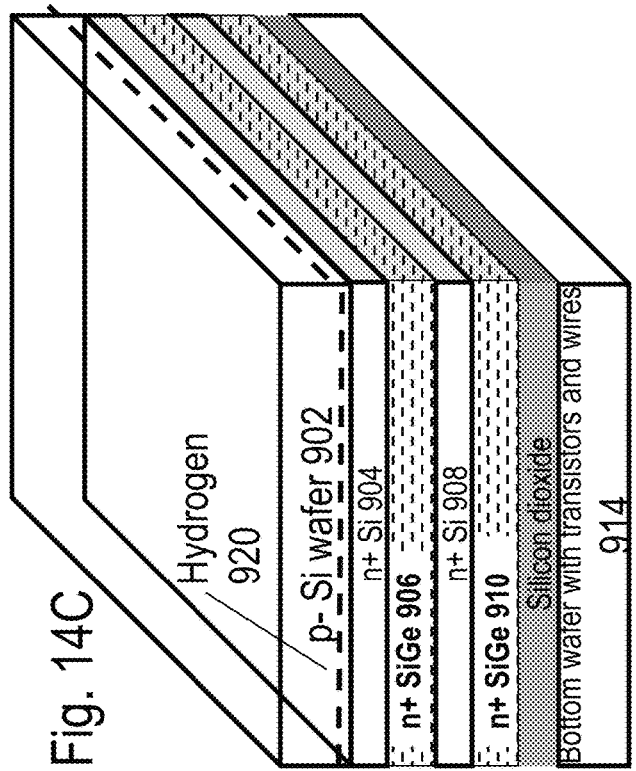

Step (C): The structure after Step (B) is flipped and bonded to another wafer on which bottom layers of transistors and wires 914 are constructed. Bonding occurs with an oxide-to-oxide bonding process. FIG. 14C illustrates the structure after Step (C) is completed.

Step (D): A cleave process occurs at the hydrogen plane using a sideways mechanical force. Alternatively, an anneal could be used for cleaving purposes. A CMP process is conducted till one reaches the n+Si layer 904. FIG. 14D illustrates the structure after Step (D) is completed.

Step (E): Using litho and etch, Si 918 and SiGe 916 regions are defined to be in locations where transistors are required. Oxide 920 is deposited to form isolation regions and to cover the Si/SiGe regions 916 and 918. A CMP process is conducted. FIG. 14E illustrates the structure after Step (E) is completed.

Step (F): Using litho and etch, Oxide regions 920 are removed in locations where a gate needs to be present. It is clear that Si regions 918 and SiGe regions 916 are exposed in the channel region of the JLT. FIG. 14F illustrates the structure after Step (F) is completed.

Step (G): SiGe regions 916 in channel of the JLT are etched using an etching recipe that does not attack Si regions 918. Such etching recipes are described in "High performance 5 nm radius twin silicon nanowire MOSFET (TSNWFET): Fabrication on bulk Si wafer, characteristics, and reliability," in *Proc. IEDM Tech. Dig.*, 2005, pp. 717-720 by S. D. Suk, S. Y. Lee, S. M. Kim, et al. ("Suk"). FIG. 14G illustrates the structure after Step (G) is completed.

Step (H): This is an optional step where a hydrogen anneal can be utilized to reduce surface roughness of fabricated nanowires. The hydrogen anneal can also reduce thickness of nanowires. Following the hydrogen anneal, another optional step of oxidation (using plasma enhanced thermal oxidation) and etch-back of the produced silicon dioxide can be used. This process thins down the silicon nanowire further. FIG. 14H illustrates the structure after Step (H) is completed.

Step (I): Gate dielectric and gate electrode regions are deposited or grown. Examples of gate dielectrics include hafnium oxide, silicon dioxide, etc. Examples of gate electrodes include polysilicon, TiN, TaN, etc. A CMP is conducted after gate electrode deposition. Following this, rest of the process flow for forming transistors, contacts and wires for the top layer continues. FIG. 14I illustrates the structure after Step (I) is completed.

FIG. 14J shows a cross-sectional view of structures after Step (I). It is clear that two nanowires are present for each transistor in the figure. It is possible to have one nanowire per transistor or more than two nanowires per transistor by changing the number of stacked Si/SiGe layers.

Note that top-level transistors are formed well-aligned to bottom-level wiring and transistor layers. Since the top-level transistor layers are very thin (preferably less than 200 nm), the top transistors can be aligned to features in the bottom-level. While the process flow shown in FIG. 14A-14J gives the key steps involved in forming a four-side gated JLT with 3D stacked components, it is conceivable to one skilled in the art that changes to the process can be made. For example, process steps and additional materials/regions to add strain to junctionless transistors can be added. Furthermore, more than two layers of chips or circuits can be 3D stacked. Also, there are many methods to construct silicon nanowire transistors and these are described in "High performance and highly uniform gate-all-around silicon nanowire MOSFETs with wire size dependent scaling," *Electron Devices Meeting (IEDM), 2009 IEEE International*, vol., no., pp. 1-4, 7-9 Dec. 2009 by Bangsaruntip, S.; Cohen, G. M.; Majumdar, A.; et al. ("Bangsaruntip") and in "High performance 5 nm radius twin silicon nanowire MOSFET (TSNWFET): Fabrication on bulk Si wafer, characteristics, and reliability," in *Proc. IEDM Tech. Dig.*, 2005, pp. 717-720 by S. D. Suk, S. Y. Lee, S. M. Kim, et al. ("Suk"). Contents of these publications are incorporated herein by reference. Techniques described in these publications can be utilized for fabricating four-side gated JLTs without junctions as well.

Most of the figures described thus far in this document assumed the transferred top layer of silicon is very thin (preferably <200 nm). This enables light to penetrate the silicon and allows features on the bottom wafer to be observed. However, that is not always the case. FIG. 15A-15C shows a process flow for constructing 3D stacked chips and circuits when the thickness of the transferred/stacked piece of silicon is so high that light does not penetrate the transferred piece of silicon to observe the alignment marks on the bottom wafer. The process to allow for alignment to the bottom wafer may include several steps as described in the following sequence.

Step (A): A bottom wafer 2312 is processed to form a bottom transistor layer 2306 and a bottom wiring layer 2304. A layer of silicon oxide 2302 is deposited above it. FIG. 15A illustrates the structure after Step (A).

Step (B): A wafer of p-Si 2310 has an oxide layer 2306 deposited or grown above it. Using lithography, a window pattern is etched into the p-Si 2310 and is filled with oxide. A step of CMP is done. This window pattern will be used in Step (C) to allow light to penetrate through the top layer of silicon to align to circuits on the bottom wafer 2312. The window size is chosen based on misalignment tolerance of the alignment scheme used while bonding the top wafer to the bottom wafer in Step (C). Furthermore, some alignment marks also exist in the wafer of p-Si 2310. FIG. 15B illustrates the structure after Step (B). Step (C): A portion of the p-Si 2310 from Step (B) is transferred atop the bottom wafer 2312 using procedures similar to FIG. 2A-E of incorporated by reference U.S. Pat. No. 8,026,521 issued on Sep. 27, 2011. It can be observed that the window 2316 can be used for aligning features constructed on the top wafer 2314 to features on the bottom wafer 2312. Thus, the thickness of the top wafer 2314 can be chosen without constraints. FIG. 15C illustrates the structure after Step (C).

FIG. 16A-16H describe a process flow to construct a horizontally-oriented monolithic 3D DRAM. Two masks are utilized on a "per-memory-layer" basis for the monolithic 3D DRAM concept shown in FIG. 16A-16H, while other masks are shared between all constructed memory layers. The process flow may include several steps in the following sequence.

Figure 16B:
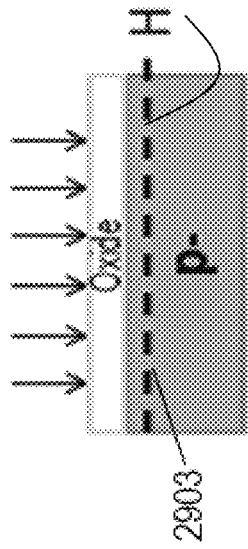
FIG. 16A-16H shows a two-mask per layer 3D floating body DRAM.
Figure 16D:
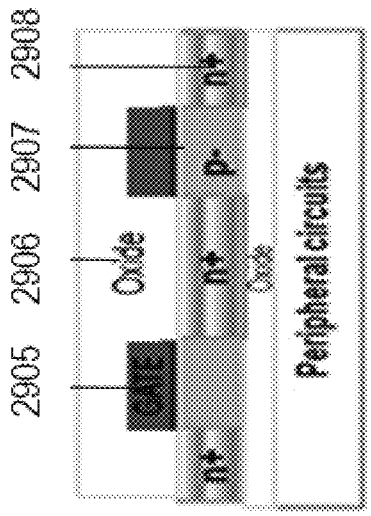
Figure 16A:
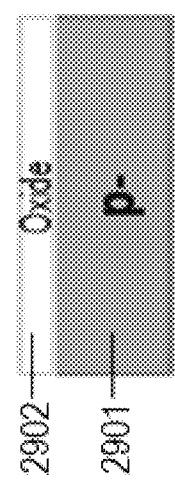
Figure 16C:
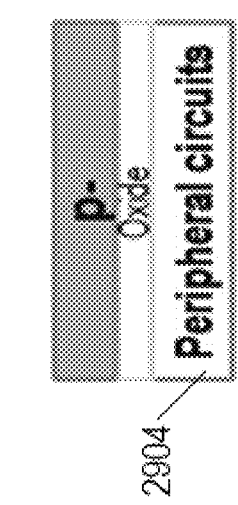

Step (A): A p-Silicon wafer 2901 is taken and an oxide layer 2902 is grown or deposited above it. FIG. 16A illustrates the structure after Step (A).

Step (B): Hydrogen is implanted into the p-wafer 2901 at a certain depth denoted by 2903. FIG. 16B illustrates the structure after Step (B).

Step (C): The wafer after Step (B) is flipped and bonded onto a wafer having peripheral circuits 2904 covered with oxide. This bonding process occurs using oxide-to-oxide bonding. The stack is then cleaved at the hydrogen implant plane 2903 using either an anneal or a sideways mechanical force. A chemical mechanical polish (CMP) process is then conducted. Note that peripheral circuits 2904 are such that they can withstand an additional rapid-thermal-anneal (RTA) and still remain operational, and preferably retain good performance. For this purpose, the peripheral circuits 2904 may be such that they have not had their RTA for activating dopants or they have had a weak RTA for activating dopants. Also, peripheral circuits 2904 utilize a refractory metal such as tungsten that can withstand high temperatures greater than 400° C. FIG. 29C illustrates the structure after Step (C).

Step (D): The transferred layer of p-silicon after Step (C) is then processed to form isolation regions using a STI process. Following, gate regions 2905 are deposited and patterned, following which source-drain regions 2908 are implanted using a self-aligned process. An inter-level dielectric (ILD) constructed of oxide (silicon dioxide) 2906 is then constructed. Note that no RTA is done to activate dopants in this layer of partially-depleted SOI (PD-SOI) transistors. Alternatively, transistors could be of fully-depleted SOI type. FIG. 16D illustrates the structure after Step (D).

Figure 16F:
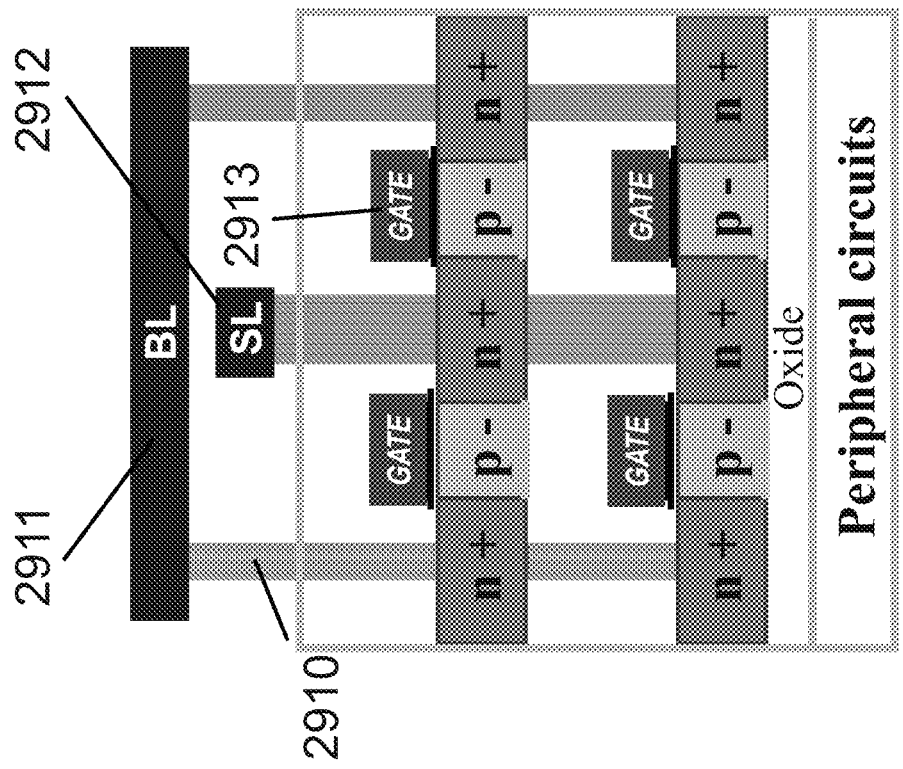
Figure 16E:
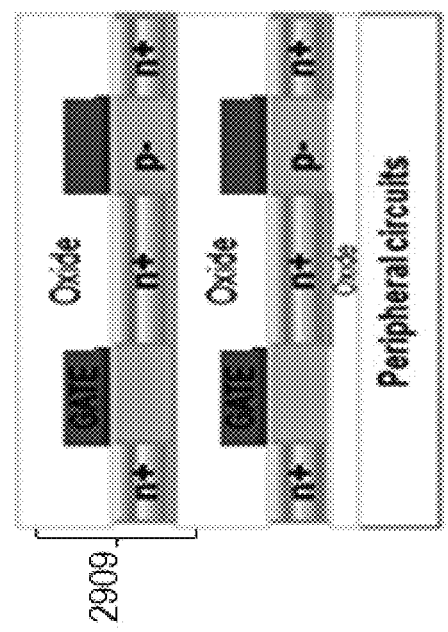

Step (E): Using steps similar to Step (A)-Step (D), another layer of memory 2909 is constructed. After all the desired memory layers are constructed, a RTA is conducted to activate dopants in all layers of memory (and potentially also the periphery). FIG. 16E illustrates the structure after Step (E).

Figure 16G:
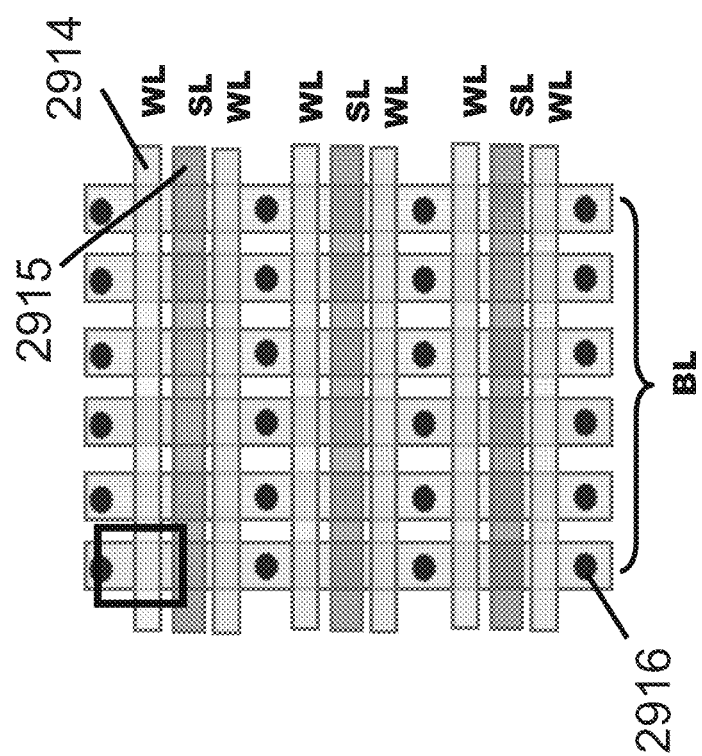
Figure 16H:
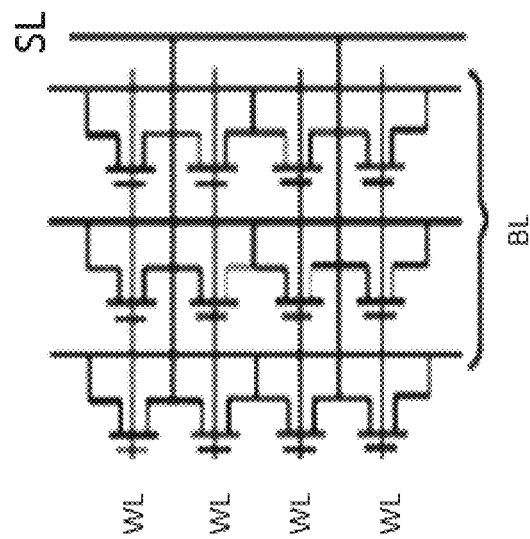

Step (F): Contact plugs 2910 are made to source and drain regions of different layers of memory. Bit-line (BL) wiring 2911 and Source-line (SL) wiring 2912 are connected to contact plugs 2910. Gate regions 2913 of memory layers are connected together to form word-line (WL) wiring. FIG. 16F illustrates the structure after Step (F). FIG. 16G and FIG. 16H describe array organization of the floating-body DRAM: BLs 2916 in a direction substantially perpendicular to the directions of SLs 2915 and WLs 2914.

It will also be appreciated by persons of ordinary skill in the art that the invention is not limited to what has been particularly shown and described hereinabove. For example, drawings or illustrations may not show n or p wells for clarity in illustration. Further, combinations and sub-combinations of the various features described hereinabove may be utilized to form a 3D IC based system. Rather, the scope of the invention includes both combinations and sub-combinations of the various features described hereinabove as well as modifications and variations which would occur to such skilled persons upon reading the foregoing description. Thus the invention is to be limited only by the appended claims.

We claim:

1. A semiconductor device, the device comprising:
   a plurality of transistors,
      wherein at least one of said plurality of transistors comprises a first single crystal source, channel, and drain,
      wherein at least one of said plurality of transistors comprises a second single crystal source, channel, and drain,
      wherein said second single crystal source, channel, and drain is disposed above said first single crystal source, channel, and drain,
      wherein at least one of said plurality of transistors comprises a third single crystal source, channel, and drain,
      wherein said third single crystal source, channel, and drain is disposed above said second single crystal source, channel, and drain,
      wherein at least one of said plurality of transistors comprises a fourth single crystal source, channel, and drain, and
      wherein said fourth single crystal source, channel, and drain is disposed above said third single crystal source, channel, and drain, and
      wherein said fourth drain is aligned to said first drain with less than 40 nm misalignment.

2. The device according to claim 1,
   wherein said first single crystal channel is self-aligned to said second single crystal channel being processed following the same lithography step.

3. The device according to claim 1, further comprising:
   at least one region of oxide to oxide bonds.

4. The device according to claim 1, further comprising:
   an ohmic connection between said first single crystal source or drain and said second single crystal source or drain.

5. The device according to claim 1,
   wherein at least one of said plurality of transistors comprises a gate all around structure.

6. The device according to claim 1,
   wherein at least one of said plurality of transistors comprises two side gates.

7. The device according to claim 1, further comprising:
   a two-sided gate structure, and
      wherein said two-sided gate structure controls at least one of said first single crystal channels and at least one of said second single crystal channels.

8. A semiconductor device, the device comprising:
   a plurality of transistors,
      wherein at least one of said plurality of transistors comprises a first single crystal source, channel, and drain,
      wherein at least one of said plurality of transistors comprises a second single crystal source, channel, and drain,
      wherein said second single crystal source, channel, and drain is disposed above said first single crystal source, channel, and drain,
      wherein at least one of said plurality of transistors comprises a third single crystal source, channel, and drain,
      wherein said third single crystal source, channel, and drain is disposed above said second single crystal source, channel, and drain,
      wherein at least one of said plurality of transistors comprises a fourth single crystal source, channel, and drain, and
      wherein at least one of said plurality of transistors comprises a gate all around structure.

9. The device according to claim 8,
   wherein said first single crystal source or drain, and said second single crystal source or drain, each comprise n+doped regions.

10. The device according to claim 8, further comprising:
    at least one region of oxide to oxide bonds.

11. The device according to claim 8,
    wherein said first single crystal source is electrically connected to said second single crystal source.

12. The device according to claim 8,
    wherein said third single crystal channel is self-aligned to said fourth single crystal channel being processed following the same lithography step.

13. The device according to claim 8, further comprising:
    a first gate structure,
       wherein said first gate structure controls at least one of said first single crystal channels and at least one of said second single crystal channels.

14. The device according to claim 8, further comprising:
    a first gate structure,
       wherein said first gate structure controls at least one of said first single crystal channels and at least one of said third single crystal channels.

15. A semiconductor device, the device comprising:
    a plurality of transistors,
       wherein at least one of said plurality of transistors comprises a first single crystal channel,
       wherein at least one of said plurality of transistors comprises a second single crystal channel,
       wherein said second single crystal channel is disposed above said first single crystal channel,
       wherein at least one of said plurality of transistors comprises a third single crystal channel,
       wherein said third single crystal channel is disposed above said second single crystal channel, wherein at least one of said plurality of transistors comprises a fourth single crystal channel,
wherein said fourth single crystal channel is disposed above said third single crystal channel,
wherein said least one of said plurality of transistors is a horizontally oriented transistor; and
wherein said device comprise at least one region of oxide to oxide bonds.

16. The device according to claim 15,
wherein said first single crystal channel is self-aligned to said second single crystal channel being processed following the same lithography step.

17. The device according to claim 15,
wherein formation of said fourth single crystal channel comprises a layer transfer process, and
wherein said layer transfer process will show a bonding interface surface in a decorated cross-sectional SEM.

18. The device according to claim 15,
wherein at least one of said plurality of transistors comprises a gate all around structure.

19. The device according to claim 15, further comprising:
a first gate structure,
wherein said first gate structure controls at least one of said first single crystal channels and at least one of said second single crystal channels.

20. The device according to claim 15, further comprising:
a first gate structure,
wherein said first gate structure controls at least one of said first single crystal channels and at least one of said third single crystal channels.

* * * * *